(12) United States Patent
Dairiki et al.

(10) Patent No.: US 8,124,972 B2
(45) Date of Patent: Feb. 28, 2012

(54) THIN FILM TRANSISTOR

(75) Inventors: Koji Dairiki, Kanagawa (JP); Hidekazu Miyairi, Kanagawa (JP); Toshiyuki Isa, Kanagawa (JP); Akiharu Miyanaga, Kanagawa (JP); Takuya Hirohashi, Kanagawa (JP); Shunpei Yamazaki, Tokyo (JP); Takeyoshi Watabe, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 319 days.

(21) Appl. No.: 12/429,486

(22) Filed: Apr. 24, 2009

(65) Prior Publication Data

US 2009/0267068 A1 Oct. 29, 2009

(30) Foreign Application Priority Data

Apr. 25, 2008 (JP) ................................. 2008-116054
Nov. 18, 2008 (JP) ................................. 2008-294074

(51) Int. Cl.
*H01L 29/786* (2006.01)
(52) U.S. Cl. .................. 257/57; 257/E29.291
(58) Field of Classification Search .............. 257/57, 257/59, 66, E29.291, E29.273, E21.412, 257/E21.413, 56, 72, E21.142, E21.143
See application file for complete search history.

(56) References Cited

U.S. PATENT DOCUMENTS

| | | | |
|---|---|---|---|
| 4,226,898 A | 10/1980 | Ovshinsky et al. | |
| 4,409,134 A | 10/1983 | Yamazaki | |
| 4,460,670 A | 7/1984 | Ogawa et al. | |
| 4,766,477 A | 8/1988 | Nakagawa et al. | |
| 5,101,242 A | 3/1992 | Ikeda et al. | |
| 5,221,631 A | 6/1993 | Ikeda et al. | |
| 5,311,040 A | 5/1994 | Hiramatsu et al. | |
| 5,453,858 A | 9/1995 | Yamazaki | |
| 5,514,879 A | 5/1996 | Yamazaki | |
| 5,591,987 A | 1/1997 | Yamazaki et al. | |

(Continued)

FOREIGN PATENT DOCUMENTS

EP 0 449 539 A2 10/1991

(Continued)

OTHER PUBLICATIONS

Arai et al., 41.2: Micro Silicon Technology for Active Matrix OLED Display, SID Digest '07 : SID International Symposium Digest of Technical Papers, vol. XXXVIII, pp. 1370-1373, 2007.

(Continued)

*Primary Examiner* — Thomas L Dickey
*Assistant Examiner* — Fazli Erdem
(74) *Attorney, Agent, or Firm* — Nixon Peabody LLP; Jeffrey L. Costellia

(57) ABSTRACT

The thin film transistor includes a gate insulating layer covering a gate electrode, over a substrate having an insulating surface; a semiconductor layer forming a channel formation region, in which a plurality of crystal regions is included in an amorphous structure; an impurity semiconductor layer imparting one conductivity type which forms a source region and a drain region; and a buffer layer formed from an amorphous semiconductor, which is located between the semiconductor layer and the impurity semiconductor layer. The thin film transistor includes the crystal region which includes minute crystal grains and inverted conical or inverted pyramidal grain each of which grows approximately radially from a position away from an interface between the gate insulating layer and the semiconductor layer toward a direction in which the semiconductor layer is deposited in a region which does not reach the impurity semiconductor layer.

24 Claims, 38 Drawing Sheets

U.S. PATENT DOCUMENTS

| | | | |
|---|---|---|---|
| 5,600,154 A | 2/1997 | Shimizu et al. |
| 5,614,732 A | 3/1997 | Yamazaki |
| 5,648,662 A | 7/1997 | Zhang et al. |
| 5,677,236 A | 10/1997 | Saitoh et al. |
| 5,701,167 A | 12/1997 | Yamazaki |
| 5,766,989 A | 6/1998 | Maegawa et al. |
| 5,849,601 A | 12/1998 | Yamazaki |
| 5,859,445 A | 1/1999 | Yamazaki |
| 5,864,150 A | 1/1999 | Lin |
| 5,932,302 A | 8/1999 | Yamazaki et al. |
| 6,011,277 A | 1/2000 | Yamazaki |
| 6,017,781 A | 1/2000 | Shimizu et al. |
| 6,023,075 A | 2/2000 | Yamazaki |
| 6,028,472 A | 2/2000 | Nagumo |
| 6,153,893 A | 11/2000 | Inoue et al. |
| 6,171,674 B1 | 1/2001 | Yamazaki et al. |
| 6,183,816 B1 | 2/2001 | Yamazaki et al. |
| 6,188,085 B1 | 2/2001 | Shimizu et al. |
| 6,252,249 B1 | 6/2001 | Yamazaki |
| 6,255,146 B1 | 7/2001 | Shimizu et al. |
| 6,281,520 B1 | 8/2001 | Yamazaki |
| 6,306,213 B1 | 10/2001 | Yamazaki |
| 6,410,372 B2 | 6/2002 | Flewitt |
| 6,468,617 B1 | 10/2002 | Yamazaki et al. |
| 6,468,839 B2 | 10/2002 | Inoue et al. |
| 6,483,124 B2 | 11/2002 | Flewitt |
| 6,544,908 B1 | 4/2003 | Weimer et al. |
| 6,680,486 B1 | 1/2004 | Yamazaki |
| 6,700,057 B2 | 3/2004 | Yasuno |
| 6,737,676 B2 | 5/2004 | Yamazaki |
| 6,747,627 B1 | 6/2004 | Koyama et al. |
| 6,756,258 B2 | 6/2004 | Zhang et al. |
| 6,835,523 B1 | 12/2004 | Yamazaki et al. |
| 6,838,300 B2 | 1/2005 | Jin et al. |
| 6,890,803 B2 | 5/2005 | Lin et al. |
| 6,943,764 B1 | 9/2005 | Koyama et al. |
| 7,012,753 B2 | 3/2006 | Quesnel |
| 7,067,844 B2 | 6/2006 | Yamazaki |
| 7,098,479 B1 | 8/2006 | Yamazaki |
| 7,115,902 B1 | 10/2006 | Yamazaki |
| 7,199,846 B2 | 4/2007 | Lim |
| 7,511,709 B2 | 3/2009 | Koyama et al. |
| 7,635,889 B2 | 12/2009 | Isa et al. |
| 7,786,485 B2 | 8/2010 | Dairiki et al. |
| 7,812,348 B2 | 10/2010 | Dairiki et al. |
| 7,821,012 B2 | 10/2010 | Jinbo |
| 2001/0017372 A1 | 8/2001 | Koyama |
| 2001/0019154 A1 | 9/2001 | Yamazaki et al. |
| 2002/0009819 A1 | 1/2002 | Flewitt |
| 2002/0044111 A1 | 4/2002 | Yamazaki et al. |
| 2003/0148630 A1 | 8/2003 | Hu |
| 2004/0084699 A1 | 5/2004 | Yamazaki et al. |
| 2004/0198046 A1 | 10/2004 | Yu-Chou et al. |
| 2004/0221887 A1 | 11/2004 | Kondo et al. |
| 2005/0014319 A1 | 1/2005 | Yamazaki et al. |
| 2005/0022864 A1 | 2/2005 | Fujioka et al. |
| 2005/0064667 A1 | 3/2005 | Matsushita et al. |
| 2005/0085003 A1 | 4/2005 | Kishimoto et al. |
| 2005/0115930 A1 | 6/2005 | Tanaka et al. |
| 2005/0214455 A1 | 9/2005 | Li et al. |
| 2005/0229965 A1 | 10/2005 | Nishimura et al. |
| 2005/0233595 A1 | 10/2005 | Choi et al. |
| 2006/0024866 A1 | 2/2006 | Gan et al. |
| 2006/0027804 A1 | 2/2006 | Yamazaki et al. |
| 2006/0063391 A1 | 3/2006 | You et al. |
| 2006/0079100 A1 | 4/2006 | Joshi et al. |
| 2006/0170111 A1 | 8/2006 | Isa et al. |
| 2007/0056628 A1 | 3/2007 | Park et al. |
| 2007/0181945 A1 | 8/2007 | Nakamura |
| 2007/0295399 A1 | 12/2007 | Carlson |
| 2008/0121896 A1 | 5/2008 | Takizawa et al. |
| 2008/0296704 A1 | 12/2008 | Wakabayashi |
| 2008/0308807 A1 | 12/2008 | Yamazaki et al. |
| 2009/0033818 A1 | 2/2009 | Nakajima et al. |
| 2009/0057683 A1 | 3/2009 | Nakajima et al. |
| 2009/0061574 A1 | 3/2009 | Nakajima et al. |
| 2009/0114921 A1 | 5/2009 | Yamazaki et al. |
| 2009/0218568 A1 | 9/2009 | Dairiki et al. |
| 2009/0236600 A1 | 9/2009 | Yamazaki et al. |
| 2009/0242889 A1 | 10/2009 | Nakayama |
| 2009/0261328 A1 | 10/2009 | Miyairi et al. |
| 2009/0261330 A1 | 10/2009 | Yamazaki et al. |
| 2009/0267067 A1* | 10/2009 | Jinbo et al. ................ 257/57 |
| 2009/0321737 A1 | 12/2009 | Isa et al. |
| 2009/0321743 A1 | 12/2009 | Isa et al. |
| 2010/0059749 A1 | 3/2010 | Takahashi et al. |
| 2010/0078071 A1 | 4/2010 | Miyairi et al. |
| 2010/0079425 A1 | 4/2010 | Yamazaki et al. |
| 2010/0096631 A1 | 4/2010 | Miyairi et al. |
| 2010/0096637 A1 | 4/2010 | Yamazaki et al. |
| 2010/0099217 A1 | 4/2010 | Isa et al. |
| 2010/0127261 A1 | 5/2010 | Yamazaki et al. |
| 2010/0224879 A1 | 9/2010 | Miyairi et al. |

FOREIGN PATENT DOCUMENTS

| | | |
|---|---|---|
| EP | 0 535 979 A2 | 4/1993 |
| EP | 0 652 595 B1 | 5/1995 |
| EP | 1 505 174 A1 | 2/2005 |
| EP | 1 537 938 A2 | 6/2005 |
| JP | 57-071126 | 5/1982 |
| JP | 58-092217 | 6/1983 |
| JP | 60-027122 | 2/1985 |
| JP | 62-062073 | 3/1987 |
| JP | 62-062073 | 12/1987 |
| JP | 64-073671 | 3/1989 |
| JP | 01-144682 | 6/1989 |
| JP | 02-028624 | 1/1990 |
| JP | 02-053941 | 2/1990 |
| JP | 02-053941 B2 | 11/1990 |
| JP | 04-242724 | 8/1992 |
| JP | 04-266019 | 9/1992 |
| JP | 05-129608 | 5/1993 |
| JP | 05-175503 | 7/1993 |
| JP | 06-326312 | 11/1994 |
| JP | 07-131030 | 5/1995 |
| JP | 2000-277439 | 10/2000 |
| JP | 2001-007024 | 1/2001 |
| JP | 2001-053283 | 2/2001 |
| JP | 2004-014958 | 1/2004 |
| JP | 2005-049832 | 2/2005 |
| JP | 2005-167051 | 6/2005 |
| JP | 2005-191546 | 7/2005 |
| JP | 2008-124392 | 5/2008 |
| WO | WO 02/07207 A1 | 1/2002 |

OTHER PUBLICATIONS

Kim et al, 42.1: A Novel Four-Mask-Count Process Architecture for TFT-LCDS, SID Digest '00 : SID International Symposium Digest of Technical Papers, pp. 1006-1009, 2000.

Song et al., 34.1: Advanced Four-Mask Process Architecture for the A-SI TFT Array Manufacturing Method, SID Digest '02 : SID International Symposium Digest of Technical Papers, pp. 1038-1041, 2002.

Choi et al., P-16: Novel Four-Mask Process in the FFS TFT-LCD With Optimum Multiple-Slit Design Applied by the Use of a Gray-Tone Mask, SID Digest '05 : SID International Symposium Digest of Technical Papers, pp. 281-287, 2005.

Fujiwara et al., Stress-Induced Nucleation of Microcrystalline Silicon From Amorphous Phase, Jpn. J. Appl. Phys., vol. 41/Part1, No. 5A, 2821-2828, May 2002.

Kamei et al., A Significant Reduction of Impurity Contents in Hydrogenated Microcrystalline Silicon Films for Increased Grain Size and Reduced Defect Density, Jpn. J. Appl. Phys., vol. 37/Part2, No. 3A, L265-268, Mar. 1, 1998.

Lee et al., How to Achieve High Mobility Thin Film Transistors by Direct Deposition of Silicon Using 13.56 MHz RF PECVD?, Int. Electron Devices Meeting Tech. Digest, pp. 295-298, 2006.

Czang et al., Directly Deposited Nanocrystalline Silicon Thin-Film Transistors With Ultra High Mobilities, Appl. Phys. Lett., 89, pp. 252101-1-252101-03, 2006.

Fujiwara et al., Real-time spectroscopic ellipsometry studies of the nucleation and grain growth processes in microcrystalline silicon thin films, Phys. Rev. B, vol. 63, pp. 115306-1-115306-9, 2001.

Fujiwara et al., Microcrystalline silicon nucleation sites in the subsurface of hydrogenated amorphous silicon, Sur. Sci., 497, pp. 330-340, 2002.

Lee.C et al., "High-Mobility Nanocrystalline Silicon Thin-Film Transistors Fabricated by Plasma-Enhanced Chemical Vapor Deposition,", Appl. Phys. Lett. (Applied Physics Letters), May 24, 2005, vol. 86, pp. 222106-1-222106-3.

Lee.C et al., "High-Mobility N-Channel and P-Channel Nanocryatalline Silicon Thin-Film Transistors,", IEDM 05: Technical Digest of International Electron Devices Meeting, 2005, pp. 937-340.

Esmaeili-Rad.M et al., "High Stability, Low Leakage Nanocrystalline Silicon Bottom Gate Thin Film Transistors for Amoled Displays,", IEDM 06: Technical Digest of International Electron Devices Meeting, 2006, pp. 303-306.

Lee.H et al., "Leakage Current Mechanisms in Top-Gate Nanocrystalline Silicon Thin-Film Transistors,", Appl. Phys. Lett. (Applied Physics Letters), Feb. 28, 2008, vol. 92, pp. 083509-1-083509-3.

Lee.C et al., "Stability of NC-SI:H TFTS with Silicon Nitride Gate Dielectric,", IEEE Transactions on Electron Devices, 2007, vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Lee.C et al., "Top-Gate TFTS Using 13.56MHz PECVD Microcrystalline Silicon,", IEEE Electron Device Letters, Sep. 5, 2005, vol. 26, No. 9, pp. 637-639.

Lee.C et al., "Postdeposition Thermal Annealing and Material Stability of 75° C. Hydrogenated Nanocrystalline Silicon Plasma-Enhanced Chemical Vapor Deposition Films,", J. Appl. Phys. (Journal of Applied Physics), Aug. 4, 2005, vol. 98, No. 3, pp. 034305-1-034305-7.

"International Search Report (Application No. PCT/JP2009/061794; PCT11624/11792) Dated Sep. 15, 2009,".

"Written Opinion (Application No. PCT/JP2009/061794; PCT11624/11792) Dated Sep. 15, 2009,".

Ehara.T et al., "Nitrogen-Doping Effects on Electrical Properties of Hydrogenated Microcrystalline Sillicon As Studied by Electron Paramagnetic Resonance and Conductivity,", Jpn. J. Appl. Phys. (Japanese Journal of Applied Physics), 2000, vol. 39, No. 1, pp. 31-34.

* cited by examiner

211

232

212

210  208  206

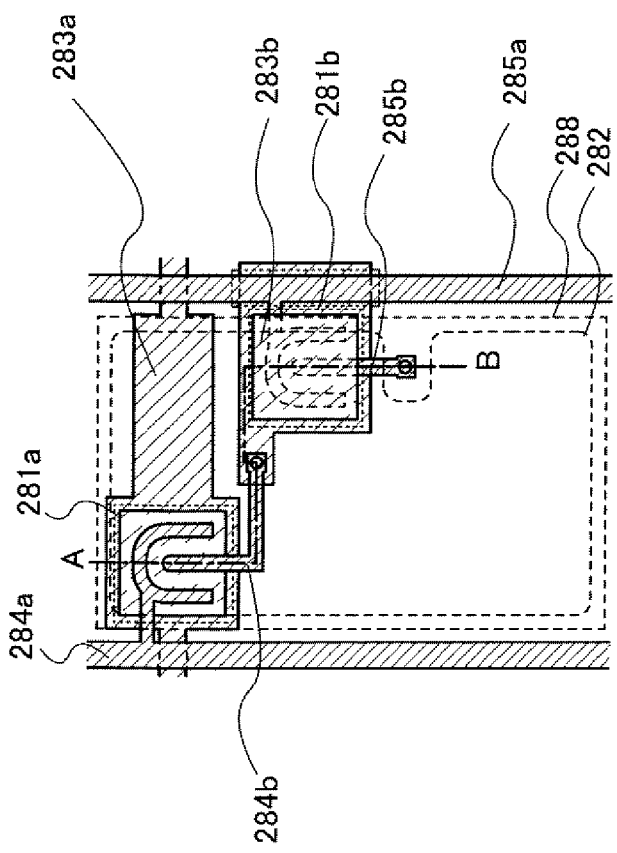
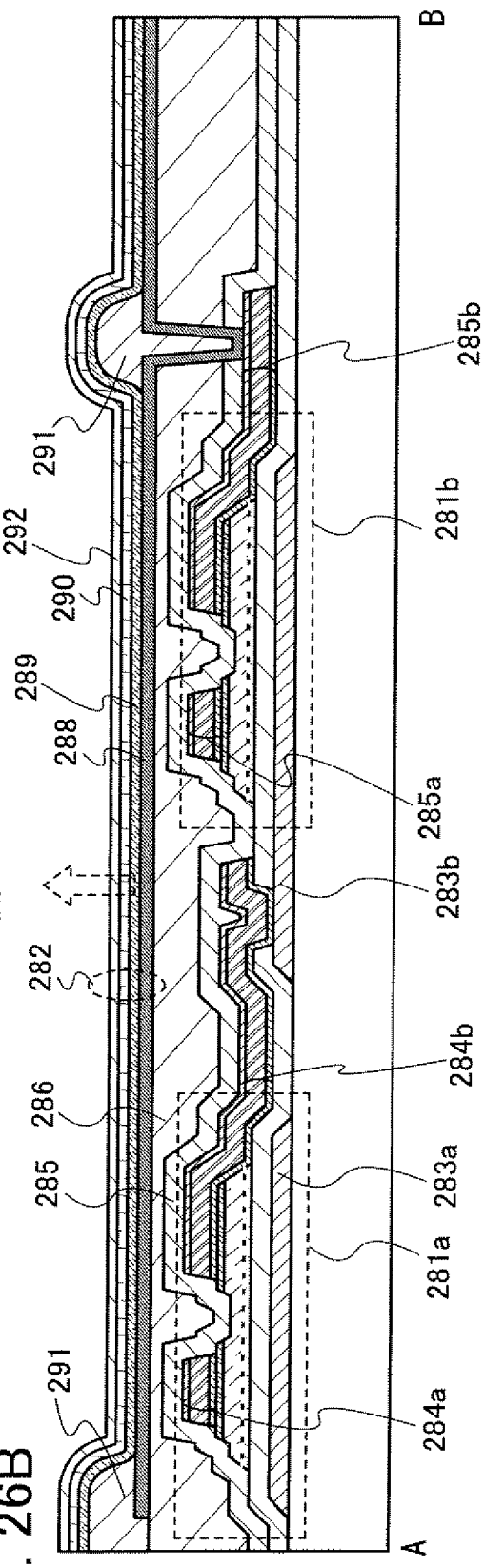
FIG. 26A
FIG. 26B antibonding orbital bonding orbital

THIN FILM TRANSISTOR

BACKGROUND OF THE INVENTION

1. Field of the Invention

The present invention relates to a thin film transistor and a method for manufacturing the same, and a semiconductor device and a display device using the thin film transistor.

2. Description of the Related Art

Thin film transistors (hereinafter also referred to as "TFTs") are already widely used in a technical field of liquid crystal displays. A TFT is a kind of field-effect transistor, and is named after the fact that a semiconductor film for forming a channel is formed thin. At present, a technique to manufacture a TFT using amorphous silicon or polycrystalline silicon for the thin semiconductor film has already been put into practical use.

A semiconductor material called "microcrystalline silicon" has been known for a long time together with amorphous silicon and polycrystalline silicon, and there also has been a report on microcrystalline silicon related to a field-effect transistor (for example, see Patent Document 1: U.S. Pat. No. 5,591,987). However, a TFT using microcrystalline silicon has been buried between an amorphous silicon transistor and a polycrystalline silicon transistor up to today; thus, there has been a delay in practical use and reports thereof are made merely at an academic society level (for example, see Non-Patent Document 1: Toshiaki Arai et al., "SID '07 DIGEST" 2007, pp. 1370-1373).

A microcrystalline silicon film can be formed over a substrate having an insulating surface, such as glass, by decomposing a source gas with plasma (weakly-ionized plasma) by a plasma CVD method; however, it has been considered that it is difficult to control generation of crystal nuclei and crystal growth because reaction proceeds in a non-equilibrium state.

Various researches have been made on microcrystalline silicon. According to a hypothesis, growth mechanism of microcrystalline silicon is as follows, first, a portion of an amorphous phase, in which atoms are aligned randomly, grows over a substrate, and then nuclei of crystals start to grow (see Non-Patent Document 2: Hiroyuki Fujiwara et al., "Japanese Journal of Applied Physics (Jpn. J. Appl. Phys.)" vol. 41, 2002, pp. 2821-2828). In Non-Patent Document 2, it is considered that the density of microcrystalline silicon nuclei can be controlled with the concentration of a hydrogen gas used in forming a film because peculiar silicon-hydrogen bonds are observed on an amorphous surface when nuclei of microcrystalline silicon start to grow.

Further, influence on a growing surface of a microcrystalline silicon film due to an impurity element such as oxygen or nitrogen has also been considered. There is a finding that by reducing the concentration of the impurity element, the size of a crystal grain of a microcrystalline silicon film becomes large, and thus the defect density (especially, the defective charge density) is reduced (see Non-Patent Document 3: Toshihiro Kamei et al., "Japanese Journal of Applied Physics (Jpn. J. Appl. Phys.)" vol. 37, 1998, pp. L265-L268).

Further, there is a point of view that in order to improve operation characteristics of a TFT, the purity of a microcrystalline silicon film needs to be improved, and a microcrystalline silicon film in which the concentrations of oxygen, nitrogen, and carbon are $5\times10^{16}$ cm$^{-3}$, $2\times10^{18}$ cm$^{-3}$, $1\times10^{18}$ cm$^{-3}$, respectively, and effective mobility is improved was reported (see Non-Patent Document 4: C. H. Lee, et al., "International Electron Devices Meeting Technical Digest (Int. Electron Devices Meeting Tech. Digest), 2006, pp 295-298). In addition, a microcrystalline semiconductor film in which a deposition temperature by a plasma CVD method is 150° C., the oxygen concentration is reduced to be $1\times10^{16}$ cm$^{-3}$, and effective mobility is improved was reported (see Non-Patent Document 5: Czang-Ho Lee et al., Applied Physics Letters (Appl. Phys. Lett.), Vol. 89, 2006, p 252101).

SUMMARY OF THE INVENTION

However, in a method of forming a microcrystalline silicon film in such a manner that after an amorphous silicon film is formed, a photothermal conversion layer formed using a metal material is provided and laser irradiation is performed, crystallinity can be improved; however, in terms of productivity, there is no advantage over a polycrystalline silicon film formed by laser annealing.

Finding in a model of growth of microcrystalline silicon that peculiar silicon-hydrogen bonding is observed on an amorphous surface when nuclei of microcrystalline silicon start to grow is effective; however, nuclei generation positions and nuclei generation density cannot be controlled directly.

Further, even if the purity of a microcrystalline silicon film is improved and the impurity concentration is reduced, whereby a microcrystalline silicon film, the crystal grain size of which becomes large and defect density of which (especially, the defective charge density) is reduced, can be obtained, it means only change in physical property values of a microcrystalline silicon film and it does not always improve element characteristics of a TFT or the like. A semiconductor element is operated by intentionally controlling flow of carriers of electrons or holes which flow through a semiconductor; however, there is no effect unless a quality of a microcrystalline silicon film in a place where the carriers flow can be improved in consideration of the place.

In view of the foregoing, it is an object of one embodiment of the present invention to control a quality of a microcrystalline semiconductor film or a semiconductor film including crystal grains so that operation characteristics of a semiconductor element typified by a TFT can be improved. It is another object of one embodiment of the present invention to improve characteristics of a semiconductor element typified by a TFT by controlling a process of forming a microcrystalline semiconductor film or a semiconductor film including crystal grains. In addition, it is another object of one embodiment of the present invention to increase on current of a thin film transistor and reduce off current thereof.

One embodiment of the present invention is that in a semiconductor layer in which a plurality of crystal regions and a plurality of minute crystal grains are included in an amorphous structure, generation positions and generation density of crystal nuclei from which the crystal regions start to grow are controlled, whereby the quality of the semiconductor layer is controlled. Another embodiment of the present invention is that in a thin film transistor in which a semiconductor layer in which a plurality of crystal regions and a plurality of minute grains are included in an amorphous structure is used as a channel formation region, generation positions and generation density of crystal nuclei from which the crystal regions start to grow are controlled in accordance with a region where carries flow. According to one embodiment of the present invention, defect levels at an interface between the adjacent crystal regions (that is, a grain boundary), at an interface between the adjacent minute crystal grains (that is, a grain boundary), and at an interface between the crystal region or the minute crystal grain and an amorphous structure are reduced and a path for carrier transfer is formed.

A semiconductor layer in which a plurality of crystalline regions are included in an amorphous structure is formed using, as a reactive gas, a gas in which a semiconductor source gas (for example, a silicon hydride gas, a silicon fluoride gas, or a silicon chloride gas) and a diluent gas are mixed at a mixture rate at which a microcrystalline semiconductor can be generated. The reaction gas is introduced into an ultrahigh vacuum reaction chamber where an oxygen concentration is reduced, and a predetermined pressure is maintained to generate glow discharge plasma. Accordingly, a film is deposited over a substrate which is placed in the reaction chamber. In an early stage of deposition, an impurity element which disturbs generation of crystal nuclei is included in the reaction chamber to start deposition of a film and the concentration of the impurity element is reduced gradually, whereby crystal nuclei are generated and crystal regions are formed based on the crystal nuclei.

It is preferable to use nitrogen or a nitride as an impurity element which disturbs generation of crystal nuclei. In the case of making nitrogen included in the semiconductor layer, the nitrogen concentration in the semiconductor layer, which is measured by SIMS (secondary ion mass spectrometry), is $1 \times 10^{20}$ cm$^{-3}$ to $1 \times 10^{21}$ cm$^{-3}$. A peak nitrogen concentration in the vicinity of the interface between a gate insulating layer and the semiconductor layer, which is measured by secondary ion mass spectrometry, is $3 \times 10^{20}$ cm$^{-3}$ to $1 \times 10^{21}$ cm$^{-3}$ and the nitrogen concentration is reduced in a thickness direction of the semiconductor layer from the vicinity of the interface thereof, whereby nuclei generation positions, from which the crystal regions start to grow, and nuclei generation density are controlled.

Note that each of the minute crystal grains included in the semiconductor layer is a grain with a size of greater than or equal to 1 nm and less than or equal to 10 nm, preferably greater than or equal to 1 nm and less than or equal to 5 nm. Nitrogen is included in the interface between the semiconductor layer and the gate insulating layer, whereby generation of a crystal nucleus can be prevented and the minute crystal grains which cannot be crystal nuclei can be formed. Further, a ratio of crystalline component is increased by increasing density of the minute crystal grains, so that mobility of the semiconductor layer can be increased.

Further, a peak region of a spectrum obtained by measuring the semiconductor layer in which the plurality of crystal regions and the plurality of minute crystal grains are included in the amorphous structure with low-temperature photoluminescence spectroscopy is greater than or equal to 1.31 eV and less than or equal to 1.39 eV.

In addition, a NH group is included in the semiconductor layer, whereby a dangling bond of a Si atom is cross-linked with an N atom of the NH group at the interface between the adjacent crystal regions (that is, a grain boundary), the interface between the adjacent minute crystal grains (that is, a grain boundary), and the interface between the crystal region or the minute crystal grain and the amorphous structure. The bonding is to be a path for carrier transfer. Therefore, the semiconductor layer includes nitrogen and further the NH group, so that mobility of the semiconductor layer can be improved.

Note that, as for an impurity element which suppresses generation of crystal nuclei, an impurity element (for example, nitrogen) in silicon which does not trap carriers is selected. On the other hand, the concentration of an impurity element (for example, oxygen) which reduces the coordination number of silicon and generates dangling bonds is reduced. That is, it is preferable that the oxygen concentration, which is measured by secondary ion mass spectrometry, be less than or equal to $5 \times 10^{18}$ cm$^{-3}$.

A thin film transistor which is one embodiment of the present invention has a semiconductor layer including a plurality of crystal regions and a plurality of minute crystal grains included in an amorphous structure and a buffer layer including an amorphous semiconductor, over the semiconductor layer. The buffer layer is provided on a side opposite to the side on which the semiconductor layer is in contact with a gate insulating layer and provided on the side of a so-called back channel. In other words, the buffer layer is provided between a pair of impurity semiconductor layers imparting one conductivity type, which form a source region and a drain region, which is provided so that a plurality of crystal regions of the semiconductor layer in which the plurality of crystal regions and a plurality of minute crystal grains are included in an amorphous structure is embedded and the semiconductor layer is not exposed on the back channel side.

Note that in this specification, a concentration without mention of a measuring method is a concentration measured by secondary ion mass spectrometry.

Note that, in this specification, an on current refers to a current which flows between a source electrode and a drain electrode when the transistor is on. For example, in the case of an n-channel transistor, the on current refers to a current which flows between the source electrode and the drain electrode when a gate voltage is higher than a threshold voltage of the transistor.

In addition, off current is a current which flows between the source electrode and the drain electrode when the transistor is off state. For example, in the case of an n-channel transistor, the off current refers to a current which flows between the source electrode and the drain electrode when the gate voltage is lower than the threshold voltage of the transistor.

In the semiconductor layer in which the plurality of crystal regions and the plurality of minute crystal grains are included in the amorphous structure, generation density and generation positions of the crystal regions can be controlled. Further, the semiconductor layer includes the NH group, thereby reducing defect levels at an interface between the crystal region and the amorphous structure, at an interface between the minute crystal grain and the amorphous structure, and at a crystal grain boundary. With use of such a semiconductor layer as a channel formation region of the thin film transistor, the on current can be increased. Further, with provision the buffer layer over the semiconductor layer, the off current of the thin film transistor can be reduced.

BRIEF DESCRIPTION OF THE DRAWINGS

FIGS. 14A-1 to 14B-2 illustrate examples of a method for manufacturing a thin film transistor according to one embodiment of the present invention.

FIGS. 26A and 26B illustrate an electronic device or the like to which a thin film transistor of one embodiment of the present invention can be applied.

DETAILED DESCRIPTION OF THE INVENTION

Figure 1A:
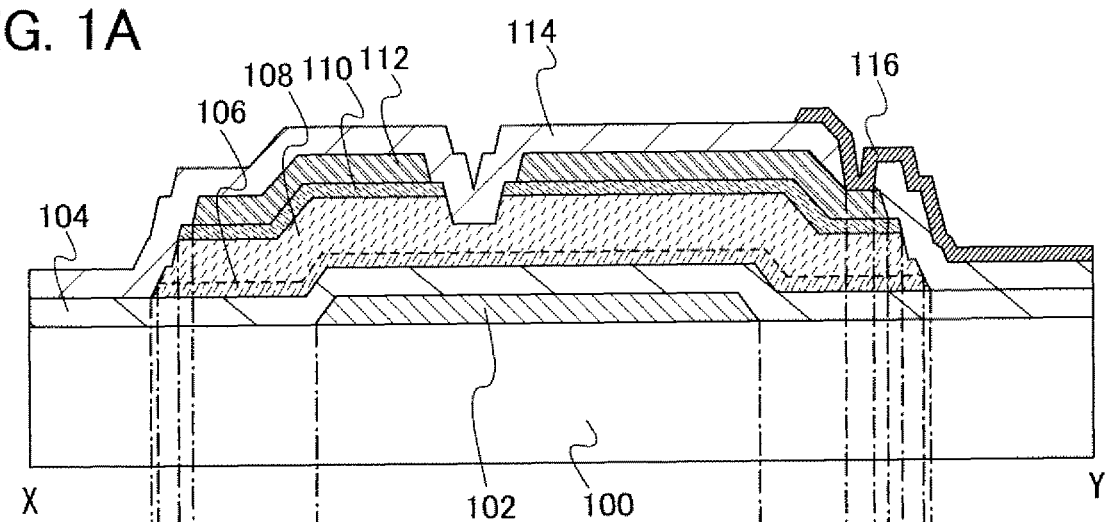
FIGS. 1A and 1B illustrate an example of a thin film transistor according to one embodiment of the present invention.

Hereinafter, embodiments of the present invention will be described with reference to the drawings. However, the present invention to be disclosed is not limited to description below. It is easily understood by those skilled in the art that a mode and/or a detail of the present invention to be disclosed can be variously changed unless departing from the scope and spirit of the present invention. Therefore, the present invention to be disclosed should not be construed as being limited to the description of the embodiments to be given below. Note that as structures of the present invention to be disclosed are described with reference to the drawings, like portions are denoted by common reference numerals in different drawings. The same hatching pattern is applied to similar parts, and the similar parts are not especially denoted by reference numerals in some cases.

Embodiment 1

In this embodiment, an example of a mode of a thin film transistor will be described with reference to the drawings.

Figure 1B:
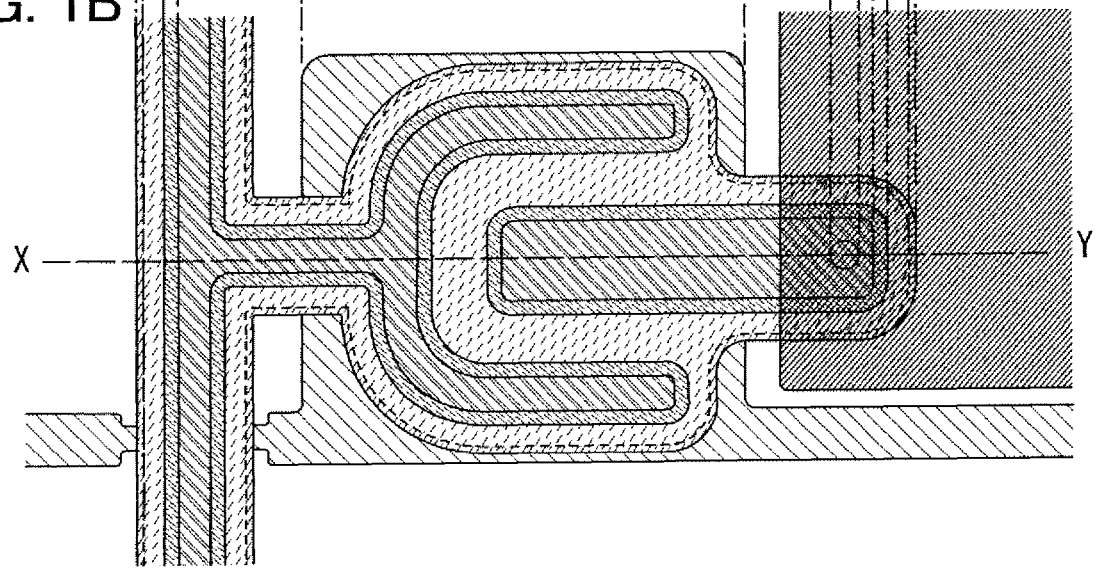

FIGS. 1A and 1B are a top view and a cross sectional view each illustrating a thin film transistor according to this embodiment. The thin film transistor illustrated in FIG. 1A includes: a gate electrode layer 102 over a substrate 100; a gate insulating layer 104 covering the gate electrode layer 102; a semiconductor layer 106 which is formed over and in contact with the gate insulating layer 104; a buffer layer 108 over the semiconductor layer 106; and a source and drain regions 110 formed over and in contact with part of the buffer layer 108. Further, the thin film transistor includes wiring layers 112 provided over and in contact with the source and drain regions 110. The wiring layers 112 form a source electrode and a drain electrode. The thin film transistor includes, over the wiring layers 112, an insulating layer 114 functioning as a protective film. Further, each layer is patterned into a desired shape.

Note that the thin film transistor illustrated in FIGS. 1A and 1B can be applied to a pixel transistor provided in a pixel portion of a liquid crystal display device. Therefore, in an example illustrated, the insulating layer 114 is provided with an opening portion, a pixel electrode layer 116 is formed over the insulating layer 114, and the pixel electrode layer 116 and one of the wiring layers 112 are connected to each other.

Further, one of the source electrode and the drain electrode is formed so as to have a U shape (alternatively, a reversed C-shape or a horseshoe shape) and surrounds the other of the source electrode and the drain electrode. A distance between the source electrode and the drain electrode is kept almost constant (see FIG. 1B).

The source electrode and the drain electrode of the thin film transistor have the aforementioned shape, whereby a channel width of the thin film transistor can be increased, and thus the amount of current is increased. In addition, variation in electric characteristics can be reduced. Further, decrease in reliability due to misalignment of a mask pattern in a manufacturing process can be suppressed. However, without limitation thereto, one of the source electrode and the drain electrode does not necessarily have a U shape.

Figure 2:
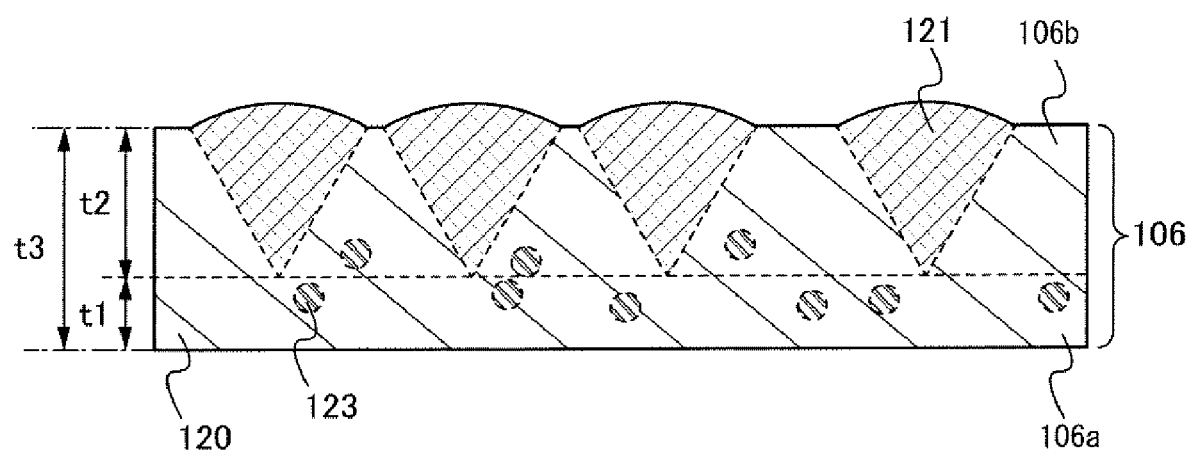
FIG. 2 illustrates a semiconductor layer included in a thin film transistor according to one embodiment of the present invention.

Here, the semiconductor layer 106 that is one of main features of this embodiment will be described. The semiconductor layer 106 functions as a channel formation region of the thin film transistor. In the semiconductor layer 106, crystal grains including a crystalline semiconductor exist in the semiconductor layer having an amorphous structure in a dispersed manner. Further, minute crystal grains are dispersed into the semiconductor layer. This state is illustrated in FIG. 2.

The semiconductor layer 106 includes a first region 106a and a second region 106b. The first region 106a includes an amorphous structure 120 and minute crystal grains 123. The second region 106b has a plurality of crystal grains 121 existing in a dispersed manner, the minute crystal grains 123, and an amorphous structure 120 between the plurality of crystal grains 121 and the plurality of minute crystal grains. The first region 106a is formed over and in contact with the gate insulating layer 104 and has a thickness t1 from an interface between the gate insulating layer 104 and the first region 106a. The second region 106b is formed over and in contact with the first region 106a and has a thickness is t2. That is, nuclei generation positions of the crystal grains 121 are controlled in a thickness direction of the semiconductor layer 106 so that they can be present at a position of t1 from the interface between the first region 106a and the gate insulating layer 104. The nuclei generation positions of the crystal grains 121 are controlled by the concentration of an impurity element (for example, a nitrogen concentration) included in the semiconductor layer 106, which suppresses crystallization.

The crystal grains 121 each have an inverted conical or inverted pyramidal shape. The "inverted conical or inverted pyramidal shape" means a three-dimensional shape that is enclosed by a base which is surrounded by a closed curve or a closed polyline and is formed with a plurality of planes, and one face including a line that connects a point on the closed curve or polyline with a vertex which is away from the base or plural faces including lines that connect points thereon with the vertex; and the vertex exists on a substrate side. In other words, an "inverted conical or inverted pyramidal shape" is a shape of the crystal grain 121 which grows approximately radially in a region which does not reach the source and drain regions in a direction in which the semiconductor layer 106 is deposited, from a position away from the interface between the gate insulating layer 104 and the semiconductor layer 106. Each of crystal nuclei formed in a dispersed manner grows along crystal direction at the same time as formation of the semiconductor layer, whereby the crystal grains start to grow from the crystal nuclei so as to spread in an in-plane direction of a plane perpendicular to a direction of crystal growth. The semiconductor layer has such crystal grains, whereby on current thereof can be made higher than that of an amorphous semiconductor. Further, the crystal grains 121 each include a single crystal or a twin crystal. Here, crystal plane directions of a side surface of the crystal grain 121 having an inverted conical or inverted pyramidal shape are aligned and the side surface (the line that connects a point on the closed curve or polyline with a vertex) is straight (FIG. 2). Therefore, it can be considered that the crystal grain 121 is close to a single crystal or a form including twin crystals rather than a form including a plurality of crystals. In the case of the form including twin crystals, the number of dangling bonds is small; therefore, the number of defects and the amount of on current are small as compared to the case of the form including a plurality of crystals. Further, the number of grain boundaries is small and the amount of on current is large in the case of the form including twin crystals, as compared to the case of the form including a plurality of crystals. Note that the crystal grain 121 may include a plurality of crystals Note that the "twin crystals" means that two different crystal grains are bonded to each other with highly favorable consistency at a crystal boundary. In other words, the "twin crystals" has a structure in which crystal lattices are continuously arranged at a crystal boundary so that a trap level due to crystal defects or the like is not formed very easily. Thus, it can be considered that a crystal boundary does not substantially exist in a region having such a crystal structure.

Note that as an impurity element which suppresses generation of crystal nuclei, an impurity element (for example, nitrogen) in silicon, which does not trap carriers, is selected. On the other hand, the concentration of an impurity element (for example, oxygen) which reduces the coordination number of silicon and generates dangling bonds is reduced. Accordingly, the oxygen concentration is preferably reduced without reduction of the nitrogen concentration. In particular, the oxygen concentration measured by secondary ion mass spectrometry is preferably set to be less than or equal to $5 \times 10^{18}$ $cm^{-3}$.

Further, the semiconductor layer 106 is formed with nitrogen existing on the surface of the gate insulating layer 104. Here, the nitrogen concentration is important because it determines nuclei generation positions. When the semiconductor layer 106 is formed over the gate insulating layer 104 in which nitrogen exists, first, the first region 106a is formed, and after that, the second region 106b is formed. Here, the position of the interface between the first region 106a and the second region 106b is determined by the nitrogen concentration. When the nitrogen concentration measured by secondary ion mass spectrometry is greater than or equal to $1 \times 10^{20}$ $cm^{-3}$ and less than or equal to $1 \times 10^{21}$ $cm^{-3}$, preferably greater than or equal to $2 \times 10^{20}$ $cm^{-3}$ and less than or equal to $7 \times 10^{20}$ $cm^{-3}$, crystal nuclei are generated, and thus the second region 106b is formed. That is, in generation positions of the crystal nuclei, from which the crystal grains 121 start to grow, the nitrogen concentration measured by secondary ion mass spectrometry is greater than or equal to $1 \times 10^{20}$ $cm^{-3}$ and less than or equal to $1 \times 10^{21}$ $cm^{-3}$, preferably greater than or equal to $2 \times 10^{20}$ $cm^{-3}$ and less than or equal to $7 \times 10^{20}$ $cm^{-3}$. In other words, at vertexes of the crystal grains 121 each having an inverted conical or inverted pyramidal shapes, the nitrogen concentration measured by secondary ion mass spectrometry are greater than or equal to $1\times10^{20}$ cm$^{-3}$ and less than or equal to $1\times10^{21}$ cm$^{-3}$, preferably greater than or equal to $2\times10^{20}$ cm$^{-3}$ and less than or equal to $7\times10^{20}$ cm$^{-3}$.

Further, the nitrogen concentration is reduced gradually as a distance from the interface between the gate insulating layer 104 and the semiconductor layer 106 becomes longer. From the interface between the gate insulating layer 104 and the semiconductor layer 106, the nitrogen concentration is preferably decreased reduced by one digit in the range of greater than or equal to 25 nm and less than or equal to 40 nm from the interface between the gate insulating layer 104 and the semiconductor layer 106, more preferably in the range of greater than or equal to 30 nm and less than or equal to 35 nm.

As described above, the crystal grains exist in a dispersed manner. Control of density of crystal nucleation is necessary so that the crystal grains exist in a dispersed manner. A nitrogen concentration in the aforementioned concentration range enables the density of nucleation of the crystal grains to be controlled and enables the crystal grains to exist in a dispersed manner.

As described above, since crystal growth is suppressed when the impurity element for suppressing crystal nucleation exists at a high concentration (approximately, the concentration of the impurity element measured by secondary ion mass spectrometry is greater than or equal to $1\times10^{20}$ cm$^{-3}$), only a surface on which the semiconductor layer is to be deposited of the semiconductor layer 106 is added with nitrogen. Alternatively, nitrogen is added only an early stage of deposition of the semiconductor.

The first region 106a of the semiconductor layer 106 includes the amorphous structure 120 and the minute crystal grains 123. Further, the first region 106a of the semiconductor layer 106 has lower energy at an urbach edge measured by constant photocurrent method (CMP) or photoluminescence spectroscopy and a small number of absorption spectra of defects, as compared to a conventional amorphous semiconductor layer. Accordingly, compared to the conventional amorphous semiconductor layer, the first region 106a of the semiconductor layer 106 is a well-ordered semiconductor layer which has fewer defects and whose tail of a level at a band edge in the valence band is steep. A peak region of a spectrum obtained by measuring the first region 106a of the semiconductor layer 106 with low-temperature photoluminescence spectroscopy is greater than or equal to 1.31 eV and less than or equal to 1.39 eV. Note that a peak region of a spectrum obtained by measuring a microcrystalline semiconductor layer, typically a microcrystalline silicon layer with low-temperature photoluminescence spectroscopy is greater than or equal to 0.98 eV and less than or equal to 1.02 eV.

Here, an effect which is obtained when the semiconductor layer 106 includes nitrogen and the minute crystal grains, preferably the NH group and the minute crystal grains will be described below.

By controlling the nitrogen concentration, the minute crystal grains are formed which cannot become crystal nuclei of crystal growth. The minute crystal grains each of which typically has a size of greater than or equal to 1 nm and less than or equal to 10 nm, preferably greater than or equal to 1 nm and less than or equal to 5 nm are formed. Further, a large amount of nitrogen is likely to be segregated outside of the minute crystal grains, that is, on the side which is in contact with the amorphous structure. Therefore, a large amount of nitrogen, preferably a large number of NH groups exist at the interface between the minute crystal grain and the amorphous structure. Hereinafter, the case where a microcrystalline silicon layer is formed as the semiconductor layer 106 will be described as a specific example.

Figure 3:
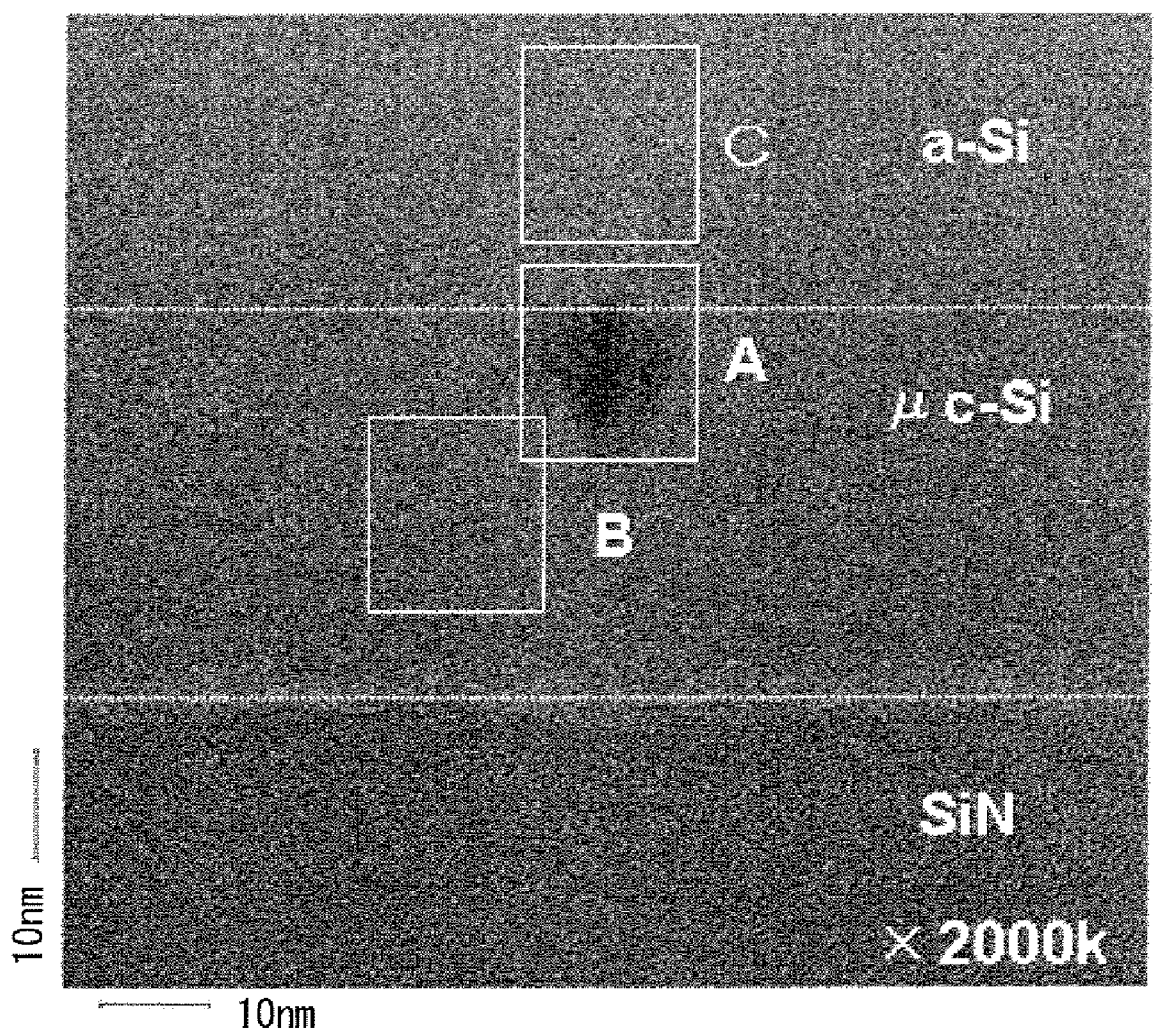
FIG. 3 is a scanning electron microscope image showing a semiconductor layer included in a thin film transistor according to one embodiment of the present invention.

FIG. 3 is a cross-sectional TEM image obtained by performing ion milling on a stacked structure of a silicon nitride layer, a microcrystalline layer, and an amorphous silicon layer. The silicon nitride layer (referred to as SiN) with a thickness of 300 nm is formed over a glass substrate, the microcrystalline silicon layer (referred to as μc-Si) with a thickness of 30 nm is formed over the silicon nitride layer, and the amorphous silicon layer (referred to as a-Si) with a thickness of 100 nm is formed over the microcrystalline silicon layer.

Here, the microcrystalline silicon layer is formed under such a condition that an RF power source frequency is 13.56 MHz; the power of an RF power source is 50 W; a deposition temperature is 280° C.; a flow rate ratio of silane to hydrogen is 1:150; and a pressure is 280 Pa. Note that a deposition rate is 1.6 nm per minute.

Figure 4A:
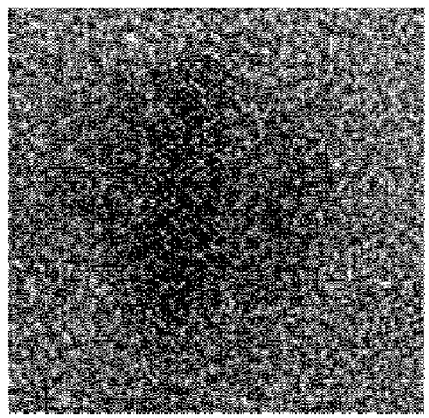
FIGS. 4A to 4C are scanning electron microscope images showing a semiconductor layer included in a thin film transistor according to one embodiment of the present invention.
Figures 1, 4B:
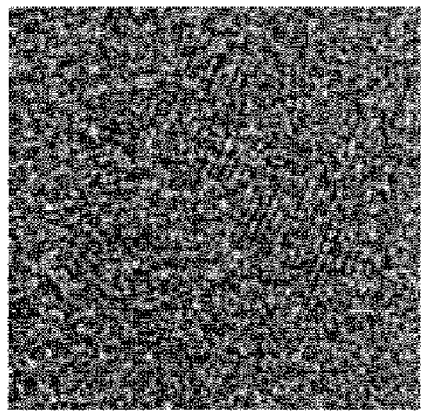
Figures 2, 4B:
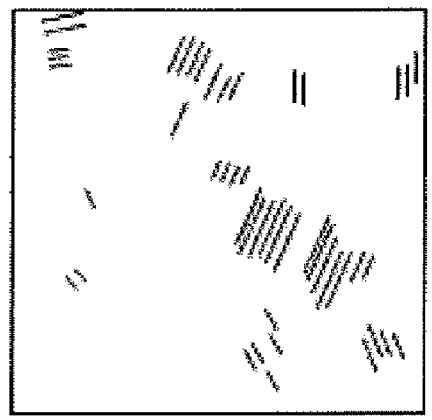
Figure 4C:
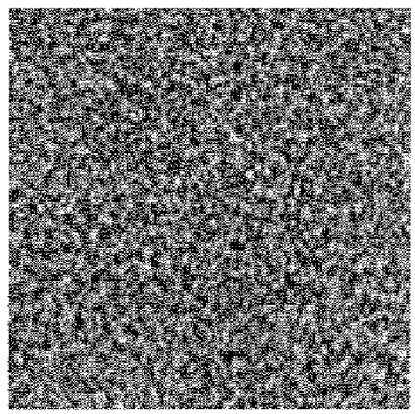

Enlarged views of regions A to C in FIG. 3 are shown in FIGS. 4A to 4C.

FIG. 4A is an enlarged image of a periphery of a boundary between the microcrystalline silicon layer and the amorphous silicon layer. A large number of lattice images having a short range order can be observed in FIG. 4A. Further, the large number of the lattice images each have a shape, width of which is increased toward the upper side with a base of the region A used as a base point. That is, a result from FIG. 4A shows that the large number of lattice images form the crystal grains each having an inverted conical or inverted pyramidal shape.

FIG. 4B-1 is an enlarged image of the periphery of the center of the microcrystalline silicon layer. FIG. 4B-1 is the enlarged image in a position which is in the microcrystalline silicon layer at a position with almost the same distance from a boundary between the microcrystalline silicon layer and the amorphous silicon layer as a distance between the microcrystalline silicon layer and the silicon nitride layer. FIG. 4B-2 schematically shows the lattice images of FIG. 4B-1. As denoted by a line, a lattice image having a short range order can also be observed in FIG. 4B-1. Further, it is observed that the size of the lattice image is greater than or equal to 1 nm and less than or equal to 10 nm and the lattice image is the minute crystal grain.

Further, FIG. 4C is the enlarged image of the amorphous silicon layer. A lattice image cannot be observed in FIG. 4C. Therefore, it is observed that FIG. 4C has the amorphous structure.

A model is described below, in which when nitrogen, typically a NH group is combined with a dangling bond of a silicon atom in an interface between the crystal region and the amorphous structure, the interface between the minute crystal grain and the amorphous structure, and a crystal grain boundary, carriers flow easily on the assumption that nitrogen, preferably a NH group is likely to be segregated outside of the aforementioned minute crystal grain, that is, an interface between the minute crystal grain and the amorphous structure or outside of the crystal grain having a inverted conical or inverted pyramidal shape, that is, an interface between the crystal grain and the amorphous structure.

Figure 5:
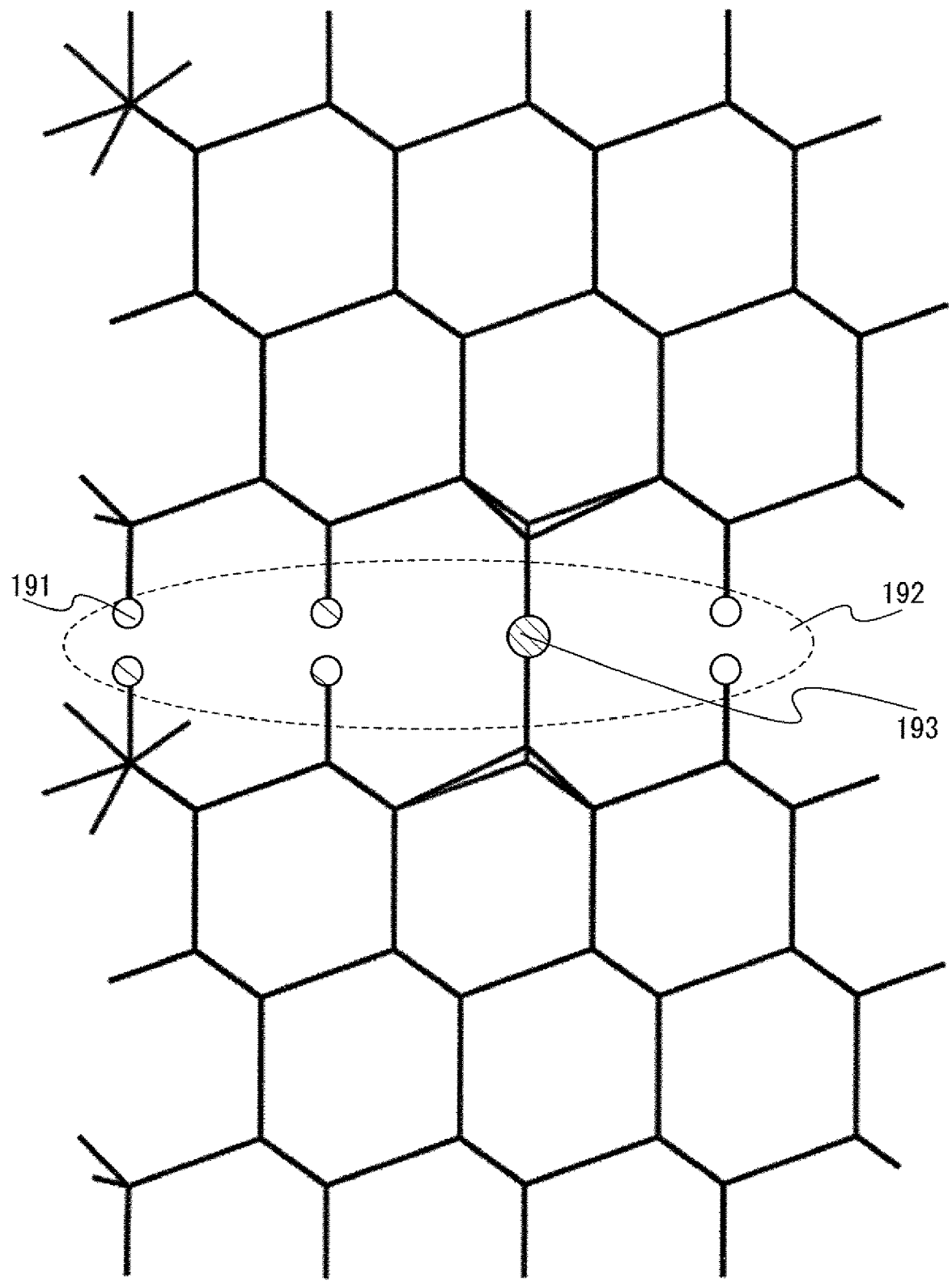
FIG. 5 is illustrates a semiconductor layer included in a thin film transistor according to one embodiment of the present invention.
Figure 6:
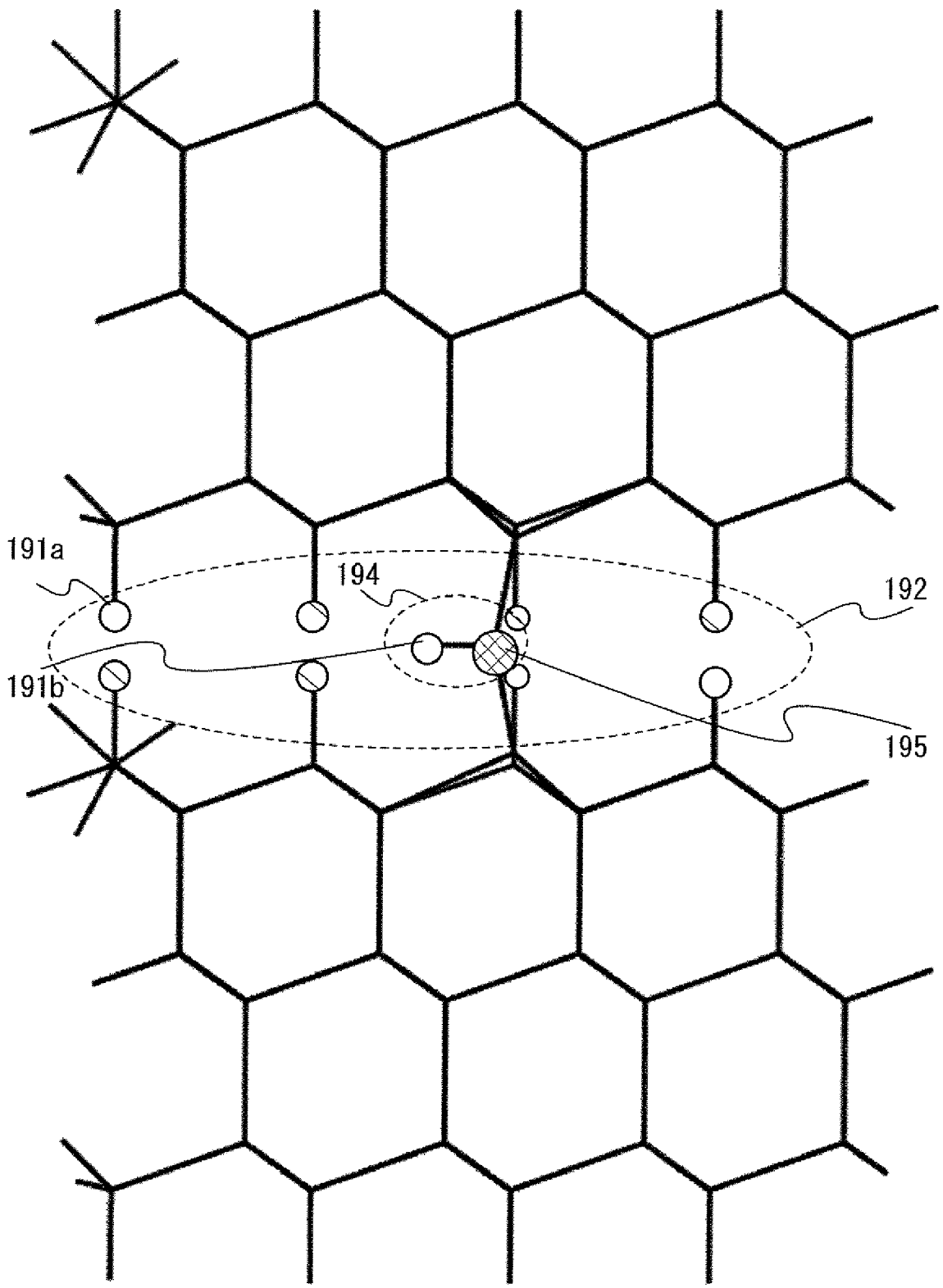
FIG. 6 illustrates a semiconductor layer included in a thin film transistor according to one embodiment of the present invention.

Simulation of LUMO (lowest unoccupied molecular orbital) which is a level in which n-type-carriers transfer (that is, the lowest level in a conduction band) is performed in each of A model (model 1) in which one pair of dangling bonds are cross-linked with an O atom 193 in a silicon layer having a crystal grain boundary 192 in which dangling bonds of the Si atom are terminated with H atoms 191 as illustrated in FIG. 5, and a model (model 2) in which one pair of dangling bonds is cross-linked with a NH group 194 in the silicon layer having the crystal grain boundary 192 in which the dangling bonds of the Si atom are terminated with H atoms. As software for the simulation, first principle calculation software employing density functional theory is used. Note that the NH group 194 indicates a nitrogen atom 195 and a hydrogen atom 191b in FIG. 6. Further, an intersection of lines indicates a silicon atom and the line indicates a bond of the silicon atom. Further, in order to evaluate efficiency of the oxygen atom and the NH group, the dangling bonds other than the dangling bond cross-linked with the oxygen atom or the NH group are terminated with the hydrogen atoms.

Figure 7:
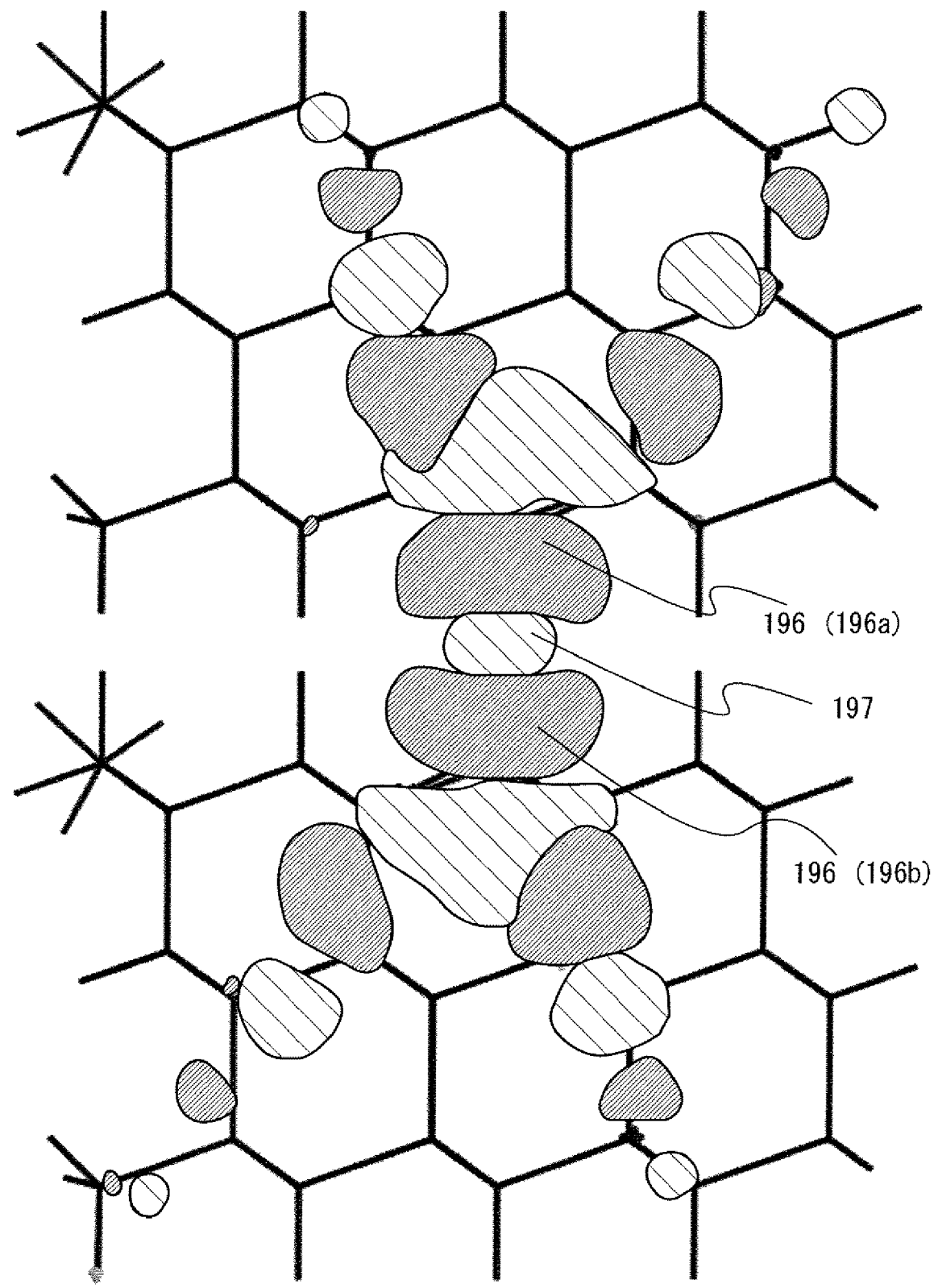
FIG. 7 illustrates a semiconductor layer included in a thin film transistor according to one embodiment of the present invention.
Figure 8:
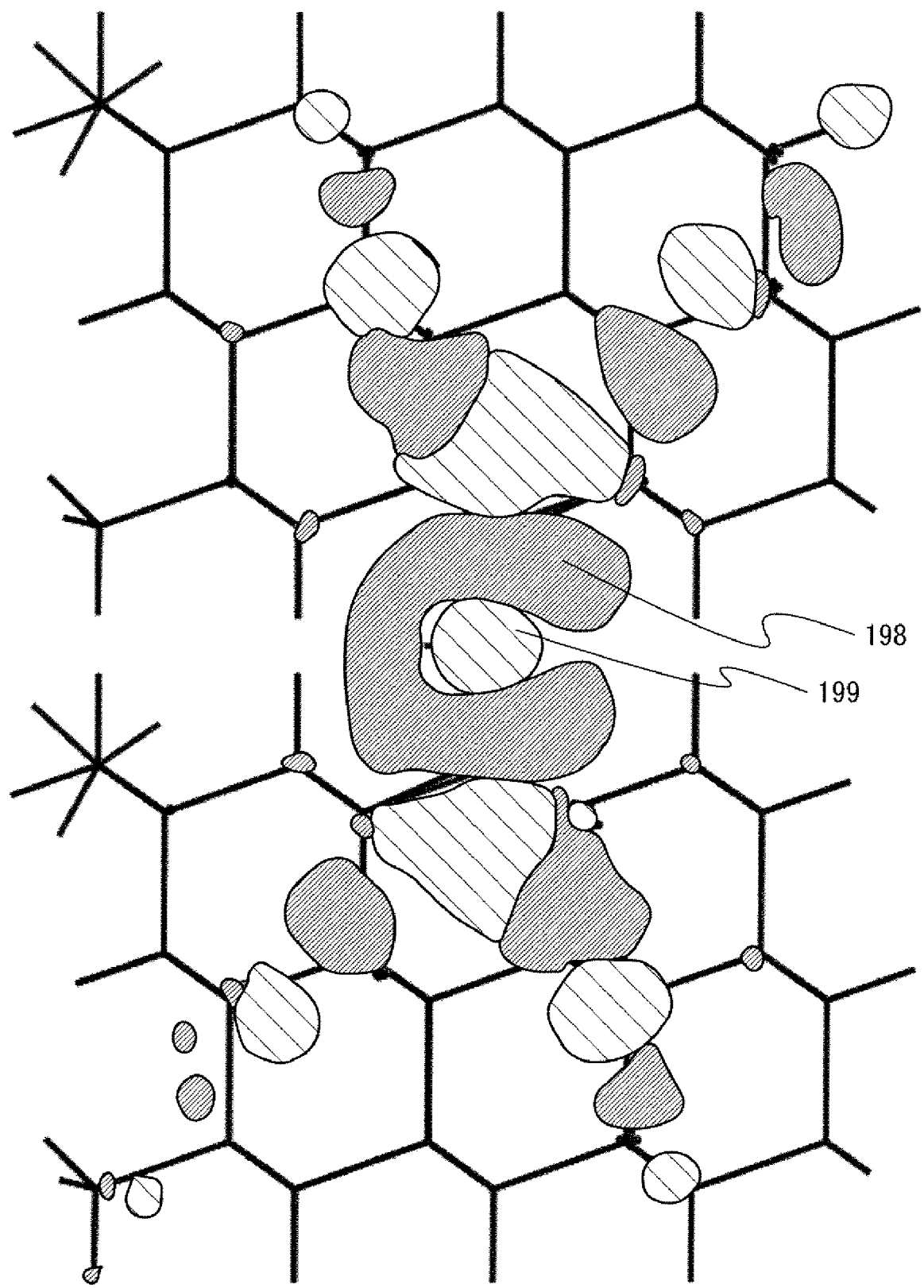
FIG. 8 illustrates a semiconductor layer included in a thin film transistor according to one embodiment of the present invention.

FIG. 7 illustrates a calculation result obtained by using the model 1 and FIG. 8 illustrates a calculation result obtained by using the model 2.

FIG. 7 illustrates a wave function in a region where the Si atom is cross-linked with the O atom and in the periphery of the region. A wave function 196 and a wave function 197 indicate regions whose phases are positive and negative, respectively (or negative and positive, respectively) and whose absolute value are the same. FIG. 8 illustrates a wave function at a region where the Si atom is cross-linked with the NH group and in the periphery of the region. A wave function 198 and a wave function 199 are regions whose phases are positive and negative and whose absolute values are the same.

FIG. 7 shows that in the case where the dangling bond of the Si atom is cross-linked with the O atom, since regions which have the same absolute values and the same phases of a wave function (for example, wave functions 196a and 196b) are separated, carriers are hard to flow. That is, when the silicon layer includes oxygen, a combination which interrupts carrier transfer is formed, whereby the carrier mobility of the silicon layer is reduced.

On the other hand, FIG. 8 shows that in the case where the dangling bond of the Si atom is cross-linked with the NH group, since the region 198 which has the same absolute values and the same phases among different Si atoms is connected to the adjacent dangling bonds, carriers are likely to flow. That is, when the silicon layer includes the NH groups a combination which facilitates the carrier transfer in the dangling bond is formed, whereby the carrier mobility of the silicon layer is increased. Accordingly, it is considered that the mobility of the thin film transistor is improved. Note that as density of the minute crystal grains is increased, crystallinity in the semiconductor layer is increased, and further, the crystal grain boundary interrupting carrier transfer is increased. However, by including nitrogen, typically the NH group in the semiconductor layer and cross-linking the dangling bonds of the Si atoms, the combination becomes a carrier path at the crystal boundary, whereby the carrier transfer is not interrupted.

Accordingly, in the semiconductor layer, by increasing the density of the minute crystal grains and controlling the nitrogen concentration, nitrogen, preferably the NH group is included in defects at the interface between the crystal region and the amorphous structure, the interface between the minute crystal grain and the amorphous structure, and the interface between the minute crystal grains, whereby the defects are terminated with nitrogen, preferably with the NH group. With the termination, the combination through which carriers can transfer is formed in the defect. Further, by increasing the density of the minute crystal grains, crystallinity of the semiconductor layer can be improved. In addition, since density of the nuclei of the crystal grains each having an inverted conical or inverted pyramidal shape can be controlled by controlling the nitrogen concentration, the semiconductor layer can be formed, in which the crystal grains each having an inverted conical or inverted pyramidal shape exist in a dispersed manner. Accordingly, the carrier mobility of the semiconductor layer can be improved.

Further, by reducing the oxygen concentration in the semiconductor layer, the combination which interrupts the carrier transfer can be reduced in the defects at the interface between the minute crystal grains and the amorphous structure, and the interface between the minute crystal grains.

In this manner, in the semiconductor, by reducing the oxygen concentration, controlling the nitrogen concentration, and further including the NH group in the semiconductor layer, boundary defects at the interface of the crystal regions, the interface between the crystal region and the amorphous structure, and the interface between the minute crystal grains are reduced and the carrier mobility can be improved. Further, with use of the semiconductor layer in the channel formation region, the field-effect mobility and the on current of the thin film transistor can be increased.

In addition, the buffer layer 108 is formed over the semiconductor layer 106. By having the buffer layer 108, the off current can be reduced.

Next, a method for manufacturing the thin film transistor illustrated in FIG. 1 will be described. An n-channel thin film transistor has higher carrier mobility than a p-channel thin film transistor. It is preferable that all thin film transistors formed over the same substrate have the same polarity because the number of manufacturing steps can be reduced. Therefore, in this embodiment, a method for manufacturing an n-channel thin film transistor will be described.

Figure 9A:
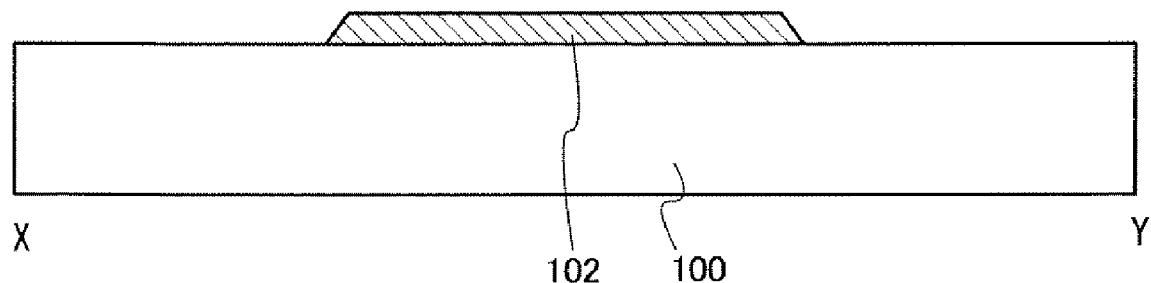
FIGS. 9A to 9C illustrate an example of a method for manufacturing a thin film transistor according to one embodiment of the present invention.

First, the gate electrode layer 102 is formed over the substrate 100 (see FIG. 9A).

As the substrate 100, in addition to a glass substrate and a ceramic substrate, a plastic substrate or the like with heat resistance which can withstand a process temperature in this manufacturing process can be used. In the case where a substrate does not need a light-transmitting property, a substrate in which an insulating layer is provided on a surface of a substrate of a metal such as a stainless steel alloy may be used. As a glass substrate, an alkali-free glass substrate formed using barium borosilicate glass, aluminoborosilicate glass, aluminosilicate glass, or the like may be used. In the case of where the substrate 100 is a mother glass, the substrate may have any of the following sizes: the first generation (e.g. 320 mm×400 mm) not only to the seventh generation (e.g. 1870 mm×2200 mm) or the eighth generation (e.g. 2200 mm×2400 mm), but also to the ninth generation (e.g. 2400 mm×2800 mm) or the tenth generation (e.g. 2950 mm×3400 mm).

The gate electrode layer 102 can be formed in a single layer or a stacked layer using a metal material such as molybdenum, titanium, chromium, tantalum, tungsten, aluminum, copper, neodymium, or scandium, or an alloy material which includes any of these materials as a main component. In the case of using aluminum, when an Al—Ta alloy in which aluminum is alloyed with tantalum added thereto is used, hillocks are preferably suppressed, which is preferable. Further, when an Al—Nd alloy in which aluminum is alloyed with neodymium added thereto is used, resistance can be reduced and generation of hillocks can be suppressed, which is more preferable. Alternatively, an AgPdCu alloy or a semiconductor typified by polycrystalline silicon doped with an impurity element such as phosphorus may be used. For example, a two-layer structure in which a molybdenum layer is stacked over an aluminum layer, a two-layer structure in which a molybdenum layer is stacked over a copper layer, or a two-layer structure in which a titanium nitride layer or a tantalum nitride is stacked over a copper layer is preferable. When a metal layer functioning as a barrier layer is stacked over a layer with low electric resistance, electric resistance can be reduced and diffusion of a metal element from the metal layer into the semiconductor layer can be prevented. Alternatively, a two-layer structure including a titanium nitride layer and a molybdenum layer or a three-layer structure in which a tungsten layer having a 50 nm thick tungsten layer, a 500 nm thick alloy layer of aluminum and silicon, and a 30 nm thick titanium nitride layer are stacked may be used. In the case where a three-layer structure is employed, a tungsten nitride layer may be used instead of the tungsten layer of the first conductive layer; an aluminum-titanium alloy layer may be used instead of the aluminum-silicon alloy layer of the second conductive layer; or a titanium layer may be used instead of the titanium nitride layer of the third conductive layer. For example, when a molybdenum layer is stacked over an aluminum-neodymium alloy layer, a conductive layer which has excellent heat resistance and electrically low resistance can be formed.

The gate electrode layer 102 can be formed in such a manner that a conductive layer is formed over the substrate 100, using the above material by a sputtering method, a vacuum evaporation method, or the like; a resist mask is formed over the conductive layer by a photolithography method, an inkjet method, or the like; and the conductive layer is etched using the resist mask. Alternatively, the gate electrode layer 102 can be formed by discharging a conductive nanopaste of silver, gold, copper, or the like over the substrate by an inkjet method and baking the conductive nanopaste. Note that as barrier metal which increases adhesion between the gate electrode layer 102 and the substrate 100 and prevents diffusion to a base, a nitride layer of any of the above-described metal materials may be provided between the substrate 100 and the gate electrode layer 102. Here, the gate electrode layer 102 is formed by forming the conductive layer over the substrate 100 and etching the conductive layer by using a resist mask formed using a photomask.

Note that it is preferable that side surfaces of the gate electrode layer 102 be tapered. This is because defective formation at stepped portions of the semiconductor layer and the wiring layer which are to be formed over the gate electrode layer 102 is reduced. In order that the side surfaces of the gate electrode layer 102 are tapered, etching may be performed while the resist mask is made to recede. For example, by making an oxygen gas included in an etching gas, etching can be performed while the resist mask is made to recede.

Through the step of forming the gate electrode layer 102, a gate wiring (a scanning line) can also be formed at the same time. Further, a capacitor line included in a pixel portion can also be formed at the same time. Note that a "scanning line" means a wiring which selects a pixel, while a "capacitor line" means a wiring which is connected to one electrode of a storage capacitor in a pixel. However, without limitation thereto, the gate electrode layer 102 and either or both a gate wiring and a capacitor wiring may be formed separately.

Figure 9B:
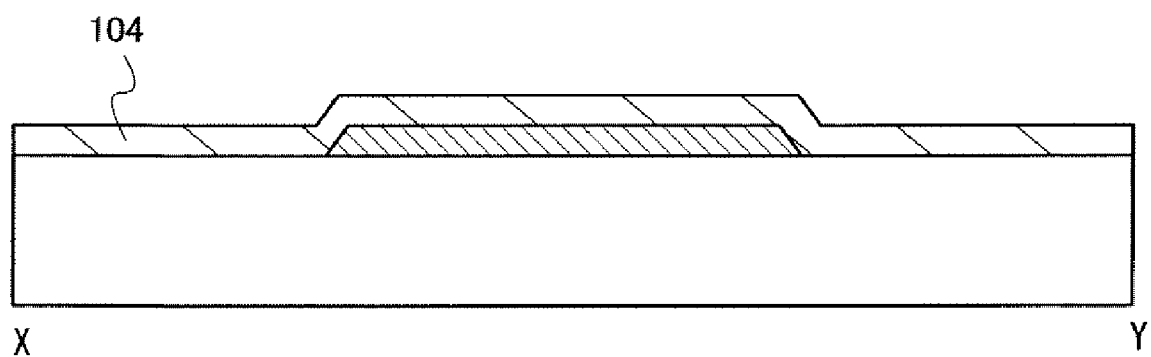
Figure 9C:
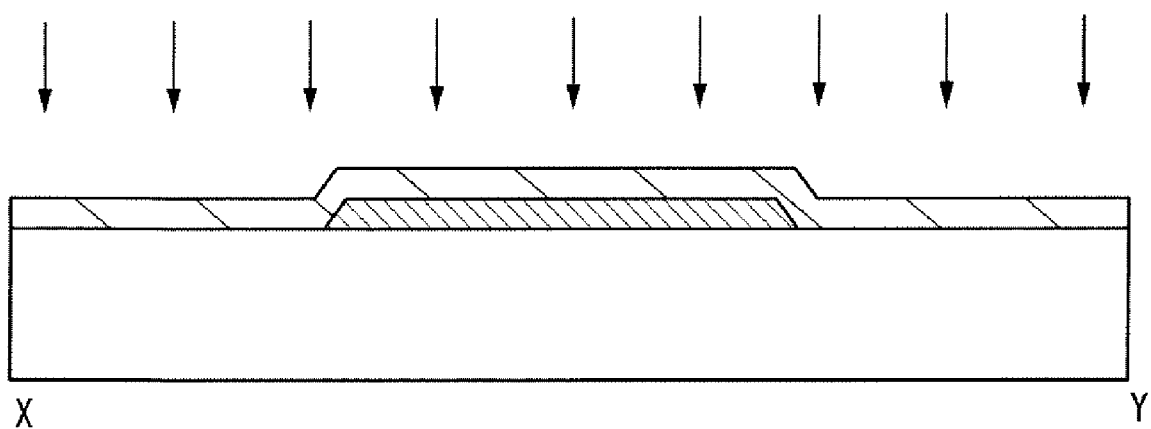

Next, the gate insulating layer 104 is formed so as to cover the gate electrode layer 102 (see FIG. 9B). The gate insulating layer 104 can be formed using a silicon oxide layer, a silicon nitride layer, a silicon oxynitride layer, or a silicon nitride oxide layer by a CVD method, a sputtering method, or the like. Further, the gate insulating layer 104 can be formed by a plasma CVD method with a frequency of 1 to 20 MHz, typically a high frequency of 13.56 MHz; or a high frequency of higher than 20 MHz and lower than or equal to 120 MHz approximately, typically 27.12 MHz or 60 MHz. Further, it is preferable that the gate insulating layer 104 be formed using a microwave plasma CVD apparatus with a high frequency (about 1 GHz). When the gate insulating layer 104 is formed by a microwave plasma CVD apparatus with a high frequency, the withstand voltage between a gate electrode and a drain electrode or a source electrode can be improved; therefore, a highly reliable thin film transistor can be obtained. Further, the gate insulating layer 104 is formed using silicon oxynitride, so that fluctuation in a threshold voltage of a transistor can be suppressed.

For example, silicon oxynitride includes more oxygen than nitrogen and, in the case where measurements are performed using Rutherford backscattering spectrometry (RBS) and hydrogen forward scattering (HFS), includes oxygen, nitrogen, silicon, and hydrogen as composition ranging from 50 atomic % to 70 atomic %, 0.5 atomic % to 15 atomic %, 25 atomic % to 35 atomic %, and 0.1 atomic % to 10 atomic %, respectively. Further, silicon nitride oxide includes more nitrogen than oxygen, and in the case where measurements are conducted using RBS and HFS, silicon nitride oxide preferably includes oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms included in the silicon oxynitride or the silicon nitride oxide is defined as 100 atomic %.

Note that in the case of forming the gate insulating layer 104 using a silicon nitride layer, a thin silicon oxynitride layer is formed over the gate insulating layer 104, whereby deterioration that occurs at initial operation of a thin film transistor can be suppressed. Here, the silicon oxynitride layer may be formed extremely thin, which may be greater than or equal to 1 nm. The thickness is preferably greater than or equal to 1 nm and less than or equal to 3 nm.

Next, a method for forming the semiconductor layer 106 is described. The semiconductor layer 106 may be formed with a thickness of greater than or equal to 2 nm and less than or equal to 60 nm, preferably greater than or equal to 10 nm and less than or equal to 30 nm.

Further, as described above, the semiconductor layer 106 includes minute crystal grains and crystal grains each having an inverted conical or inverted pyramidal shape. For example, the inverted conical or inverted pyramidal crystal grains can be formed while nuclei generation of the crystal grains is controlled in such a manner that the oxygen concentration of the semiconductor layer 106 is reduced, the nitrogen concentration is made higher than the oxygen concentration, and the nitrogen concentration is reduced in accordance with a growth direction of the crystal grain. Here, it is preferable that the nitrogen concentration be one or more digits higher than the oxygen concentration. More specifically, the oxygen concentration and the nitrogen concentration at the interface between the gate insulating layer 104 and the semiconductor layer 106, which are measured by secondary ion mass spectrometry, are less than or equal to $5 \times 10^{18}$ cm$^{-3}$ and greater than or equal to $1 \times 10^{20}$ cm$^{-3}$ and less than or equal to $1 \times 10^{21}$ cm$^{-3}$, respectively. Further, as a method by which the oxygen concentration is reduced and the nitrogen concentration is made higher than the oxygen concentration to form inverted conical or inverted pyramidal crystal grains, the following methods can be given.

One method by which the oxygen concentration is reduced and the nitrogen concentration is made higher than the oxygen concentration is a method in which nitrogen is included in the gate insulating layer 104 which is in contact with the semiconductor layer 106 at a high concentration. That is, the gate insulating layer 104 is formed using a silicon nitride layer. Further, a gas (typically, ammonia) including an NH bond is used as a source gas of the silicon nitride layer and the gas is preferably adsorbed onto a reaction chamber. Note that the method will be described in Embodiment 2.

Another method by which the oxygen concentration is suppressed low and the nitrogen concentration is made higher than the oxygen concentration is a method in which the surface of the gate insulating layer 104 includes a large amount of nitrogen before the semiconductor layer 106 is formed. In order that the surface of the gate insulating layer 104 includes a large amount of nitrogen, after the gate insulating layer 104 is formed and before the semiconductor layer 106 is formed, a gas including nitrogen may sprayed over the surface of the gate insulating layer 104 so that nitrogen is adsorbed onto the surface of the gate insulating layer 104. Alternatively, the surface of the gate insulating layer 104 may be processed with plasma generated by a gas including nitrogen. Here, for example, ammonia, nitrogen, nitrogen chloride, nitrogen fluoride, or the like can be given as a gas including nitrogen.

Another method in which the oxygen concentration is suppressed low and the nitrogen concentration is made higher than the oxygen concentration is a method in which an inner wall of a treatment chamber used for forming the semiconductor layer 106 is covered with a film including nitrogen at a high concentration. As a material including nitrogen at a high concentration, silicon nitride can be given, for example. Further, a gas including a NH bond (typically, ammonia) is used as a material of silicon nitride and the gas may be adsorbed on the inside of the treatment chamber. Note that a layer which includes nitrogen at a high concentration and covers the inner wall of the treatment chamber may be formed at the same time as the gate insulating layer 104, which is preferable because a step can be simplified. Further, in this case, the gate insulating layer 104 and the semiconductor layer 106 are formed in the same treatment chamber; therefore, a device is downsized. Note that this method will be described in Embodiment 3.

Another method by which the oxygen concentration is suppressed low and the nitrogen concentration is made higher than the oxygen concentration is a method in which the concentration of oxygen included in a gas used for forming the semiconductor layer 106 is suppressed low and the nitrogen concentration is made high. In addition a gas including a NH bond (typically, ammonia) may be used. At this time, only a gas used in an early stage of deposition of the semiconductor layer 106 may be supplied with nitrogen. Alternatively, the amount of nitrogen to be supplied may be reduced gradually. Note that this method will be described in Embodiment 4.

Note that in the method by which the oxygen concentration is reduced and the nitrogen concentration is made higher than the oxygen concentration, a condition for forming a microcrystalline semiconductor layer is preferable. Typically, hydrogen may be diluted so that the flow ratio of hydrogen is 10 to 200 times, preferably 50 to 200 times as high as the deposition gas including silicon, such as silane and disilane. Nitrogen is introduced together with the condition, whereby it is possible that the oxygen concentration is suppressed, so that the nitrogen concentration is made higher than the oxygen concentration. In addition, the semiconductor layer including the first region 106a illustrated in FIG. 2 which includes the minute crystal grains 123 and the amorphous structure 120 and the first region 106b illustrated in FIG. 2 which includes the amorphous structure 120, the crystal grains 121 each having an inverted conical or inverted pyramidal shape, and the minute crystal grains 123 can be formed.

Note that, in this embodiment, any one of the methods described above or a combination thereof may be used. In this embodiment, the gate insulating layer 104 has a structure in which a silicon oxynitride layer is stacked over a silicon nitride layer. The gate insulating layer 104 is exposed to ammonia, whereby the surface of the gate insulating layer 104 is supplied with nitrogen.

Figure 12:
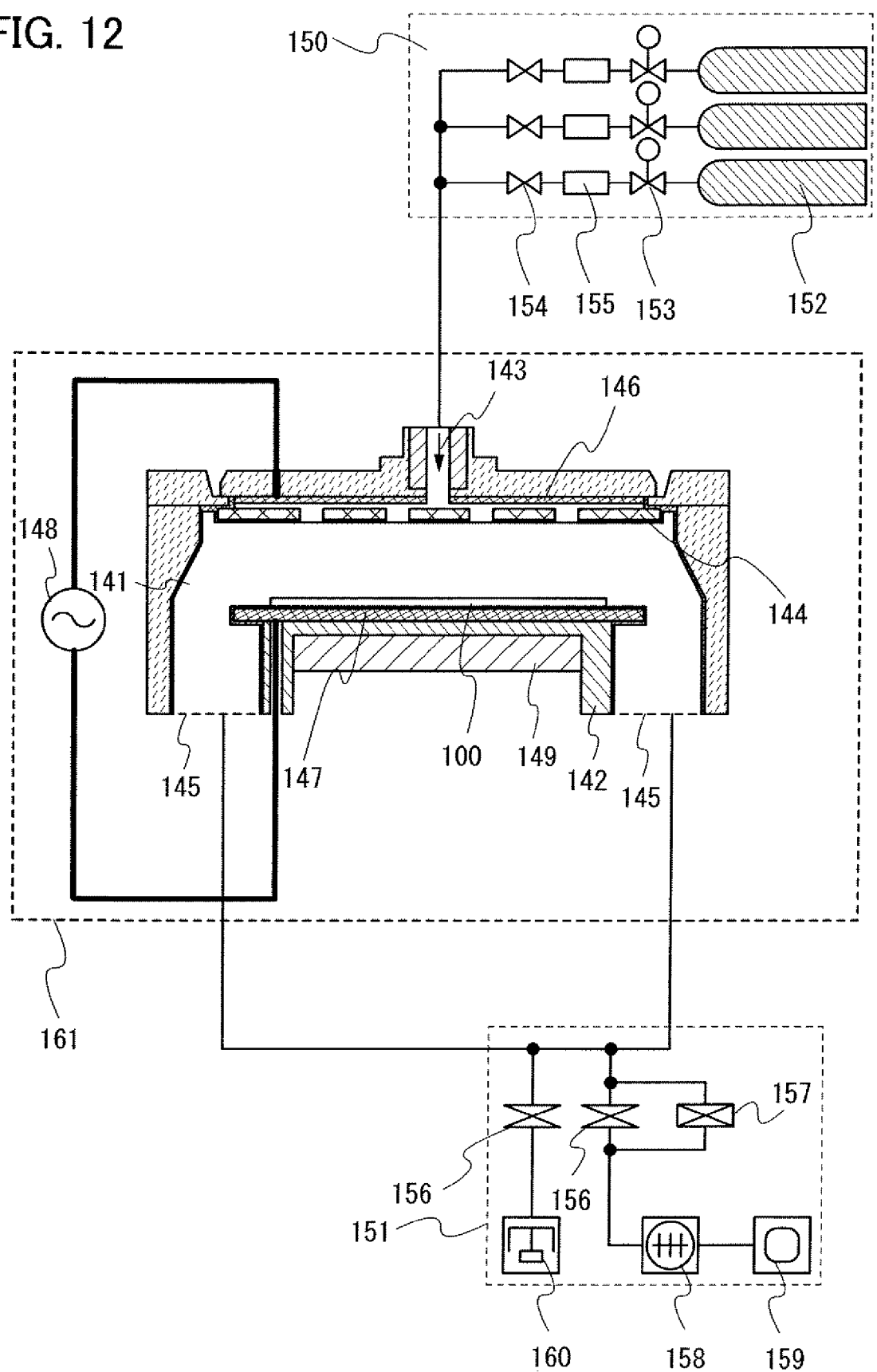
FIG. 12 illustrates an apparatus which can be used in a method for manufacturing a thin film transistor according to one embodiment of the present invention.

Here, an example of forming the gate insulating layer 104, the semiconductor layer 106, the source and drain regions 110 is described in detail. These layers are formed by a CVD method or the like. Further, the gate insulating layer 104 has a stacked-layer structure in which a silicon oxynitride layer is formed over a silicon nitride layer. By employing such a structure, the silicon nitride layer can prevent an element included in the substrate which adversely affect electric characteristics (an element such as sodium in the case where the substrate is a glass substrate) from entering the semiconductor layer 106 or the like. FIG. 12 is a schematic view illustrating a CVD apparatus which is used for forming these layers.

A plasma CVD apparatus 161 illustrated in FIG. 12 is connected to a gas supply means 150 and an exhaust means 151.

The plasma CVD apparatus 161 illustrated in FIG. 12 includes a treatment chamber 141, a stage 142, a gas supply portion 143, a shower plate 144, an exhaust port 145, an upper electrode 146, a lower electrode 147, an alternate-current power source 148, and a temperature control portion 149.

The treatment chamber 141 is formed using a material having rigidity and the inside thereof can be evacuated to vacuum. The treatment chamber 141 is provided with the upper electrode 146 and the lower electrode 147. Note that in FIG. 12, a structure of a capacitive coupling type (a parallel plate type) is illustrated; however, another structure such as that of an inductive coupling type can be used, as long as plasma can be generated in the treatment chamber 141 by applying two or more different high-frequency powers.

When treatment is performed with the plasma CVD apparatus illustrated in FIG. 12, a given gas is supplied from the gas supply portion 143. The gas is supplied into the process chamber 141 through the shower plate 144. High-frequency power is applied with the alternate-current power source 148 connected to the upper electrode 146 and the lower electrode 147 to excite the gas in the process chamber 141, thereby generating plasma. Further, the gas in the process chamber 141 is exhausted through the exhaust port 145 that is connected to a vacuum pump. Further, the temperature control portion 149 makes it possible to perform plasma treatment while an object to be processed is being heated.

The gas supply means 150 includes a cylinder 152 which is filled with a reactive gas, a pressure adjusting valve 153, a stop valve 154, a mass flow controller 155, and the like. The treatment chamber 141 includes a shower plate which is processed in a plate-like shape and provided with a plurality of pores, between the upper electrode 146 and the substrate 100. A reactive gas supplied into the upper electrode 146 is supplied into the treatment chamber 141 from these pores through an inner hollow structure.

The exhaust means 151 that is connected to the treatment chamber 141 has a function of vacuum evacuation and a function of controlling the pressure inside the treatment chamber 141 to be maintained at a predetermined level when a reaction gas is introduced. The exhaust means 151 includes a butterfly valve 156, a conductance valve 157, a turbo molecular pump 158, a dry pump 159, and the like. In the case of arranging the butterfly valve 156 and the conductance valve 157 in parallel, the butterfly valve 156 is closed and the conductance valve 157 is operated, so that the evacuation speed of the reactive gas is controlled and thus the pressure in the treatment chamber 141 can be kept in a predetermined range. Moreover, the butterfly valve 156 having higher conductance is opened, so that high-vacuum evacuation can be performed.

In the case of performing ultra-high vacuum evacuation up to a pressure lower than $10^{-5}$ Pa on the treatment chamber 141, a cryopump 160 is preferably used together. Alternatively, when exhaust is performed up to ultra-high vacuum as ultimate vacuum, the inner wall of the treatment chamber 141 may be polished into a mirror surface, and the treatment chamber 141 may be provided with a heater for baking in order to reduce deflation from the inner wall.

Note that as illustrated in FIG. 12, when precoating treatment is performed so that a layer is formed (deposited) so as to cover the entire treatment chamber, it is possible to prevent an impurity element attached to the inner wall of the treatment chamber or an impurity element for forming the inner wall of the treatment chamber from mixing into an element. In this embodiment, as precoating treatment, a layer including silicon as its main component may be formed. For example, an amorphous silicon layer or the like may be formed. Note that it is preferable that this layer does not include oxygen.

A series of steps from a step of forming the gate insulating layer 104 to a step of forming an impurity semiconductor layer 109 imparting one conductivity type (also referred to as a semiconductor layer including an impurity element imparting one conductivity type) will be described with reference to FIG. 13. Note that the gate insulating layer 104 is formed in such a manner that a silicon oxynitride layer is stacked over a silicon nitride layer.

Figure 13:
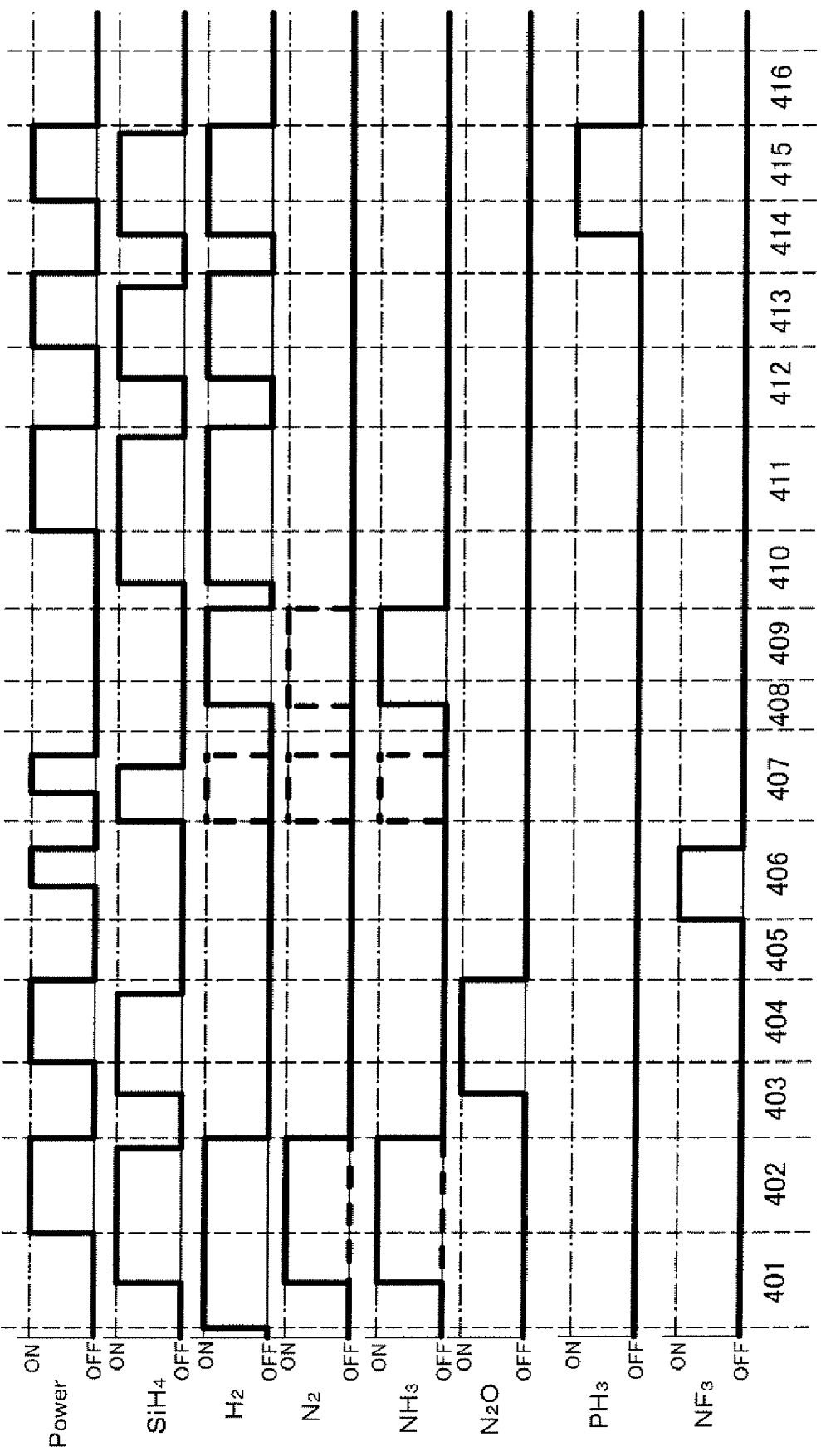
FIG. 13 illustrate s an example of a method for manufacturing a thin film transistor according to one embodiment of the present invention.

First, the substrate over which the gate electrode layer 102 is formed is heated in the treatment chamber 141 of the CVD apparatus and source gases used for depositing a silicon nitride layer are introduced into the treatment chamber 141 (pretreatment 401 in FIG. 13). Here, as an example, a silicon nitride layer with a thickness of about 110 nm is formed in such a manner that the source gases are introduced and stabilized, where the flow rate of $SiH_4$ is 40 sccm, the flow rate of $H_2$ is 500 sccm, the flow rate of $N_2$ is 550 sccm, and the flow rate of $NH_3$ is 140 sccm, and plasma discharge of 370 W is performed, where the pressure in the treatment chamber 141 is 100 Pa and the temperature of the substrate is 280° C. After that, only introduction of $SiH_4$ is stopped, and after several seconds, plasma discharge is stopped (formation of $SiN_x$ 402 in FIG. 13). This is because if plasma discharge is stopped in a state where $SiH_4$ is present in the treatment chamber 141, grains or powders including silicon as its main component are formed, which causes reduction in yield. Note that, in the formation of SiN 402, either $N_2$ or $NH_3$ gas may be used as the source gas for depositing the silicon nitride layer.

Next, the source gas used for forming the silicon nitride layer is exhausted and source gases used for forming a silicon oxynitride layer are introduced into the treatment chamber 141 (replacement of gases 403 in FIG. 13). Here, as an example, a silicon oxynitride layer with a thickness of about 110 nm is formed in such a manner that the source gases are introduced and stabilized, where the flow rate of $SiH_4$ is 30 seem and the flow rate of $N_2O$ is 1200 sccm, and plasma discharge of 50 W is performed, where the pressure in the treatment chamber 141 is 40 Pa and the temperature of the substrate is 280° C. After that, in a similar manner to the silicon nitride layer, only introduction of $SiH_4$ is stopped, and after several seconds, plasma discharge is stopped (formation of $SiO_xN_y$ 404 in FIG. 13).

Through the above steps, the gate insulating layer 104 can be formed. After the gate insulating layer 104 is formed, the substrate 100 is carried out from the treatment chamber 141 (unloading 405 in FIG. 13).

After the substrate 100 is carried out from the treatment chamber 141, for example, a $NF_3$ gas is introduced into the treatment chamber 141 and the inside of the treatment chamber 141 is cleaned (cleaning treatment 406 in FIG. 13). After that, treatment for forming an amorphous silicon layer in the treatment chamber 141 is performed (precoating treatment 407 in FIG. 13). Although the amorphous silicon layer is formed in a manner similar to that of a buffer layer 107, which is formed later, hydrogen may or may not be introduced into the processing chamber 141. By this treatment, an amorphous silicon layer is formed on the inner wall of the treatment chamber 141. Alternatively, precoating treatment may be performed using silicon nitride layer. The treatment in this case is similar to the treatment for forming the gate insulating layer 104. After that, the substrate 100 is carried into the treatment chamber 141 (loading 408 in FIG. 13).

Next, the surface of the gate insulating layer 104 is supplied with nitrogen. Here, by exposing the gate insulating layer 104 to an ammonia gas, the surface of the gate insulating layer 104 is supplied with nitrogen (flushing treatment 409 in FIG. 13). Further, hydrogen may be included in the ammonia gas. Furthermore, a nitrogen gas and a hydrogen gas may be used instead of the ammonia gas. In addition, the ammonia gas and the nitrogen gas may be used. Here, as an example, the pressure in the treatment chamber 141 is set to about 20 Pa to 30 Pa, the substrate temperature is set to 280° C., and the treatment time is set to 60 seconds. Further, after the flushing treatment, the amount of nitrogen in the treatment chamber may be controlled by controlling the pressure with reduction or increase of the pressure in the treatment chamber. Note that in the treatment of this step, only exposure to an ammonia gas is performed; however, plasma treatment may be performed. After that, these gases is exhausted and source gases used for forming a semiconductor layer 105 are introduced into the treatment chamber 141 (replacement of gases 410 in FIG. 13).

Next, the semiconductor layer 105 is formed over an entire surface of the gate insulating layer 104 which is supplied with nitrogen. In a later step, the semiconductor layer 105 is patterned into the semiconductor layer 106. First, the source gases used for depositing the semiconductor layer 105 are introduced into the treatment chamber 141. Here, as an example, a semiconductor layer with a thickness of about 50 nm is formed in such a manner that the source gases are introduced and stabilized, where the flow rate of $SiH_4$ is 10 sccm and the flow rate of $H_2$ is 1500 sccm, and plasma discharge of 50 W is performed, where the pressure in the treatment chamber 141 is 280 Pa and the temperature of the substrate is 280° C. After that, in a manner similar to that of the silicon nitride layer or the like described above, only introduction of $SiH_4$ is stopped, and after several seconds, plasma discharge is stopped (formation of a semiconductor layer 411 in FIG. 13). After that, these gases are exhausted and a gas used for depositing the buffer layer 107 is introduced (replacement of gases 412 in FIG. 7).

In the above example, in the source gases used for forming the semiconductor layer 105, the flow rate ratio of $H_2$ to $SiH_4$ is about 150:1. Therefore, silicon is deposited gradually.

The surface of the gate insulating layer 104 in this embodiment is supplied with nitrogen. As described above, nitrogen suppresses generation of silicon crystal nuclei. Therefore, at the early stage of formation of the film, a silicon crystal nucleus is not generated. The layer which is formed at the early stage of formation of the layer is the first region 106a illustrated in FIG. 2. Since the semiconductor layer 105 is formed under one condition, the first region 106a and the second region 106b are formed under the same conditions. As described above, the surface of the gate insulating layer 104 is supplied with nitrogen to form the semiconductor layer 105 on the surface, whereby a semiconductor layer including nitrogen (the first region 106a illustrated in FIG. 2) is formed. The semiconductor layer 105 is formed while the nitrogen concentration is reduced. When the nitrogen concentration is less than or equal to a constant value, crystal nuclei are generated. After that, the crystal nuclei grow, so that the crystal grains 121 are formed.

Next, the buffer layer 107 is formed over the entire surface of the semiconductor layer 105. In a later step, the buffer layer 107 is patterned into the buffer layer 108. Here, the buffer layer 107 is formed using an amorphous semiconductor. First, source gases used for depositing the buffer layer 107 are introduced into the treatment chamber 141. Here, as an example, a semiconductor layer with a thickness of about 150 nm is formed in such a manner that the source gases are introduced and stabilized, where the flow rate of $SiH_4$ is 280 sccm and the flow rate of $H_2$ is 300 sccm, and plasma discharge of 60 W is performed, where the pressure in the treatment chamber 141 is 170 Pa and the temperature of the substrate is 280° C. After that, in a manner similar to that of the silicon nitride layer or the like described above, only introduction of $SiH_4$ is stopped, and after several seconds, plasma discharge is stopped (formation of an a-Si layer 413 in FIG. 13). After that, these gases are exhausted and a gas used for depositing the semiconductor layer 109 including an impurity element imparting one conductivity type is introduced (replacement of gases 414 in FIG. 13).

Next, the impurity semiconductor layer 109 imparting one conductivity type is formed over an entire surface of the buffer layer 107. In a later step, the impurity semiconductor layer 109 imparting one conductivity type is patterned into the source and drain regions 110. First, source gases used for depositing the impurity semiconductor layer 109 imparting one conductivity type are introduced into the treatment chamber 141. Here, as an example, a semiconductor layer with a thickness of about 50 nm is formed in such a manner that the source gases are introduced and stabilized, where the flow rate of $SiH_4$ is 100 sccm and the flow rate of a mixed gas in which $PH_3$ is diluted with $H_2$ by 0.5 vol % is 170 sccm, and plasma discharge of 60 W is performed, where the pressure in the treatment chamber 141 is 280 Pa and the temperature of the substrate is 280° C. After that, in a manner similar to that of the silicon nitride layer or the like described above, only introduction of $SiH_4$ is stopped, and after several seconds, plasma discharge is stopped (formation of an impurity semiconductor layer 415 in FIG. 13). After that, these gases are exhausted (exhaust 416 in FIG. 13).

Figure 10A:
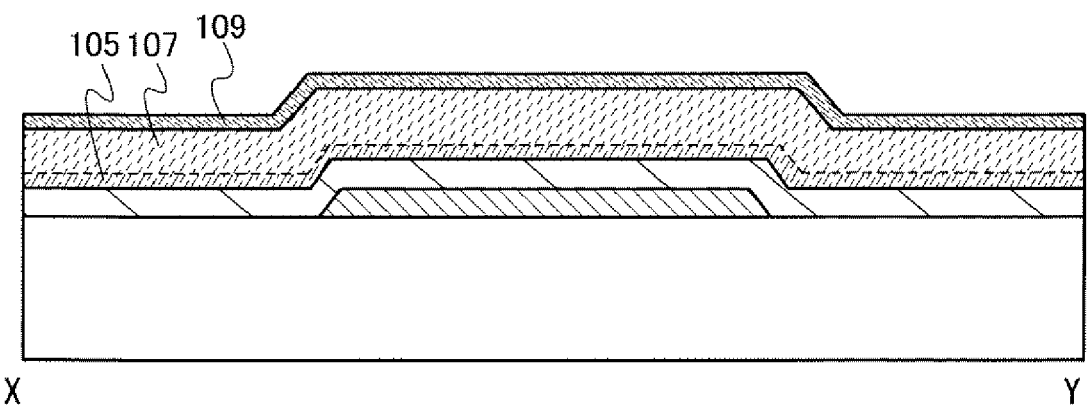
FIGS. 10A to 10C illustrate an example of a method for manufacturing a thin film transistor according to one embodiment of the present invention.

As described above, steps of forming components up to the impurity semiconductor layer 109 imparting one conductivity type can be performed (see FIG. 10A).

Next, a conductive layer 111 is formed over the impurity semiconductor layer 109 imparting one conductivity type.

The conductive layer 111 can be formed in a single layer or a stacked layer of aluminum, copper, titanium, neodymium, scandium, molybdenum, chromium, tantalum, tungsten, or the like. The conductive layer 111 may be formed using an aluminum alloy to which an element to prevent a hillock is added (for example, an aluminum-neodymium alloy or the like which can be used for the gate electrode layer 102). Alternatively, crystalline silicon to which an impurity element which serves as a donor is added may be used. The conductive layer 111 may have a stacked-layer structure in which a layer on the side which is in contact with the crystalline silicon to which an impurity element which serves as a donor is added is formed using titanium, tantalum, molybdenum, tungsten, or nitride of any of these elements and aluminum or an aluminum alloy is formed thereover. Further alternatively, the conductive layer 111 may have a stacked-layer structure in which an upper side and a lower side of aluminum or an aluminum alloy is sandwiched together with titanium, tantalum, molybdenum, tungsten, or nitride of any of these elements. For example, the conductive layer 111 preferably has a three-layer structure in which an aluminum layer is sandwiched between molybdenum layers.

The conductive layer 111 is formed by a CVD method, a sputtering method, or a vacuum evaporation method. Further, the conductive layer 111 may be formed by discharging a conductive nanopaste of silver, gold, copper, or the like by a screen printing method, an inkjet method, or the like and baking the conductive nanopaste.

Figure 10B:
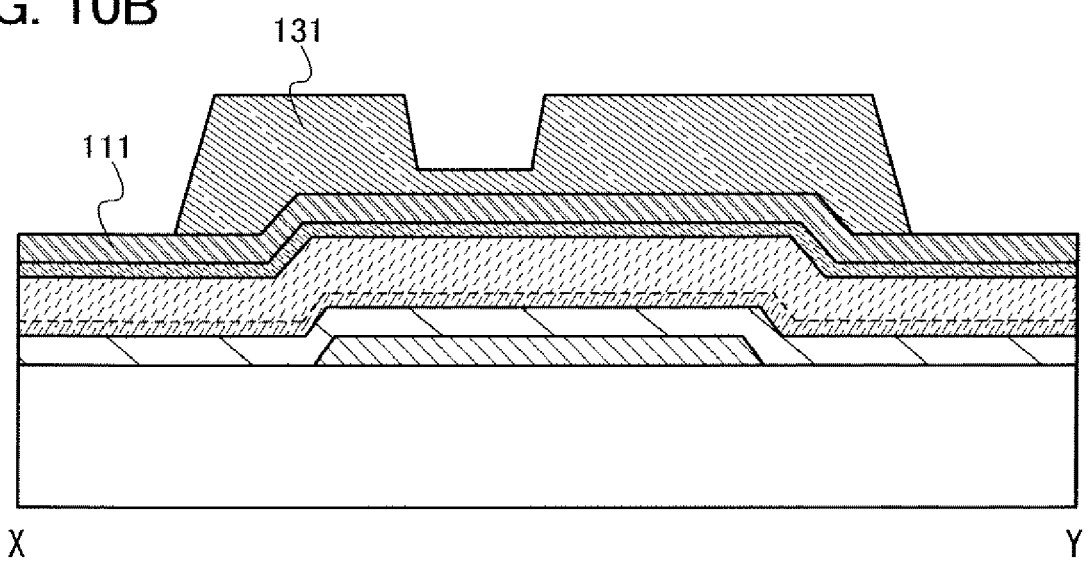

Next, a first resist mask 131 is formed over the conductive layer 111 (see FIG. 10B). The first resist mask 131 has two regions with different thicknesses and can be formed using a multi-tone mask. The multi-tone mask is used, so that the number of photomasks to be used and the number of manufacturing steps are reduced, which is preferable. In this embodiment, the resist mask formed using a multi-tone mask can be used in a step of forming a pattern of the semiconductor layer and a step of separating the semiconductor layer 109 into a source region and a drain region.

A multi-tone mask is a mask capable of light exposure with multi-level light intensity, and typically, light exposure is performed with three levels of light intensity to provide an exposed region, a half-exposed region, and an unexposed region. When using the multi-tone mask, one-time light exposure and development process allows a resist mask with plural thicknesses (typically, two levels of thicknesses) to be formed. Therefore, by the usage of a multi-tone mask, the number of photomasks can be reduced.

Figures 1, 14A:
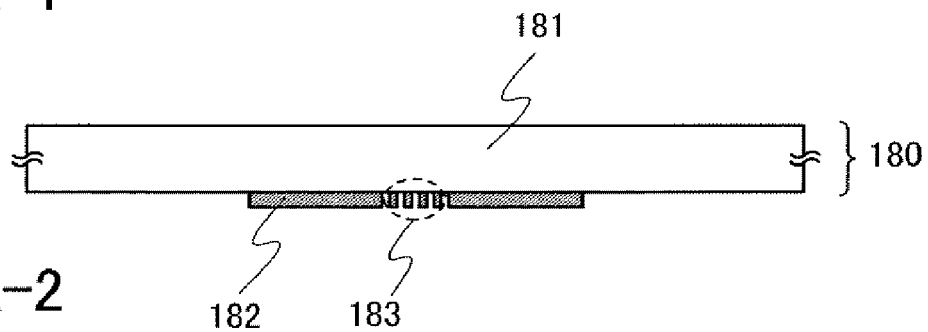
Figures 2, 14A:
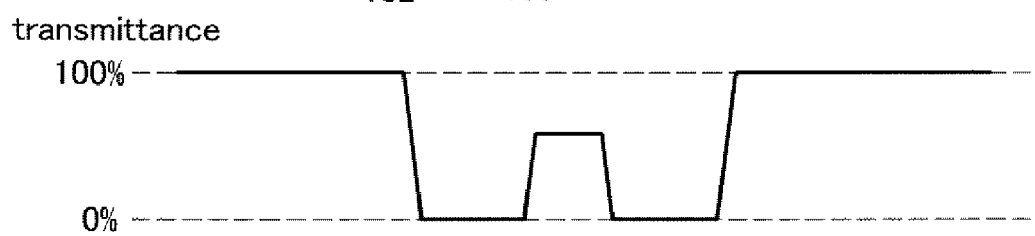
Figures 1, 14B:
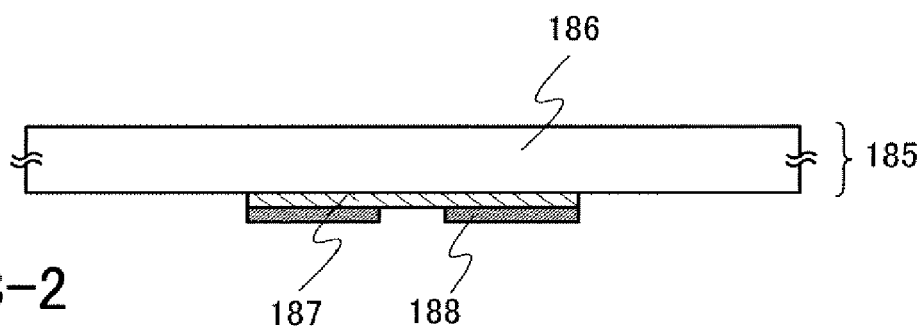
Figures 2, 14B:
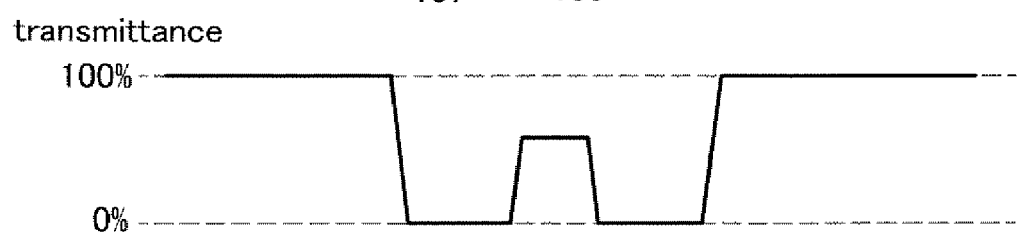

FIGS. 14A-1 and 14B-1 are cross-sectional views of typical multi-tone photomasks. FIG. 14A-1 illustrates a gray-tone mask 180 and FIG. 14B-1 illustrates a half-tone mask 185.

The gray-tone mask 180 illustrated in FIG. 14A-1 includes a light-shielding portion 182 formed using a light-shielding layer on a substrate 181 having a light-transmitting property, and a diffraction grating portion 183 provided with a pattern of the light-shielding layer.

The diffraction grating portion 183 has slits, dots, meshes, or the like that is provided at intervals which are less than or equal to the resolution limit of light used for the exposure, whereby the light transmittance can be controlled. Note that the slits, dots, or mesh provided at the diffraction grating portion 183 may be provided periodically or non-periodically.

For the substrate 181 having a light-transmitting property, a quartz substrate or the like can be used. The light-shielding layer for forming the light-shielding portion 182 and the diffraction grating portion 183 may be formed using chromium, chromium oxide, or the like is preferably used.

In the case where the gray-tone mask 180 is irradiated with light for light exposure, as illustrated in FIG. 14A-2, the transmittance in the region overlapping with the light-shielding portion 182 is 0%, and the transmittance in the region where both the light-shielding portion 182 and the diffraction grating portion 183 are not provided is 100%. Further, the transmittance at the diffraction grating portion 183 is basically in the range of 10% to 70%, which can be adjusted by the interval of slits, dots, or mesh of the diffraction grating, or the like.

The half-tone mask 185 illustrated in FIG. 14B-1 includes a semi-light-transmitting portion 187 which is formed over a substrate 186 having a light-transmitting property, using a semi-light-transmitting film, and a light-shielding portion 188 formed using a light-shielding layer.

The semi-light-transmitting portion 187 can be formed using a film of MoSiN, MoSi, MoSiO, MoSiON. CrSi, or the like. The light-shielding portion 188 may be formed using chromium, chromium oxide, or the like is preferably used in a manner similar to that of the light-shielding layer of the gray-tone mask In the ease where the half-tone mask 185 is irradiated with light for light exposure, as illustrated in FIG. 14B-2, the transmittance in the region overlapping with the light-shielding portion 188 is 0%, and the transmittance in the region where both the light-shielding portion 188 and the semi-light-transmitting portion 187 are not provided is 100%. Further, the transmittance in the semi-light-transmitting portion 187 is approximately in the range of 10% to 70%, which can be adjusted by the kind, the thickness, or the like of the material to be formed.

By light exposure using the multi-tone mask and development, a resist mask which includes regions having different thicknesses can be formed.

Figure 10C:
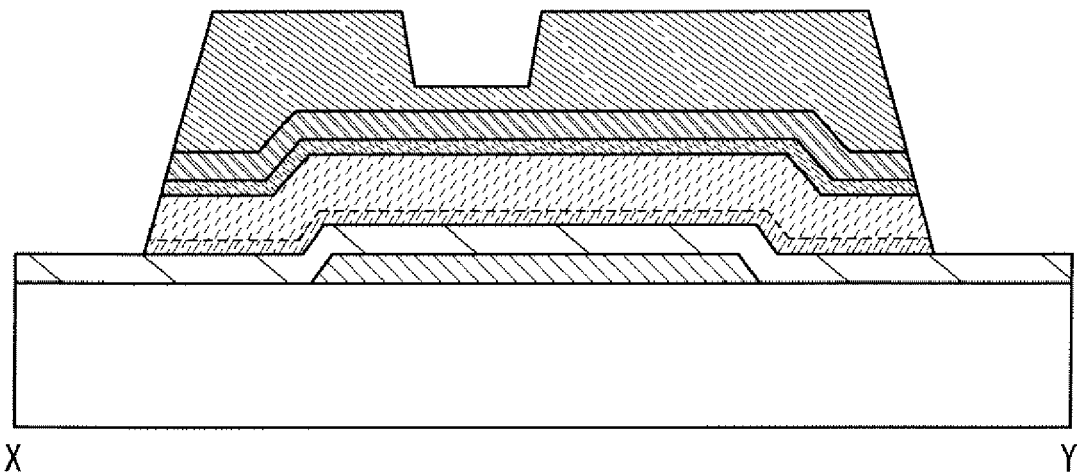

Next, with the use of the first resist mask 131, the semiconductor layer 105, the buffer layer 107, the impurity semiconductor layer 109 imparting one conductivity type, and the conductive layer 111 are etched. Through this step, the semiconductor layer 105, the buffer layer 107, the impurity semiconductor layer 109 imparting one conductivity type, and the conductive layer 111 are separated into each element (see FIG. 10C). After that, the first resist mask 131 is removed.

Here, the first resist mask 131 is made to recede to form a second resist mask 132. Ashing using oxygen plasma may be performed in order that the resist mask is made to recede.

Figure 11A:
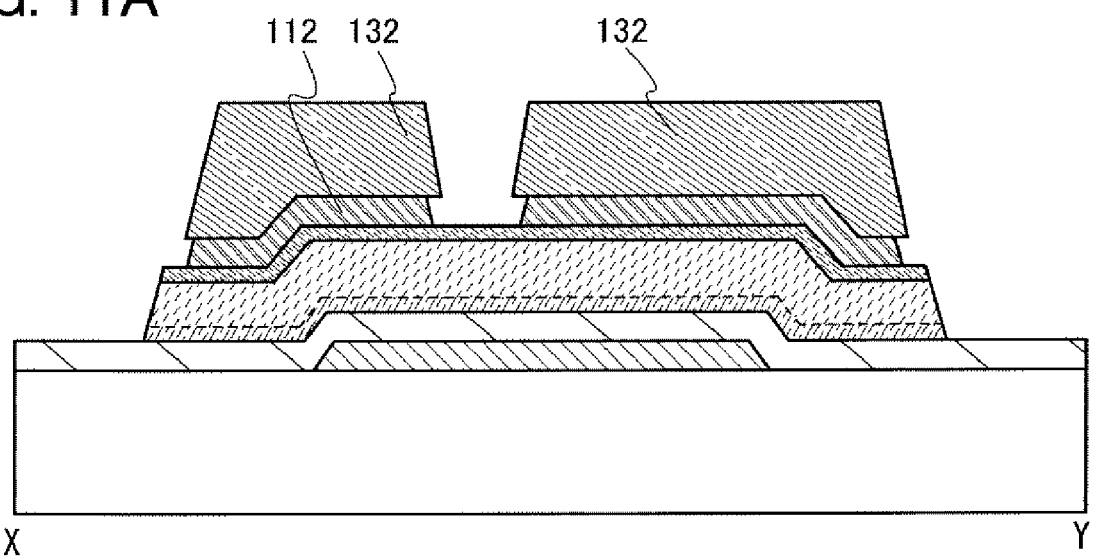
FIGS. 11A to 11C illustrate an example of a method for manufacturing a thin film transistor according to one embodiment of the present invention.

Next, with the use of the second resist mask 132, the conductive layer 111 is etched to form the wiring layers 112 (see FIG. 11A). The wiring layers 112 form the source electrode and the drain electrode. It is preferable that this etching of the conductive layer 111 be performed by wet etching. By wet etching, the conductive layer is selectively etched, a side surface of the conductive layer recedes to an inner side than that of the second resist mask 132, and thus the wiring layers 112 are formed. Accordingly, the side surfaces of the wiring layers 112 are not aligned with the side surfaces of the etched semiconductor layer 109 including an impurity element imparting one conductivity type, and the side surfaces of the source and drain regions 110 are formed outside of the side surfaces of the wiring layers 112. The wiring layers 112 serve not only as a source electrode and a drain electrode but also as a signal line. However, without limitation thereto, a signal line may be provided separately from the wiring layer 112.

Figure 11B:
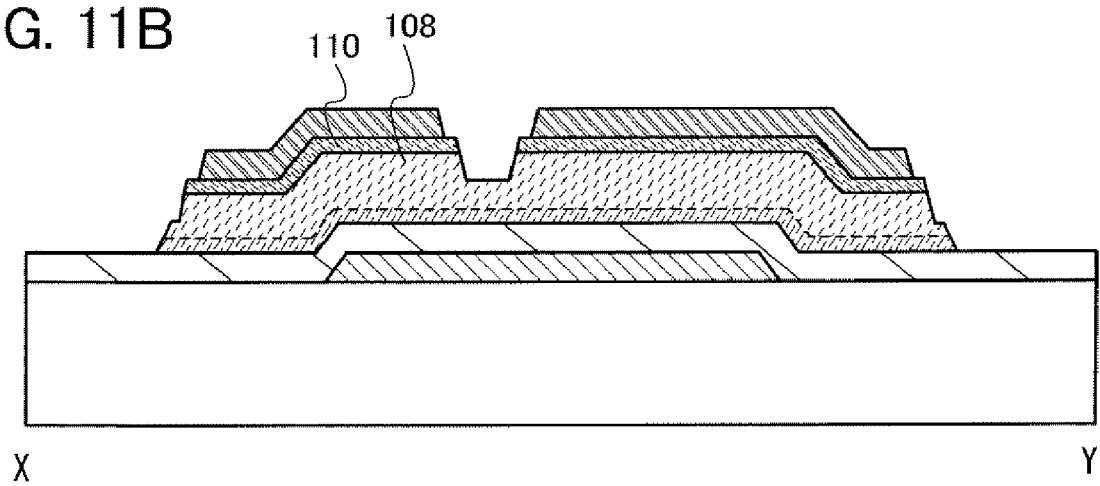

Next, in a state where the second resist mask 132 is formed, part of the buffer layer 107 and the impurity semiconductor layer 109 imparting one conductivity type are etched to form the buffer layer 108 and the source and drain regions 110 (see FIG. 11B).

Next, in a state where the second resist mask 132 is formed, dry etching is may be performed. Here, a condition of dry etching is set so that the exposed region of the buffer layer 108 is not damaged and the etching rate with respect to the buffer layer 108 can be low. In other words, a condition which gives almost no damages to the exposed surface of the buffer layer 108 and hardly reduces the thickness of the exposed region of the buffer layer 108 is applied. As an etching gas, a chlorine-based gas is used and typically, a $Cl_2$ gas or the like is used. There is no particular limitation on an etching method, and an ICP method, a CCP method, an ECR method, a reactive ion etching (RIE) method, or the like can be used.

An example of a condition of dry etching which can be used here is as follows: the flow rate of Cl2 gas is 100 sccm; the pressure in a chamber is 0.67 Pa; the temperature of the lower electrode is −10° C.; an RF power (13.56 MHz) of 2000 W is applied to the coil of the upper electrode to generate plasma; no power (that is, non-biased 0 W) is applied to the substrate 100 side; and thus etching is performed for 30 seconds. The temperature of the inner wall of the chamber is preferably approximately 80° C.

Next, in a state where the second resist mask 132 is formed, plasma treatment is preferably performed, whereby the second resist mask 132 may be removed. Here, as a typical example plasma treatment, water plasma treatment is given.

Water plasma treatment can be performed in such a manner that a gas including water typified by water vapor ($H_2O$ vapor) as its main component is introduced into a reaction space to generate plasma. The second resist mask 132 can be removed with water plasma. Further, when water plasma treatment is performed or water plasma treatment is performed after exposure to air, an oxide film is formed over the exposed buffer layer 108 in some cases.

Note that without the use of water plasma treatment, dry etching may be performed under such a condition that the exposed region of the buffer layer 108 is not damaged and an etching rate with respect to the buffer layer 108 is low.

As described above, after the pair of source and drain regions 110 are formed, dry etching is further performed under such a condition that the buffer layer 108 is not damaged, whereby an impurity element such as a residue existing on the exposed region of the buffer layer 108 can be removed. Further dry etching is performed and then water plasma treatment is sequentially performed, whereby the second resist mask 132 can also be removed. By water plasma treatment, insulation between the source region and the drain region can be secured, and thus, in a thin film transistor which is completed, the off current can be reduced, the on current can be increased, and variation in the electric characteristics can be reduced.

Note that order of steps of plasma treatment and the like are not limited thereto. After the second resist mask 132 is removed, etching with non-bias applied or plasma treatment may be performed.

Figure 11C:
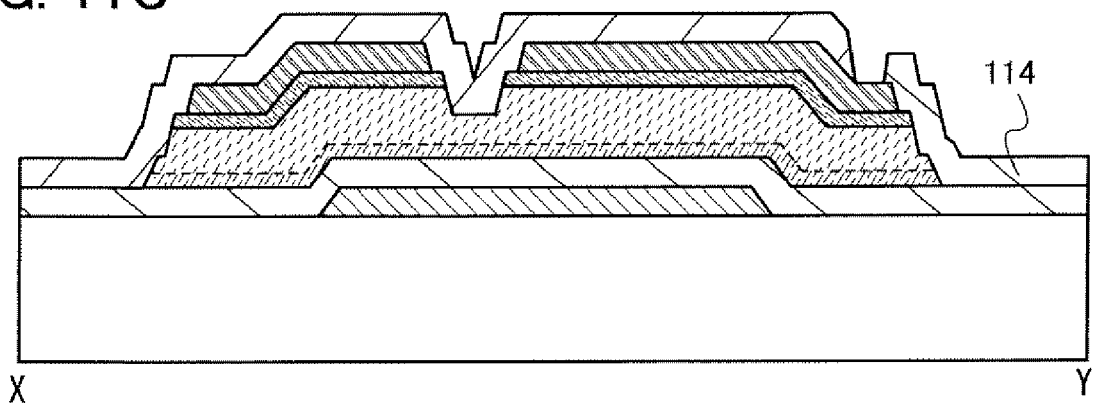

Through the aforementioned steps, a thin film transistor according to this embodiment can be manufactured (see FIG. 11B). The thin film transistor according to this embodiment can be applied to a switching transistor provided in a pixel of a display device typified by a liquid crystal display device. Therefore, the insulating layer 114 having an opening is formed so as to cover this thin film transistor and the pixel electrode layer 116 is formed so as to be connected to the source electrode or the drain electrode which is formed using the wiring layers 112 in the opening (see FIG. 11C). The opening can be formed by a photolithography method. After that, the pixel electrode layer 116 is formed over the insulating layer 114 so as to be connected through the opening. Thus, a switching transistor provided in the pixel of a display device, which is illustrated in FIG. 1, can be manufactured.

Note that the insulating layer 114 can be formed in a manner similar to that of the gate insulating layer 104. Silicon nitride is preferably used to form the dense insulating layer 114 such that entry of a contaminant impurity element such as an organic substance, a metal, or moisture floating in the atmosphere can be prevented.

Note that the pixel electrode layer 116 can be formed using a conductive composition including a conductive macromolecule (also referred to as a conductive polymer) having a light-transmitting property. The pixel electrode layer 116 preferably has a sheet resistance of less than or equal to 10000 $\Omega/cm^2$ and a light transmittance of greater than or equal to 70% at a wavelength of 550 nm. Further, the resistance of the conductive macromolecule included in the conductive composition is preferably less than or equal to 0.1 $\Omega \cdot cm$.

As a conductive macromolecule, a so-called $\pi$ electron conjugated conductive macromolecule can be used. For example, polyaniline and/or a derivative thereof, polypyrrole and/or a derivative thereof, polythiophene and/or a derivative thereof, and a copolymer of two or more kinds of those materials can be given.

The pixel electrode layer 116 can be formed using indium oxide including tungsten oxide, indium zinc oxide including tungsten oxide, indium oxide including titanium oxide, indium tin oxide including titanium oxide, indium tin oxide (hereinafter also referred to as ITO), indium zinc oxide, indium tin oxide to which silicon oxide is added, or the like.

The pixel electrode layer 116 may be etched by a photolithography method to be patterned in a manner similar to that of the wiring layer 112 or the like.

Note that although not illustrated, an insulating layer formed using an organic resin by a spin coating method or the like may be formed between the insulating layer 114 and the pixel electrode layer 116.

Thus, as described in this embodiment, a thin film transistor having high on current can be obtained.

Embodiment 2

In this embodiment, a method for the thin film transistor illustrated in FIG. 1, which is different from those of Embodiments 1, will be described. In this embodiment, a semiconductor layer including minute crystal grains and crystal grains each having an inversed-conic or inversed-pyramidal is formed in a manner similar to that of Embodiments 1. However, a method by which nitrogen is included in the semiconductor layer is different from that described in Embodiments 1.

In this embodiment, a gate insulating layer which is in contact with a semiconductor layer is formed using a silicon nitride layer, whereby a nitride concentration of the semiconductor layer is controlled and the semiconductor layer including minute crystal grains and crystal grains each having an inverted conical or inverted pyramidal shape is formed. A series of steps from a step of forming a gate insulating layer 104 to a step of forming an impurity semiconductor layer 109 imparting one conductivity type is described below with reference to FIG. 15.

Figure 15:
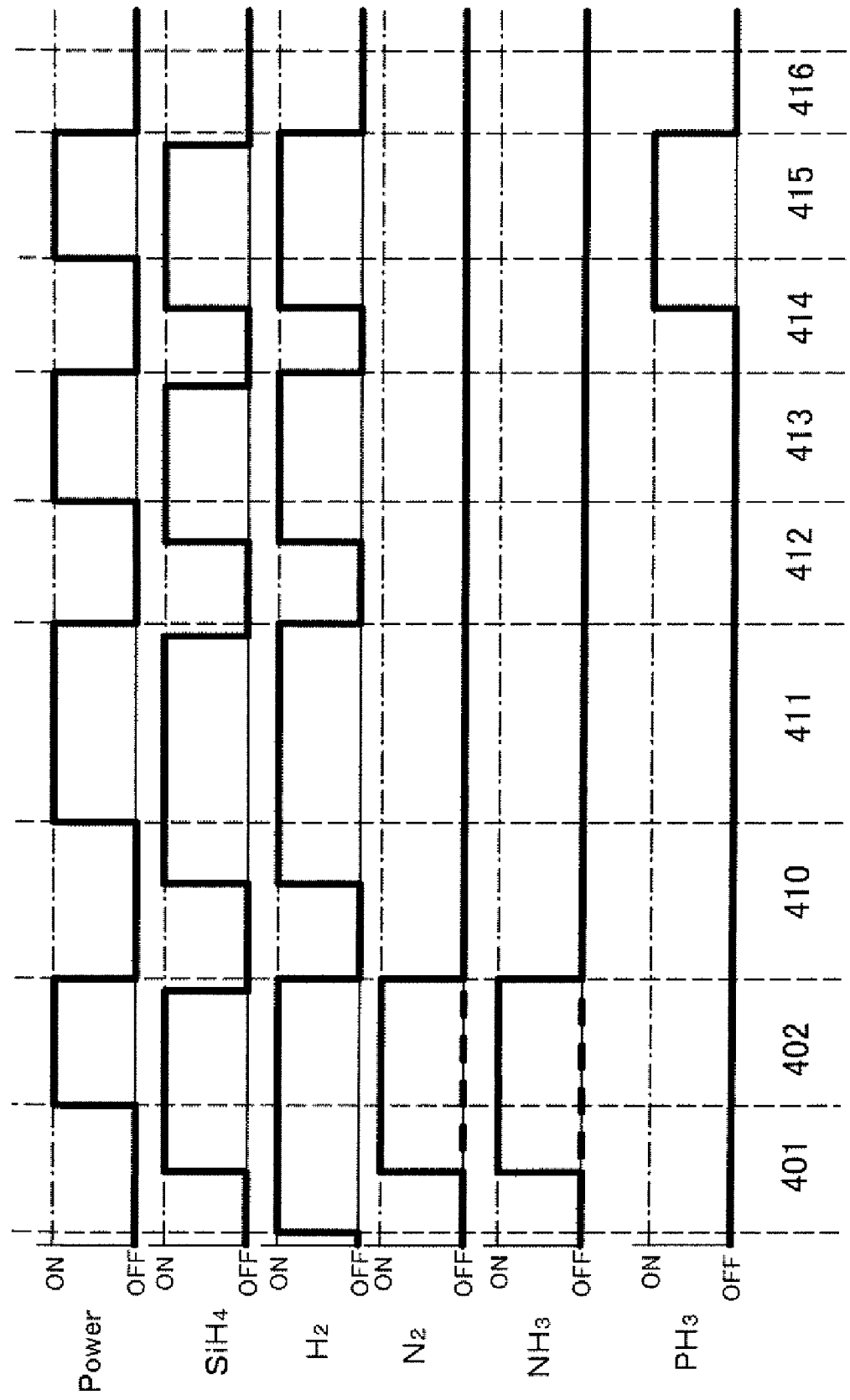
FIG. 15 illustrates an example of a method for manufacturing a thin film transistor according to one embodiment of the present invention.

First, a substrate over which a gate electrode layer 102 has been formed is heated in the treatment chamber of the CVD apparatus and source gases used for forming a silicon nitride layer is introduced into the treatment chamber (pretreatment 401 in FIG. 15). Here, as an example, a silicon nitride layer with a thickness of approximately 300 nm is formed in such a manner that the source gases are introduced and stabilized, where the flow rate of $SiH_4$ is 40 sccm, the flow rate of $H_2$ is 1500 sccm, the flow rate of $N_2$ is 550 sccm, and the flow rate of $NH_3$ is 140 sccm, and plasma discharge of 370 W is performed, where the pressure in the treatment chamber is 100 Pa and the temperature of the substrate is 280° C. After that only application of $SiH_4$ is stopped, and after several seconds, plasma discharge is stopped (formation of SiN 402 in FIG. 15). Note that in the formation of SiN 402, as a source gas used for deposition of silicon nitride, at least either $N_2$ or $NH_3$ is used.

Figure 16:
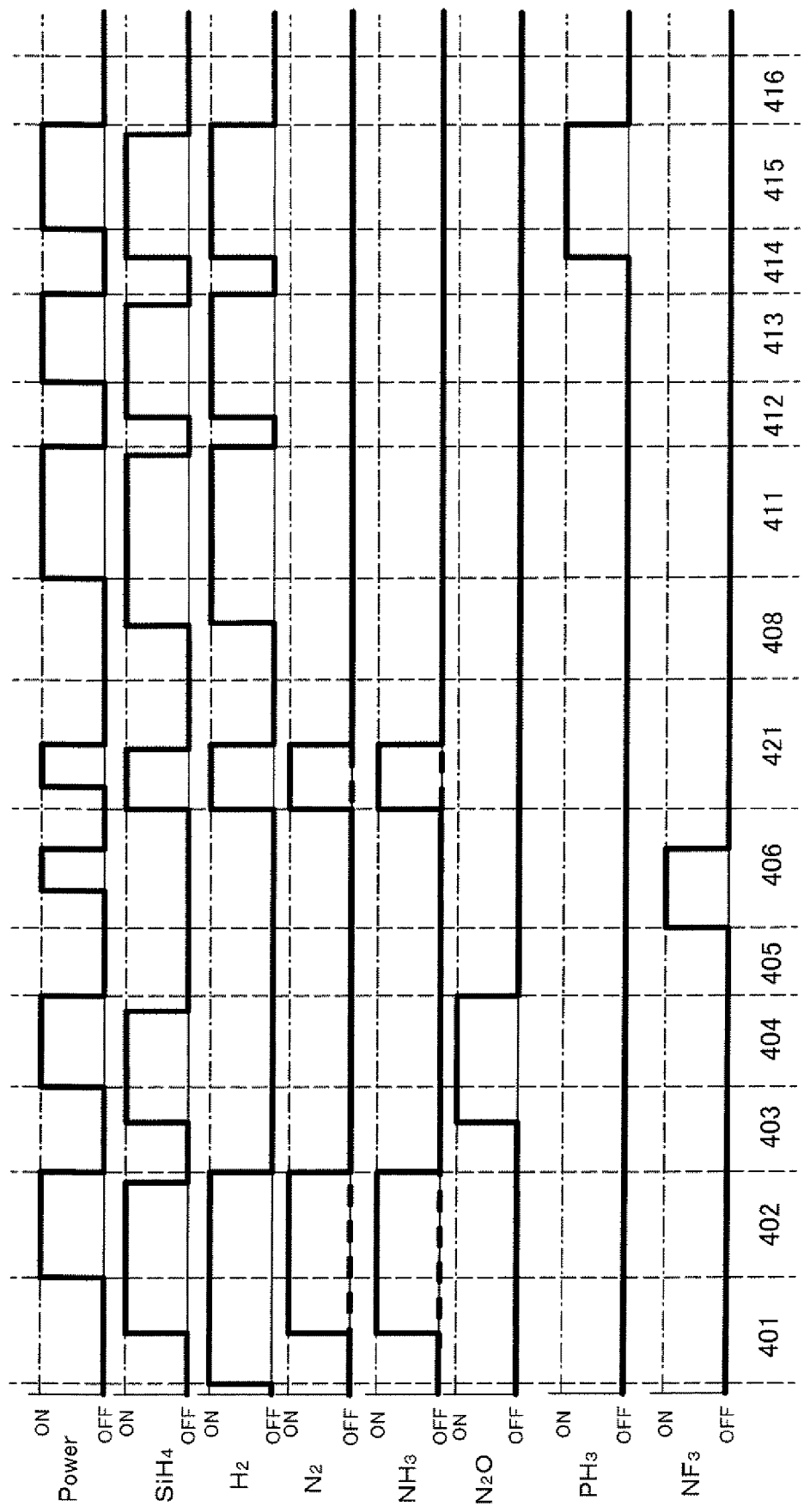
FIG. 16 illustrate s an example of a method for manufacturing a thin film transistor according to one embodiment of the present invention.

Next, the source gases used for forming the silicon nitride layer are exhausted and source gases used for deposition of a semiconductor layer are introduced into the treatment chamber (displacement of gases 410 in FIG. 16).

Next, the semiconductor layer 105 is formed over the entire surface of the gate insulating layer 104. The semiconductor layer 105 is patterned to be the semiconductor layer 106 in a later step. First, the source gases used for deposition of the semiconductor layer 105 are introduced into the treatment chamber. Here, as an example, a semiconductor layer with a thickness of about 50 nm is formed in such a manner that the source gases are introduced and stabilized, where the flow rate of $SiH_4$ is 10 sccm and the flow rate of $H_2$ is 1500 sccm, and plasma discharge of 50 W is performed, where the pressure in the treatment chamber is 280 Pa and the temperature of the substrate is 280° C. After that, in a manner similar to that of the silicon nitride film or the like described above, only application of $SiH_4$ is stopped, and after several seconds, plasma discharge is stopped (formation of a semiconductor layer 411 in FIG. 15). After that, these gases are exhausted and a gas used for forming the buffer layer 107 is introduced (displacement of gases 412 in FIG. 15).

In the above example, in the source gases used for forming the semiconductor layer 105, the flow ratio of $H_2$ to that of $SiH_4$ is 150:1, and thus silicon is deposited gradually.

Since at least the uppermost layer of the gate insulating layer 104, which is in contact with the semiconductor layer 105, is formed using silicon nitride in this embodiment, a large amount of nitrogen exists on the surface of the gate insulating layer 104. As described above, nitrogen suppresses generation of silicon crystal nuclei. Therefore, at the early stage of deposition of the layer, a crystal nucleus of silicon is not generated. The layer which is formed at the early stage of deposition of the layer is the first region 106a illustrated in FIG. 2. Since the semiconductor layer 105 is formed under one condition, the first region 106a and the second region 106b are formed under the same condition. As described above, the surface of the gate insulating layer 104 is supplied with nitrogen to form the semiconductor layer 105 on the surface, whereby a semiconductor layer including nitrogen (the first region 106a illustrated in FIG. 2) is formed. The semiconductor layer 105 is formed while the nitrogen concentration is reduced. When the nitrogen concentration is less than or equal to a constant value, crystal nuclei are generated. After that, the crystal nuclei grow, so that the crystal grains 121 are formed and the semiconductor layer 105 is formed. That is, the semiconductor layer including nitrogen (the first region 106a illustrated in FIG. 2) is formed. Note that here, in a generation position of the crystal nucleus, from which the crystal grains 121 start to grow, the nitrogen concentration measured by secondary ion mass spectrometry is greater than or equal to $1 \times 10^{20}$ cm$^{-3}$ and less than or equal to $1 \times 10^{21}$ cm$^{-1}$, preferably greater than or equal to $2 \times 10^{20}$ cm$^{-3}$ and less than or equal to $7 \times 10^{20}$ cm$^{-3}$.

Note that, as an impurity element suppressing generation of a crystal nucleus, an impurity element which does not generate a carrier trap in silicon (for example, nitrogen) is selected. On the other hand, the concentration of an impurity element which reduces the coordination number of silicon and generates a dangling bond is reduced (for example, oxygen). Accordingly, an oxygen concentration is preferably reduced without reduction of the nitrogen concentration. In particular, the oxygen concentration measured by secondary ion mass spectrometry is preferably set to less than or equal to $5 \times 10^{18}$ cm$^{-3}$.

Next, the buffer layer 107 is formed over the entire surface of the semiconductor layer 105. The buffer layer 107 is patterned to be the buffer layer 108 in a later step. Here, the buffer layer 107 is formed using an amorphous semiconductor. First, source gases used for forming the buffer layer 107 are introduced into the treatment chamber. Here, as an example, a semiconductor layer with a thickness of about 150 nm is formed in such a manner that the source gases are introduced and stabilized, where the flow rate of $SiH_4$ is 280 sccm and the flow rate of $H_2$ is 300 sccm, and plasma discharge of 60 W is performed, where the pressure in the treatment chamber is 170 Pa and the temperature of the substrate is 280° C. After that, in a manner similar to that of the silicon nitride film or the like described above, only application of $SiH_4$ is stopped, and after several seconds, plasma discharge is stopped (formation of an a-Si layer 413 in FIG. 15). After that, these gases are exhausted and a gas used for deposition of the impurity semiconductor layer 109 imparting one conductivity type is introduced (displacement of gases 414 in FIG. 15).

Next, the impurity semiconductor layer 109 imparting one conductivity type is formed over the entire surface of the buffer layer 107. The impurity semiconductor layer 109 imparting one conductivity type is patterned to be the source and drain regions 110 in a later step. First, source gases used for deposition of the impurity semiconductor layer 109 imparting one conductivity type are introduced into the treatment chamber. Here, as an example, a semiconductor layer with a thickness of about 50 nm is formed in such a manner that the source gases are introduced and stabilized, where the flow rate of $SiH_4$ is 100 sccm and the flow rate of a mixed gas in which $PH_3$ is diluted with $H_2$ by 0.5 vol is 170 sccm, and plasma discharge of 60 W is performed, where the pressure in the treatment chamber is 280 Pa and the temperature of the substrate is 280° C. After that, in a manner similar to that of the silicon nitride layer or the like described above, only introduction of $SiH_4$ is stopped, and after several seconds, plasma discharge is stopped (formation of an impurity semiconductor layer 415 in FIG. 15). After that, these gases are exhausted (exhaustion 416 in FIG. 16)

As described above, the gate insulating layer which is in contact with at least the semiconductor layer using silicon nitride, whereby the oxygen concentration can be suppressed low and the nitrogen concentration can be made higher than the oxygen concentration, and thus the semiconductor layer including inverted conical or inverted pyramidal crystal grains can be formed.

Embodiment 3

In this embodiment, a method for manufacturing the thin film transistor illustrated in FIG. 1, which is different from those of Embodiment 1 and Embodiment 2, will be described. In this embodiment, a semiconductor layer including minute crystal grains and inverted conical or inverted pyramidal grains is formed in a manner similar to those of Embodiment 1 and Embodiment 2. However, a method by which nitrogen is included in the semiconductor layer is different from those in Embodiment 1 and Embodiment 2.

In this embodiment, the inside of a treatment chamber is cleaned before deposition of a semiconductor layer. Then, an inner wall of the chamber is covered with a silicon nitride layer, whereby the semiconductor layer includes nitrogen and the oxygen concentration is suppressed low, so that the nitrogen concentration is made higher than the oxygen concentration. A series of steps from a step of forming a gate insulating layer 104 to a step of forming an impurity semiconductor layer 109 imparting one conductivity type are described below with reference to FIG. 16.

First, a substrate over which a gate electrode layer 102 has been formed is heated in the treatment chamber of the CVD apparatus and source gases used for deposition of a silicon nitride layer is introduced into the treatment chamber (pretreatment 401 in FIG. 16). Here, as an example, a silicon nitride layer with a thickness of approximately 110 nm is formed in such a manner that the source gases are introduced and stabilized, where the flow rate of $SiH_4$ is 40 sccm, the flow rate of $H_2$ is 500 sccm, and the flow rate of $NH_3$ is 140 sccm, and plasma discharge of 370 W is performed, where the pressure in the treatment chamber is 100 Pa and the temperature of the substrate is 280° C. After that, only introduction of $SiH_4$ is stopped, and after several seconds, plasma discharge is stopped (formation of SiN 402 in FIG. 16). Note that in the formation of SiN 402, as a source gas used for deposition of silicon nitride, at least either $N_2$ or $NH_3$ is used.

Next, the source gases used for deposition of the silicon nitride layer is exhausted and source gases used for deposition of a silicon oxynitride layer is introduced into the treatment chamber (a gas displacement 403 in FIG. 16). Here, as an example, a silicon oxynitride layer with a thickness of approximately 110 nm is formed in such a manner that the source gases are introduced and stabilized, where the flow rate of $SiH_4$ is 30 sccm, and the flow rate of $N_2O$ is 1200 sccm, and plasma discharge of 50 W is performed, where the pressure in the treatment chamber is 40 Pa and the temperature of the substrate is 280° C. After that, in a manner similar to that of the silicon nitride layer, only introduction of $SiH_4$ is stopped, and after several seconds, discharge of plasma is stopped (formation of SiON 404 in FIG. 16).

Through the aforementioned steps the gate insulating layer 104 can be formed. After formation of the gate insulating layer 104, the substrate 100 is carried out of the treatment chamber 141 (unloading 405 in FIG. 16).

After the substrate 100 is carried out of the treatment chamber 141, a $NF_3$ gas is introduced into the treatment chamber to clean the inside of the treatment chamber (cleaning treatment 406 in FIG. 16). After that, treatment for formation of a silicon nitride layer is performed in a manner similar to that of the gate insulating layer 104 (precoating treatment 421 in FIG. 16). With this treatment, the silicon nitride layer is formed on an inner wall of the treatment chamber 141. After that, the substrate 100 is carried into the treatment chamber 141 and a source gas used for deposition of a semiconductor layer 105 is introduced into the treatment chamber (load 408 in FIG. 16). Note that in the precoating treatment 421, as a source gas used for deposition of the silicon nitride layer, at least either of $N_2$ or $NH_3$ may be used.

Next, the semiconductor layer 105 is formed over the entire surface of the gate insulating layer 104. The semiconductor layer 105 is patterned to be the semiconductor layer 106 in a later step. First, the source gases used for forming the semiconductor layer 105 are introduced into the treatment chamber. Here, as an example, a semiconductor layer with a thickness of about 50 nm is formed in such a manner that the source gases are introduced and stabilized, where the flow rate of $SiH_4$ is 10 sccm and the flow rate of $H_2$ is 1500 sccm, and plasma discharge of 50 W is performed, where the pressure in the treatment chamber is 280 Pa and the temperature of the substrate is 280° C. After that, in a manner similar to that of the silicon nitride film or the like described above, only introduction of $SiH_4$ is stopped, and after several seconds, plasma discharge is stopped (formation of a semiconductor layer 411 in FIG. 16). After that, these gases are exhausted and a gas used for forming the buffer layer 107 is introduced (displacement of gases 412 in FIG. 16).

In the above example, in the source gases used for forming the semiconductor layer 105, the flow ratio of $H_2$ to that of $SiH_4$ is 150:1, and thus silicon is deposited gradually.

In this embodiment, since the silicon nitride layer is formed on the inner wall of the treatment chamber as a protective layer, the protective layer is exposed to plasma, whereby nitrogen is included in the semiconductor layer 105. As described above, nitrogen suppresses generation of a crystal nucleus of silicon. Therefore, at the early stage of deposition of the layer, a crystal nucleus of silicon is not generated. A layer which is formed at the early stage of deposition corresponds to the first region 106a illustrated in FIG. 2. The first region 106a and a first region 106b are formed under the same condition. As described above, since plasma includes nitrogen which is to be included in the protective layer, the semiconductor layer 105 is formed by the plasma reaction, whereby a semiconductor layer including the minute crystal grains and nitrogen (the first region 106a illustrated in FIG. 2) is formed. The semiconductor layer is formed while the nitrogen concentration is reduced. When the nitrogen concentration is less than or equal to a constant value, a crystal nucleus is generated. After that, the crystal nucleus grows, so that the crystal grain 121 is formed.

Next, the buffer layer 107 is formed over the entire surface of the semiconductor layer 105. The buffer layer 107 is patterned to be the buffer layer 108 in a later step. Here, the buffer layer 107 is formed using an amorphous semiconductor. First, source gases used for forming the buffer layer 107 are introduced into the treatment chamber. Here, as an example, a semiconductor layer with a thickness of approximately 150 nm is formed in such a manner that the source gases are introduced and stabilized, where the flow rate of $SiH_4$ is 280 sccm and the flow rate of $H_2$ is 300 sccm, and plasma discharge of 60 W is performed, where the pressure in the treatment chamber is 170 Pa and the temperature of the substrate is 280° C. After that in a manner similar to that of the silicon nitride film or the like described above, only introduction of $SiH_4$ is stopped, and after several seconds, plasma discharge is stopped (formation of an a-Si layer 413 in FIG. 16). After that, these gases are exhausted and a gas used for deposition of the impurity semiconductor layer 109 imparting one conductivity type is introduced (displacement of gases 414 in FIG. 16)

Next, the impurity semiconductor layer 109 imparting one conductivity type is formed over the entire surface of the buffer layer 107. The impurity semiconductor layer 109 imparting one conductivity type is patterned to be the source and drain regions 110 in a later step. First, source gases used for deposition of the impurity semiconductor layer 109 imparting one conductivity type are introduced into the treatment chamber. Here, as an example, an impurity semiconductor layer imparting one conductivity type with a thickness of about 50 nm is formed in such a manner that the source gases are introduced and stabilized, where the flow rate of $SiH_4$ is 100 sccm and the flow rate of a mixed gas in which $PH_3$ is diluted with $H_2$ by 0.5 vol is 170 sccm, and plasma discharge of 60 W is performed, where the pressure in the treatment chamber is 280 Pa and the temperature of the substrate is 280° C. After that, in a manner similar to that of the silicon nitride layer or the like described above, only introduction of $SiH_4$ is stopped, and after several seconds, plasma discharge is stopped (formation of an impurity semiconductor layer 415 in FIG. 16). After that, these gases are exhausted (exhaustion 416 in FIG. 16).

As described above, the inner wall of the treatment chamber is covered with a silicon nitride layer at least right before formation of the semiconductor layer, whereby the oxygen concentration can be suppressed low and the nitrogen concentration can be made higher than the oxygen concentration, and thus the semiconductor layer including inverted conical or inverted pyramidal crystal grains can be formed.

Further, by coating the inner of the treatment chamber with the silicon nitride layer, whereby an element or the like included in the inner wall of the treatment chamber is prevented from being mixed into the semiconductor layer.

Note that in the aforementioned description, after formation of the gate insulating layer 104, the cleaning treatment and the precoating treatment are performed because the gate insulating is formed by stacking the silicon oxynitride layer over the silicon nitride layer; however, this embodiment may be performed in combination with Embodiment 2. That is, the gate insulating layer 104 is formed using the silicon nitride layer and formation of the gate insulating layer 104 may be combined with the precoating treatment. By combining formation of the gate insulating layer 104 with the precoating treatment, the steps can be simplified and throughput can be improved.

Embodiment 4

In this embodiment, a method for manufacturing a semiconductor device, which is different from those of Embodiments 1 to 3, will be described. In this embodiment, a semiconductor layer including minute grains and crystal grains each having an inverted conical or inverted pyramidal shape is formed in a manner similar to that of Embodiment 1. However, a method by which nitrogen is included in the semiconductor layer is different from those described in Embodiments 1.

In this embodiment, nitrogen is mixed into a gas used in an early stage of deposition of the semiconductor layer whereby the oxygen concentration is suppressed low and the nitrogen concentration is made higher than the oxygen concentration. A series of steps from a step of forming a gate insulating layer 104 to a step of forming an impurity semiconductor layer 109 imparting one conductivity type will be described hereinafter with reference to FIG. 17.

Figure 17:
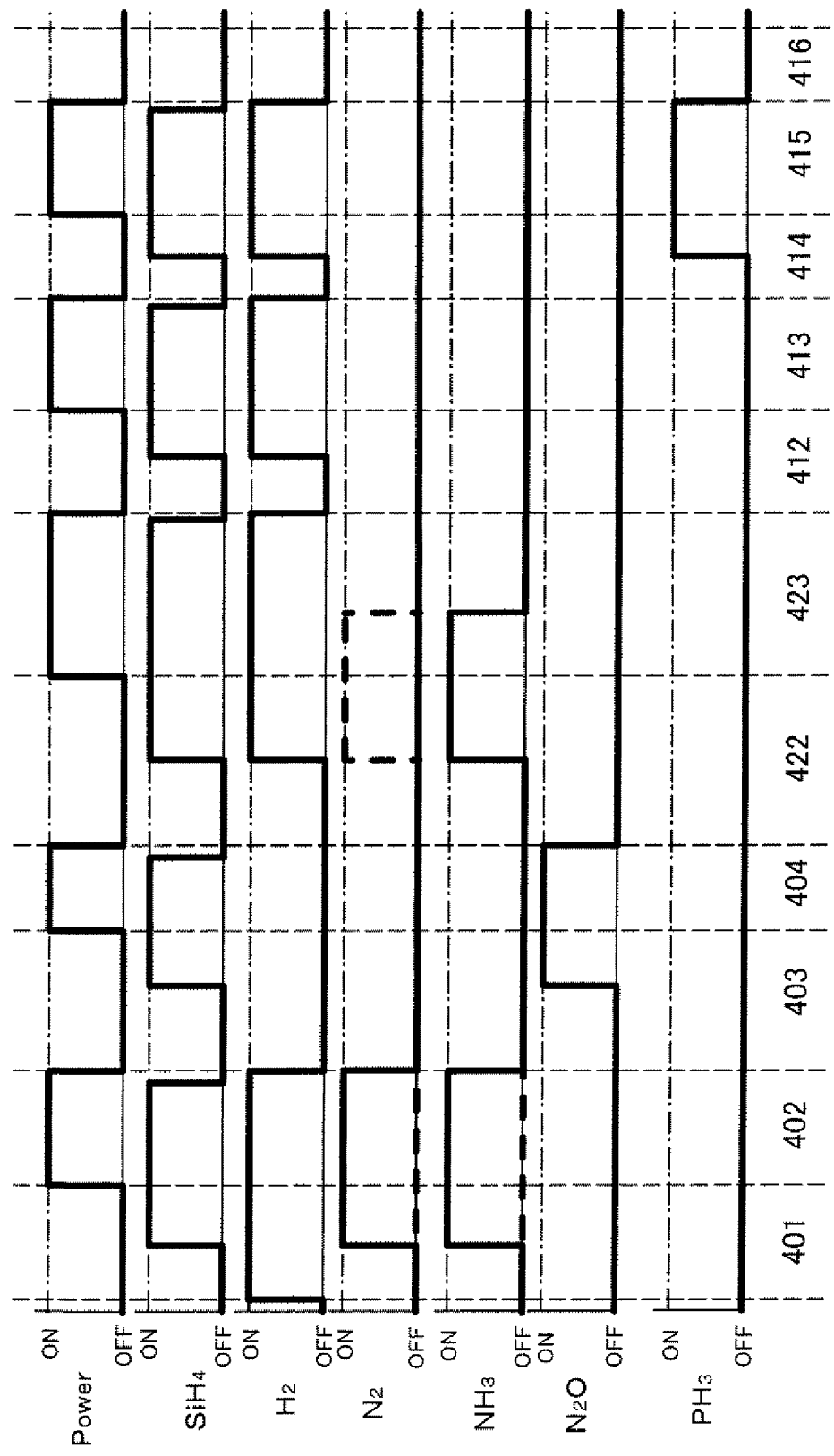
FIG. 17 illustrate s an example of a method for manufacturing a thin film transistor according to one embodiment of the present invention.

First, a substrate over which a gate electrode layer 102 has been formed is heated in the treatment chamber of the CVD apparatus and source gases used for forming a silicon nitride layer is introduced into the treatment chamber (pretreatment 401 in FIG. 17). Here, as an example, a silicon nitride layer with a thickness of approximately 110 nm is formed in such a manner that the source gases are introduced and stabilized, where the flow rate of $SiH_4$ is 40 sccm, the flow rate of $H_2$ is 500 sccm, the flow rate of $N_2$ is 550 sccm, and the flow rate of $NH_3$ is 140 sccm, and plasma discharge of 370 W is performed, where the pressure in the treatment chamber is 100 Pa and the temperature of the substrate is 280° C. After that, only introduction of $SiH_4$ is stopped, and after several seconds, plasma discharge is stopped (formation of a SiN 402 in FIG. 17). Note that in the formation of SiN 402, as a source gas used for deposition of silicon nitride, at least either $N_2$ or $NH_3$ is used.

Next, the source gases used for deposition of the silicon nitride layer is exhausted and the source gas used for deposition of a silicon oxynitride layer is introduced into the treatment chamber (a gas displacement 403 in FIG. 17). Here, as an example, a silicon oxynitride layer with a thickness of approximately 110 nm is formed in such a manner that the source gases are introduced and stabilized, where the flow rate of $SiH_4$ is 30 sccm, and the flow rate of $N_2O$ is 1200 sccm, and plasma discharge of 50 W is performed, where the pressure in the treatment chamber is 40 Pa and the temperature of the substrate is 280° C. After that, in a manner similar to that of the silicon nitride layer, only introduction of $SiH_4$ is stopped, and after several seconds, discharge of plasma is stopped (formation of SiON 404 in FIG. 17). After that, these gases are exhausted and a gas used for deposition of a semiconductor layer 105 is introduced (displacement of gases 422 in FIG. 17).

Next, the semiconductor layer 105 is formed over the entire surface of the gate insulating layer 104. The semiconductor layer 105 is patterned to be the semiconductor layer 106 in a later step. Here, as an example, a microcrystalline semiconductor layer with a thickness of approximately 50 nm is formed in such a manner that source gases are introduced and stabilized, where the flow rate of $SiH_4$ is 10 sccm, the flow rate of $H_2$ is 1200 sccm, and the flow rate of $NH_3$ of 100 ppm (diluted with H2) is 300 sccm; plasma discharge of 50 W is performed, where the pressure in the treatment chamber is 280 Pa and the temperature OF the substrate is 280° C.; and after that only the flow rate of $NH_3$ of 100 ppm (diluted with $H_2$) is 0 sccm to grow the semiconductor layer. After that, in a manner similar to that of the silicon nitride film or the like described above, only introduction of $SiH_4$ is stopped, and after several seconds, plasma discharge is stopped (formation of a semiconductor layer 423 in FIG. 17). Note that $N_2$ may be used instead of $NH_3$. After that, these gases are exhausted and a gas used for forming the buffer layer 107 is introduced (displacement of gases 412 in FIG. 17).

In the above example, in the source gases used for forming the semiconductor layer 105, the flow ratio of $H_2$ to that of $SiH_4$ is 150:1, and thus silicon is deposited gradually.

Nitrogen is included in the gas used in an early stage of deposition of the semiconductor layer 105 in this embodiment. As described above, nitrogen suppresses generation of a crystal nucleus of silicon. Therefore, at the early stage of formation of the layer a crystal nucleus of silicon is not generated. A layer which is formed at the early stage of deposition of the layer corresponds to the first region 106a illustrated in FIG. 2. Since the semiconductor layer 105 is formed under one condition, the first region 106a and the second region 106b are formed under the same condition. As described above, the surface of the gate insulating layer 104 is supplied with nitrogen to form the semiconductor layer 105 on the surface, whereby a semiconductor layer including minute crystal gains and nitrogen (the first region 106a illustrated in FIG. 2) is formed. The semiconductor layer is formed while the nitrogen concentration is reduced. When the nitrogen concentration is less than or equal to a constant value, a crystal nucleus is generated. After that, the crystal nucleus grows, so that the crystal grain 121 is formed. That is, nitrogen and the impurity semiconductor layer imparting one conductivity type (the second region 106b illustrated in FIG. 2).

Next, the buffer layer 107 is formed over the entire surface of the semiconductor layer 105. The buffer layer 107 is patterned to be the buffer layer 108 in a later step. Here, the buffer layer 107 is formed using an amorphous semiconductor. First, source gases used for forming the buffer layer 107 are introduced into the treatment chamber. Here, as an example, a semiconductor layer with a thickness of approximately 150 nm is formed in such a manner that the source gases are introduced and stabilized, where the flow rate of $SiH_4$ is 280 sccm and the flow rate of $H_2$ is 300 sccm, and plasma discharge of 60 W is performed, where the pressure in the treatment chamber is 170 Pa and the temperature of the substrate is 280° C. After that, in a manner similar to that of the silicon nitride film or the like described above, only application of $SiH_4$ is stopped, and after several seconds, plasma discharge is stopped (formation of an a-Si layer 413 in FIG. 17). After that, these gases are exhausted and a gas used for deposition of the impurity semiconductor layer 109 imparting one conductivity type is introduced (displacement of gases 414 in FIG. 17).

Next, the impurity semiconductor layer 109 imparting one conductivity type is formed over the entire surface of the buffer layer 107. The impurity semiconductor layer 109 imparting one conductivity type is patterned to be the source and drain regions 110 in a later step. First, source gases used for deposition of the impurity semiconductor layer 109 imparting one conductivity type are introduced into the treatment chamber. Here, as an example, a semiconductor layer with a thickness of about 50 nm is formed in such a manner that the source gases are introduced and stabilized, where the flow rate of $SiH_4$ is 100 sccm and the flow rate of a mixed gas in which $PH_3$ is diluted with $H_2$ by 0.5 vol is 170 sccm, and plasma discharge of 60 W is performed, where the pressure in the treatment chamber is 280 Pa and the temperature of the substrate is 280° C. After that, in a manner similar to that of the silicon nitride layer or the like described above, only introduction of $SiH_4$ is stopped, and after several seconds, plasma discharge is stopped (formation of an impurity semiconductor layer 415 in FIG. 17). After that, these gases are exhausted (exhaustion 416 in FIG. 17).

As described above, nitrogen is included in the gas used at the early stage of deposition of the semiconductor layer, whereby the oxygen concentration can be suppressed low and the concentration of nitrogen can be made higher than the oxygen concentration, and thus the semiconductor layer including inverted conical or inverted pyramidal crystal grains can be formed.

Embodiment 5

In this embodiment, an example of a mode of a thin film transistor will be described with reference to the drawings. In this embodiment, a thin film transistor is formed without using a multi-tone mask.

Figure 18A:
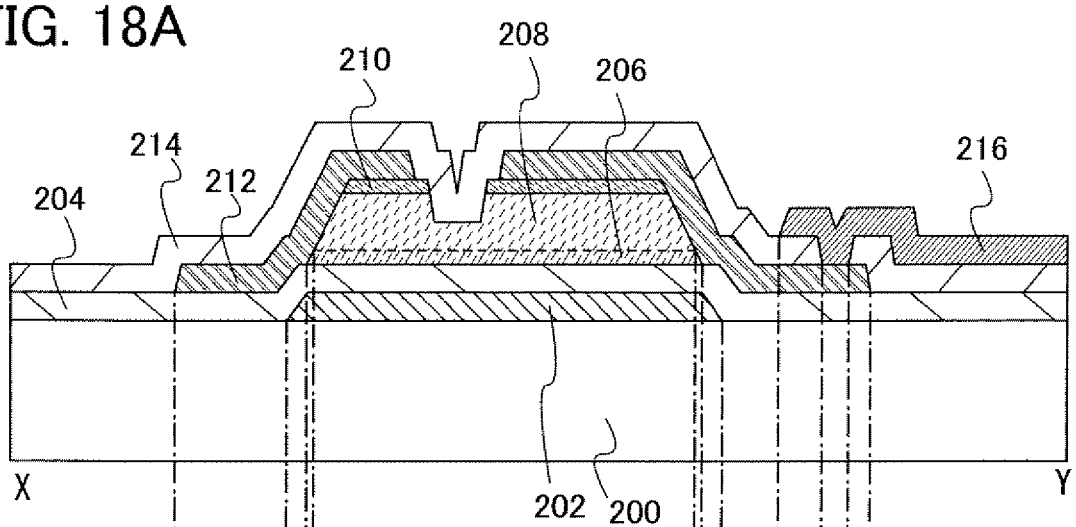
FIGS. 18A and 18B illustrate one example of a thin film transistor according to one embodiment of the present invention.
Figure 18B:
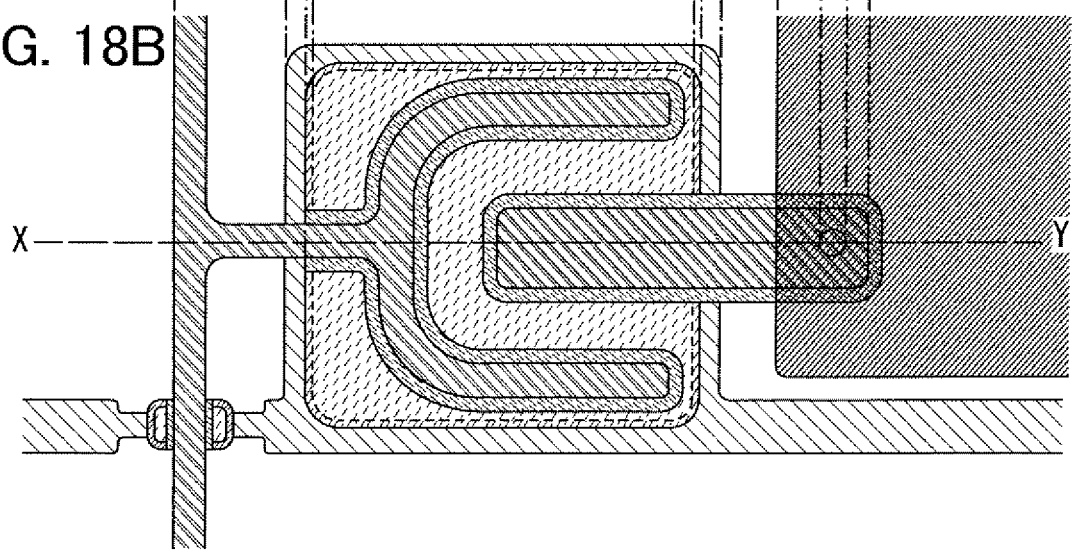

FIGS. 18A and 18B illustrate a top view and a cross-sectional view of a thin film transistor according to this embodiment. The thin film transistor illustrated in FIG. 18A includes a gate electrode layer 202 over a substrate 200, a gate insulating layer 204 covering the gate electrode layer 202, a semiconductor layer 206 provided over and in contact with the gate insulating layer 204, and a buffer layer 208 provided over and in contact with the semiconductor layer 206. The thin film transistor includes the source and drain regions 210 provided over and in contact with part of the buffer layer 208, and a wiring layer 212 provided over and in contact with the gate insulating layer 204 and the source and drain regions 210. The wiring layer 212 forms source and drain electrodes. In addition, an insulating layer 214 which functions as a protective film is included over the wiring layer 212. Moreover, each layer is patterned into a desired shape.

Note that the thin film transistor illustrated in FIGS. 18A and 18B can be applied to a pixel transistor provided in a pixel portion of a liquid crystal display device, in a manner similar to that of the thin film transistor illustrated in FIG. 1. Therefore, in the example which is illustrated in FIGS. 18A and 18B, an opening is provided in the insulating layer 214 and a pixel electrode layer 216 is provided over the insulating layer 214, so that the pixel electrode layer 216 and the wiring layer 212 are connected to each other.

In addition, one of the source and drain electrodes is formed so as to have a U shape (a reversed C shape) and surrounds the other of the source and drain electrodes. The distance between the source electrode and the drain electrode is kept almost constant (see FIG. 18B).

The thin film transistor has the above shape, whereby the channel width of the thin film transistor can be increased and thus the amount of current is increased. In addition, variation in electric characteristics can be reduced. Further, reduction in reliability due to misalignment of a mask pattern in a manufacturing process can be suppressed. However, the present invention is not limited thereto, and one of the source and drain electrodes does not necessarily have a U shape.

The semiconductor layer 206 in this embodiment has features similar to those of the semiconductor layer 106 in Embodiment 1, and can be formed using a material and by a method which are similar to those of the semiconductor layer 106. Alternatively, the semiconductor layer 206 may be formed as described in Embodiments 2 to 4. Thus, detailed description on formation of the semiconductor layer 206 will be omitted in this embodiment.

Next, a method for manufacturing the thin film transistor illustrated in FIG. 18 is described. An n-channel thin film transistor has higher carrier mobility than a p-channel thin film transistor. It is preferable that all thin film transistors formed over the same substrate have the same polarity because the number of manufacturing steps can be reduced. Therefore, in this embodiment, a method for manufacturing an n-channel thin film transistor is described.

Figure 19A:
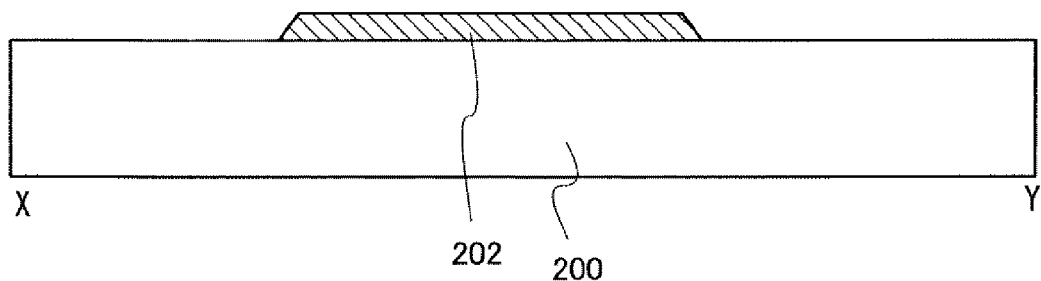
FIGS. 19A to 19C illustrate an example of a method for manufacturing a thin film transistor according to one embodiment of the present invention.

First, the gate electrode layer 202 is formed over the substrate 200 (see FIG. 19A).

As the substrate 200, a substrate similar to the substrate 100 in Embodiment 1 can be used.

The gate electrode layer 202 can be formed using a material and by a method which are similar to those of the gate electrode layer 102 in Embodiment 1.

Figure 19B:
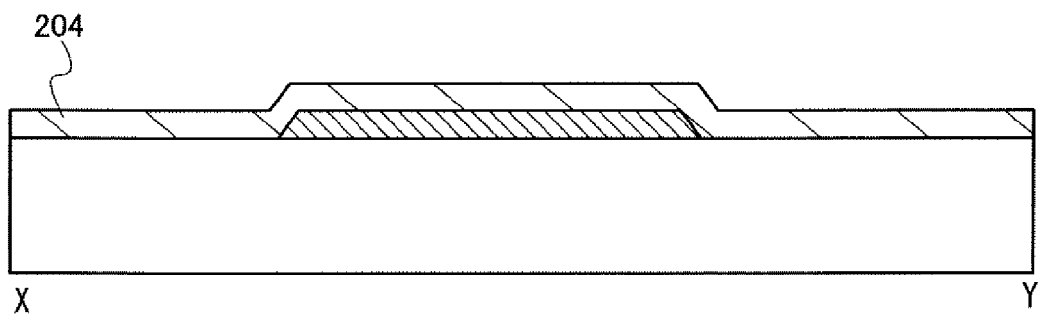

Next, the gate insulating layer 204 is formed so as to cover the gate electrode layer 202 (see FIG. 19B). The gate insulating layer 204 can be formed using a material and by a method which are similar to those of the gate insulating layer 104 in Embodiment 1.

Figure 19C:
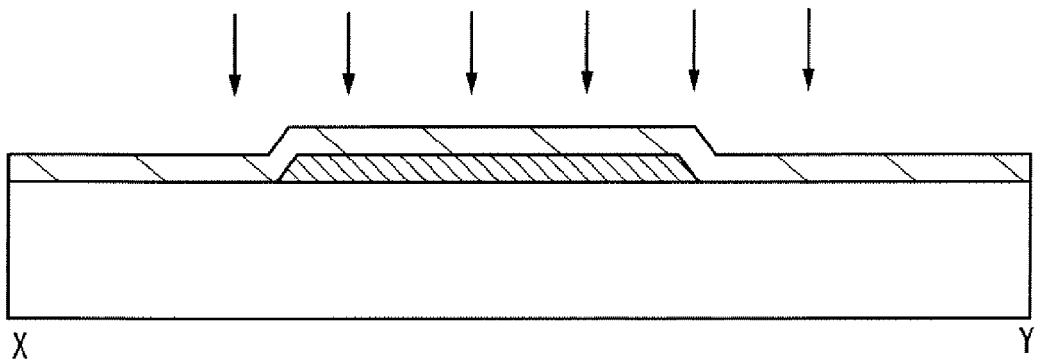

Here, treatment for supplying nitrogen may be performed on the gate insulating layer 204 (see FIG. 19C). As the treatment for supplying nitrogen, treatment of exposing the gate insulating layer 204 to an ammonia gas, which is described in Embodiment 1, can be given as an example.

Figure 20A:
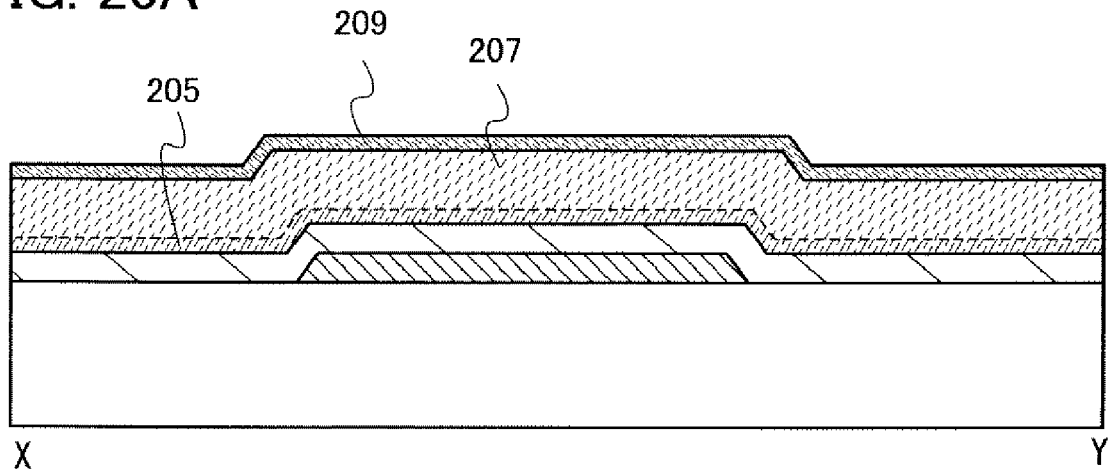
FIGS. 20A to 20C illustrate an example of a method for manufacturing a thin film transistor according to one embodiment of the present invention.
Figure 20B:
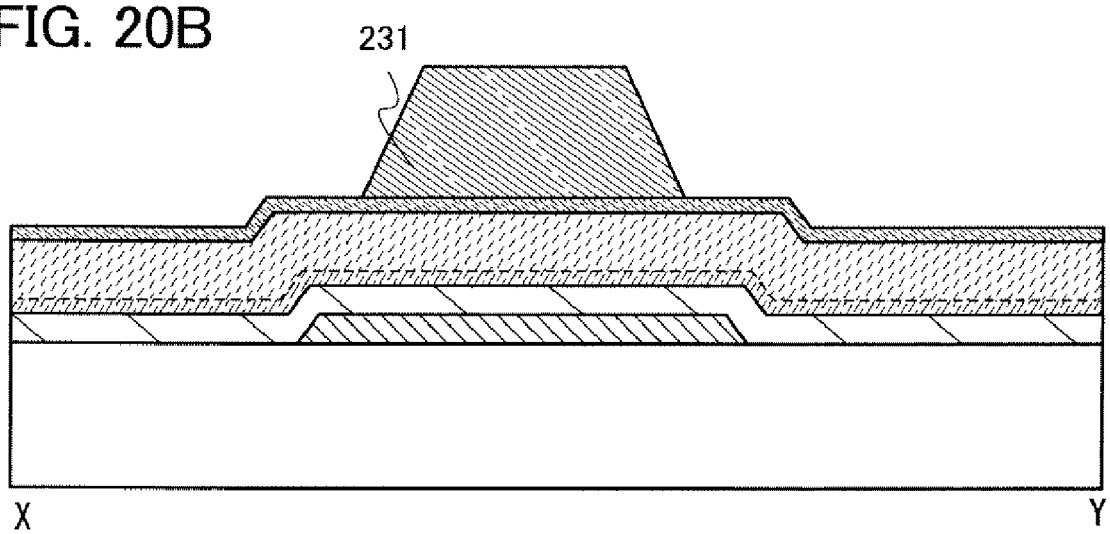

Next, a semiconductor layer 205, a buffer layer 207, and an impurity semiconductor layer 209 imparting one conductivity type are formed over the gate insulating layer 204 (see FIG. 20A). After that, a first resist mask 231 is formed over the impurity semiconductor layer 209 imparting one conductivity type (see FIG. 20B).

The semiconductor layer 205 can be formed in a manner similar to that of the semiconductor layer 105 in Embodiment 1. The buffer layer 207 can be formed in a manner similar to that of the buffer layer 107 in Embodiment 1. The impurity semiconductor layer 209 imparting one conductivity type can be formed in a manner similar to that of the impurity semiconductor layer 109 imparting one conductivity type in Embodiment 1.

Note that the semiconductor layer 205 may be formed by any of the methods described in Embodiments 2 to 4.

Figure 20C:
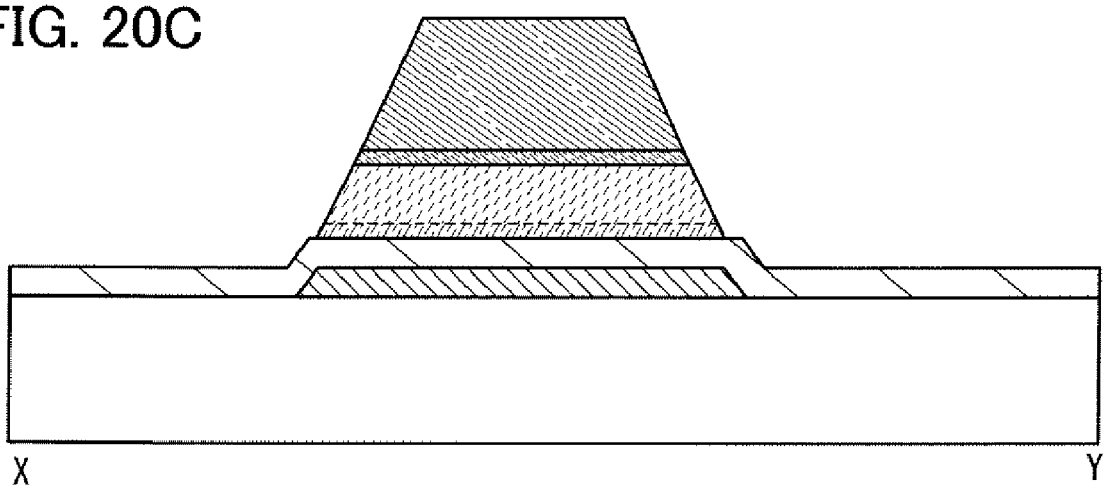
Figure 21A:
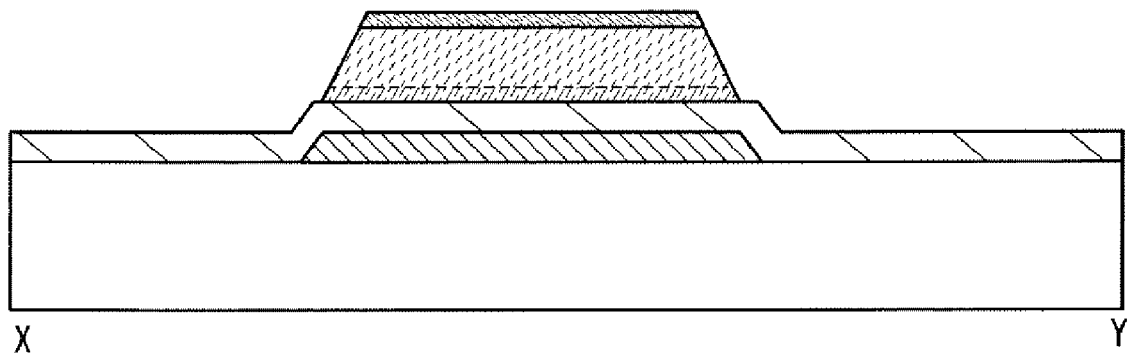
FIGS. 21A to 21C illustrate an example of a method for manufacturing a thin film transistor according to one embodiment of the present invention.

Next, the buffer layer 207 and the impurity semiconductor layer 209 imparting one conductivity type are etched using the first resist mask 231 to form an island-like semiconductor layer (see FIG. 20C). After that, the first resist mask 231 is removed (see FIG. 21A).

Figure 21B:
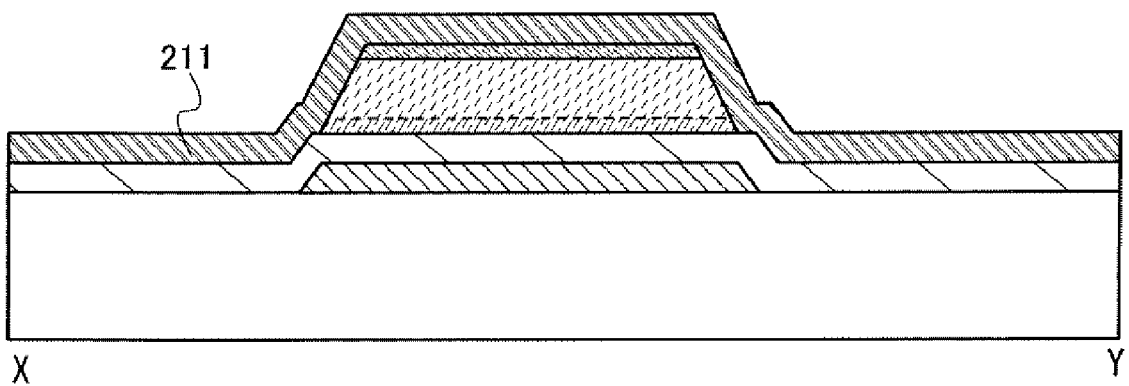
Figure 21C:
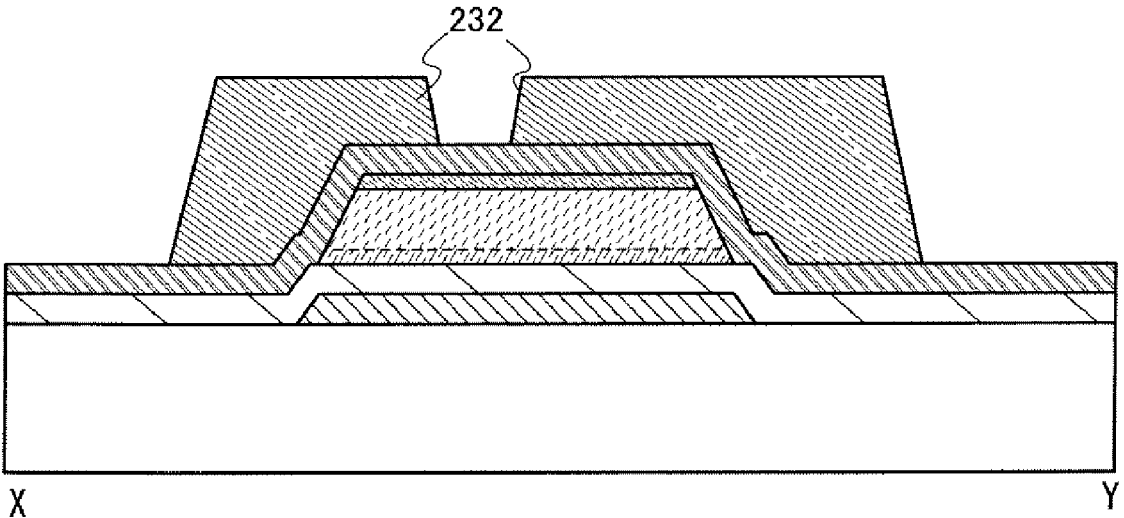

Next, a conductive layer 211 is formed so as to cover the etched semiconductor layer 205, the buffer layer 207, and the impurity semiconductor layer 209 imparting one conductivity type (see FIG. 21B). The conductive layer 211 can be formed using a material and by a method which are similar to those of the conductive layer 111. After that, a second resist mask 232 is formed over the conductive layer 211 (see FIG. 21C).

Figure 22A:
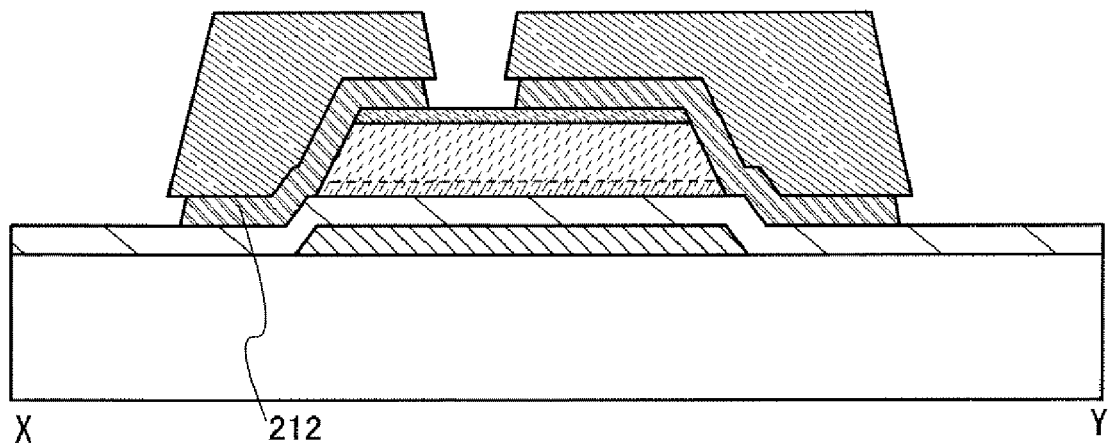
FIGS. 22A to 22C illustrate an example of a method for manufacturing a thin film transistor according to one embodiment of the present invention.

Next, the conductive layer 211 is etched using the second resist mask 232 to form a wiring layer 212 (see FIG. 22A). The wiring layer 212 forms source and drain electrodes. The etching of the conductive layer 211 is preferably performed by wet etching. By wet etching, the conductive layer is selectively etched. As a result, the conductive layer is recessed inward than the second resist mask 232, and the wiring layer 212 is formed. Thus, the side surfaces of the wiring layer 212 are not aligned with the side surfaces of the etched impurity semiconductor layer 209 imparting one conductivity type, and the side surfaces of the source and drain regions are formed outside of the side surfaces of the wiring layer 212. The wiring layer 212 functions not only as source and drain electrodes but also as a signal line. However, without limitation thereto, a signal line may be provided separately from the wiring layer 212.

Figure 22B:
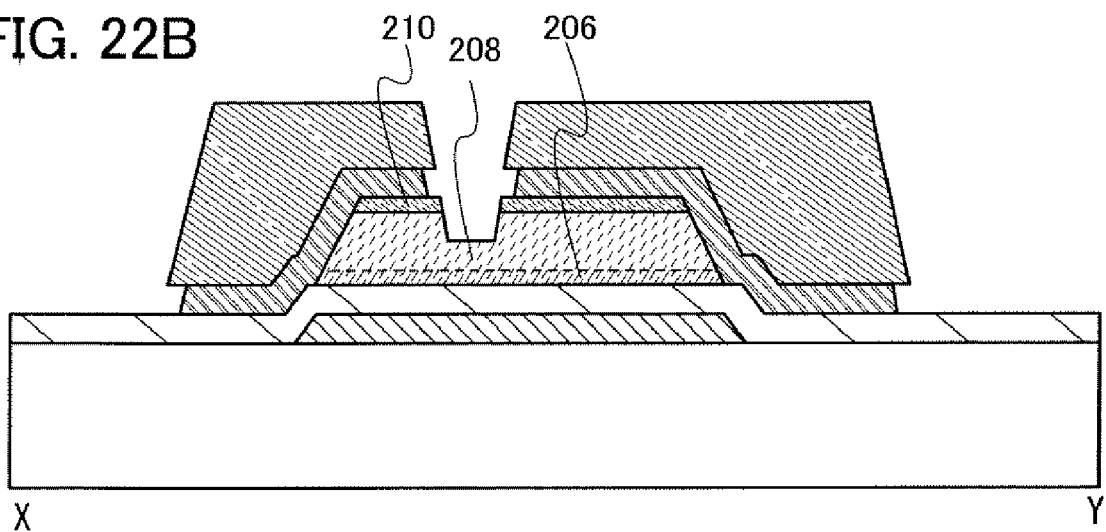
Figure 22C:
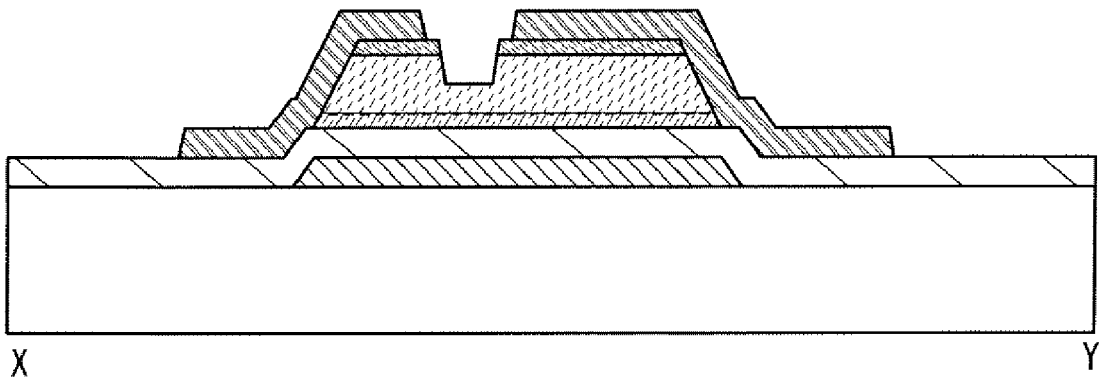

Next, the impurity semiconductor layer 209 imparting one conductivity type and a part of the upper portion of the buffer layer 207 of the island-like semiconductor layer and are etched using the second resist mask 232 (see FIG. 22B). The semiconductor layer 206, the buffer layer 208, and the source and drain regions 210 are formed up to here.

Then, dry etching may be performed under such a condition that the buffer layer 208 is not damaged and the etching rate with respect to the buffer layer 208 is low, with the second resist mask 232 formed in a manner similar to that of Embodiment 1. Furthermore, the second resist mask 232 may be removed by water plasma treatment.

The thin film transistor according to this embodiment can be manufactured through the above steps. The thin film transistor according to this embodiment can be applied to a switching transistor provided for a pixel of a display device which is typified by a liquid crystal display device, in a manner similar to that of the thin film transistor described in Embodiment 1. Therefore, the insulating layer 214 is formed so as to cover this thin film transistor. An opening is formed in the insulating layer 214 so as to reach the source and drain electrodes which are formed of the wiring layer 212. This opening can be formed by a photolithography method. After that, when the pixel electrode layer 216 is formed over the insulating layer 214 so as to be connected through the opening, the switching transistor provided for a pixel of a display device, which is illustrated in FIG. 12, can be manufactured.

Note that the insulating layer 214 can be formed in a manner similar to that of the insulating layer 114 in Embodiment 1. In addition, the pixel electrode layer 216 can be formed in a manner similar to that of the pixel electrode layer 116 in Embodiment 1.

Although not illustrated, an insulating layer formed using an organic resin film by a spin coating method or the like may be formed between the insulating layer 214 and the pixel electrode layer 216.

A thin film transistor having a high on current and a low off state current can be obtained as described above in this embodiment without a multi-tone mask.

Embodiment 6

In this embodiment, a liquid crystal display device including the thin film transistor described in Embodiment 5 will be described below as one mode of a display device. Here, a vertical alignment (VA) mode liquid crystal display device is described with reference to FIGS. 23 to 25. The VA liquid crystal display device is a kind of mode in which alignment of liquid crystal molecules of a liquid crystal panel is controlled. The VA liquid crystal display device is a mode in which liquid crystal molecules are vertical to a panel surface when voltage is not applied. In this embodiment, it is devised to particularly separate pixels into some regions (sub-pixels) so that molecules are aligned in different directions in the respective regions. This is referred to as multi-domain or multi-domain design. In the following description, a liquid crystal display device with multi-domain design is described.

Figure 23:
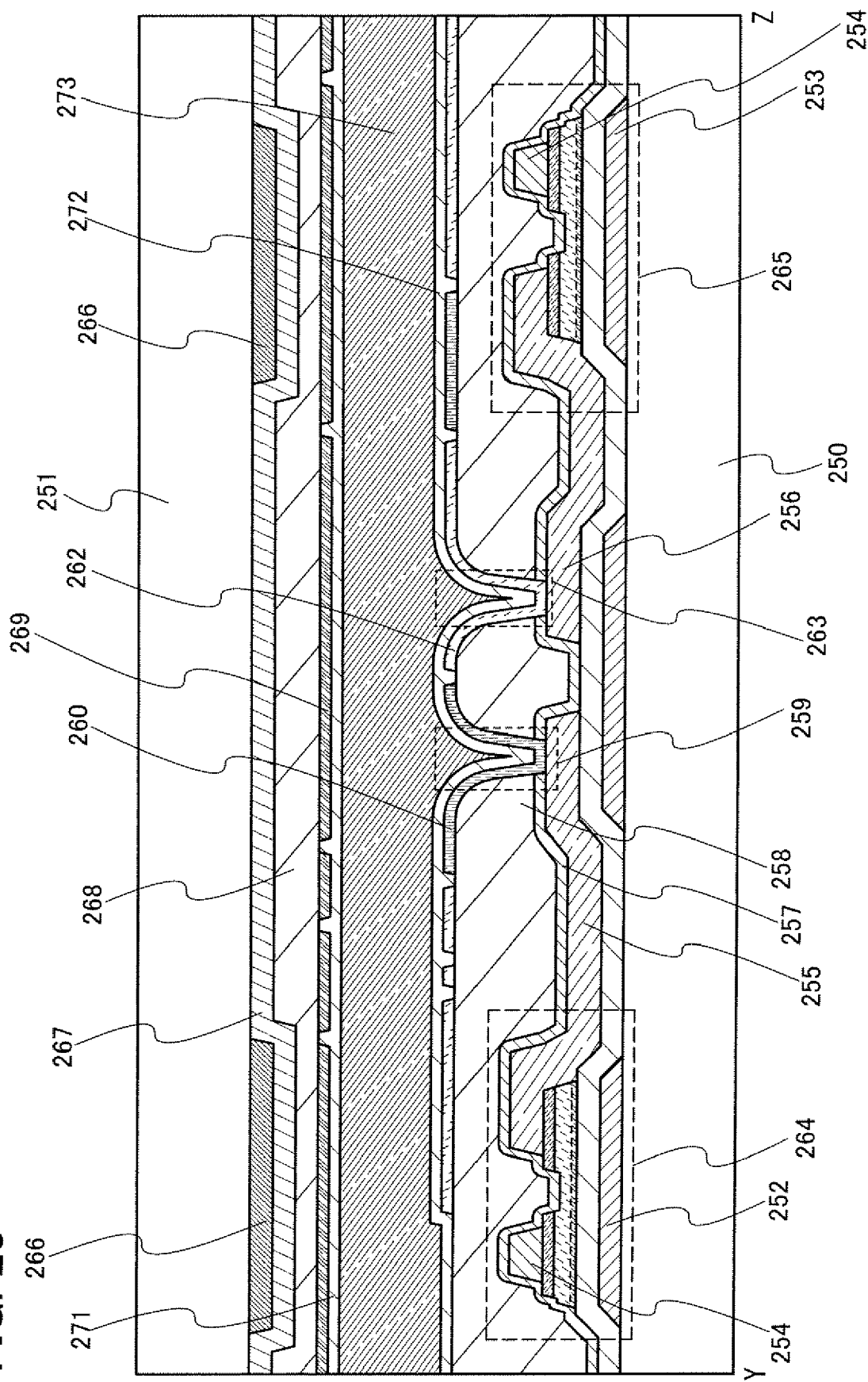
FIG. 23 illustrates an electronic device or the like to which a thin film transistor of one embodiment of the present invention can be applied.
Figure 24:
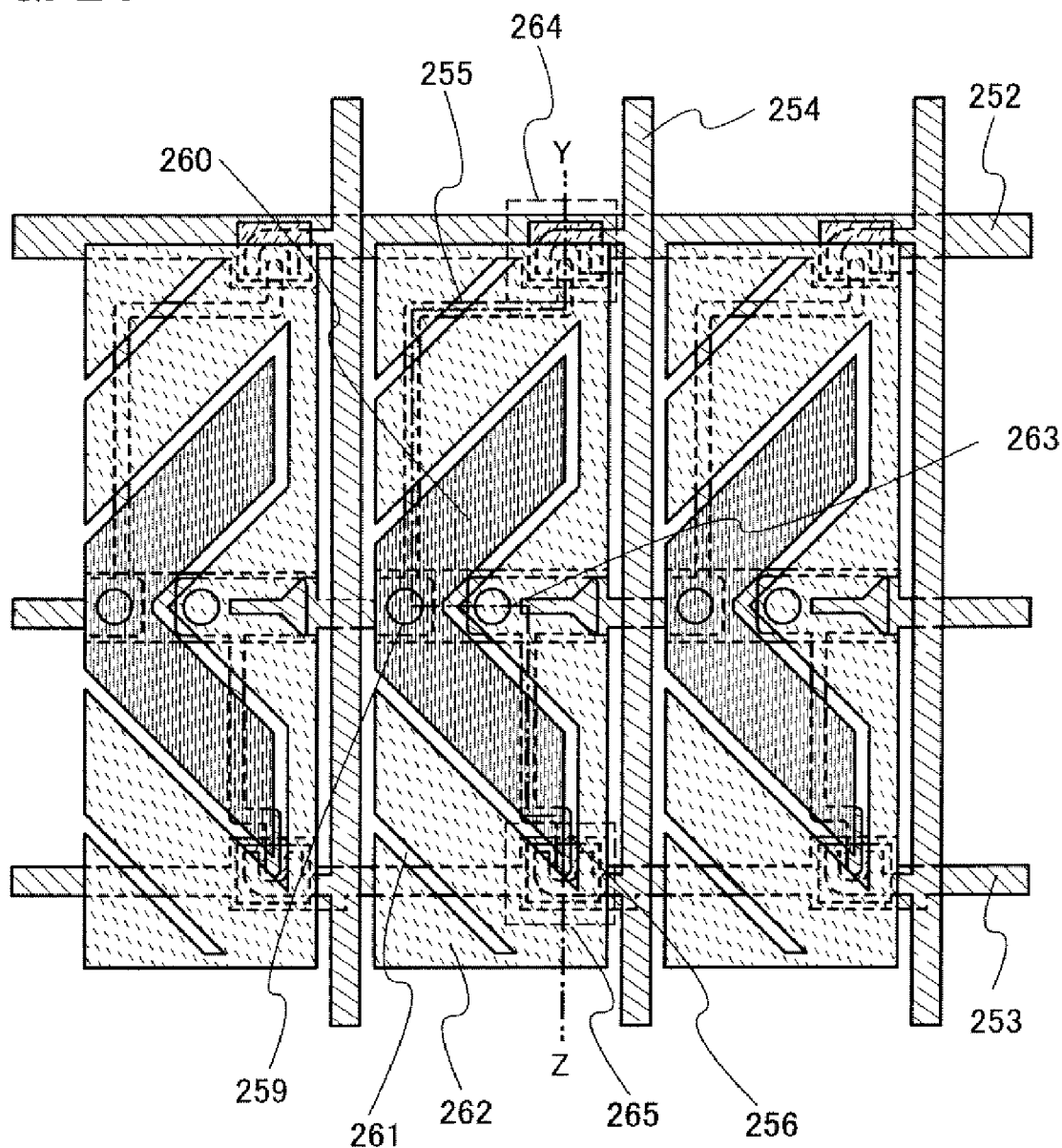
FIG. 24 illustrates an electronic device or the like to which a thin film transistor of one embodiment of the present invention can be applied.

FIGS. 23 and 24 show a pixel structure of a VA-type liquid crystal display panel. FIG. 24 is a plan view of a pixel structure described in this embodiment. FIG. 23 illustrates a cross-sectional structure taken along a line Y-Z in FIG. 24. Hereinafter, description is made with reference to FIGS. 23 and 24.

In the pixel structure described in this embodiment, one pixel provided over a substrate 250 includes a plurality of pixel electrodes 260 and 262 which are connected to a thin film transistor 264 and 265, respectively through a planarizing layer 258 and an insulating layer 257. The respective thin film transistors 264 and 265 are driven by their respective gate signals. Specifically, a pixel of multi-domain design has a structure in which a signal applied to each of pixel electrodes 260 and 262 is independently controlled.

The pixel electrode 260 is connected to the thin film transistor 264 through a wiring 255 in an opening 259. In addition, the pixel electrode 262 is connected to the thin film transistor 265 through a wiring 256 in an opening 263. A gate electrode 252 of the thin film transistor 264 and a gate electrode 253 of the thin film transistor 265 are separated so that different gate signals can be given thereto. In contrast, a wiring 254 which functions as a data line is used in common for the thin film transistors 264 and 265. The thin film transistors 264 and 265 can be manufactured by the method described in Embodiment 5.

The pixel electrodes 260 and 262 have different shapes, and they are separated by a slit 261. The pixel electrode 262 is formed so as to surround the pixel electrode 260 which is extended into a V shape. Timing of voltage application is made to vary between the pixel electrodes 260 and 262 by the thin film transistors 264 and 265 to control alignment of the liquid crystal. When different gate signals are supplied to the gate electrodes 252 and 253, operation timings of the thin film transistors 264 and 265 can be made to vary. In addition, an alignment film 272 is formed over the pixel electrodes 260 and 262.

Figure 25:
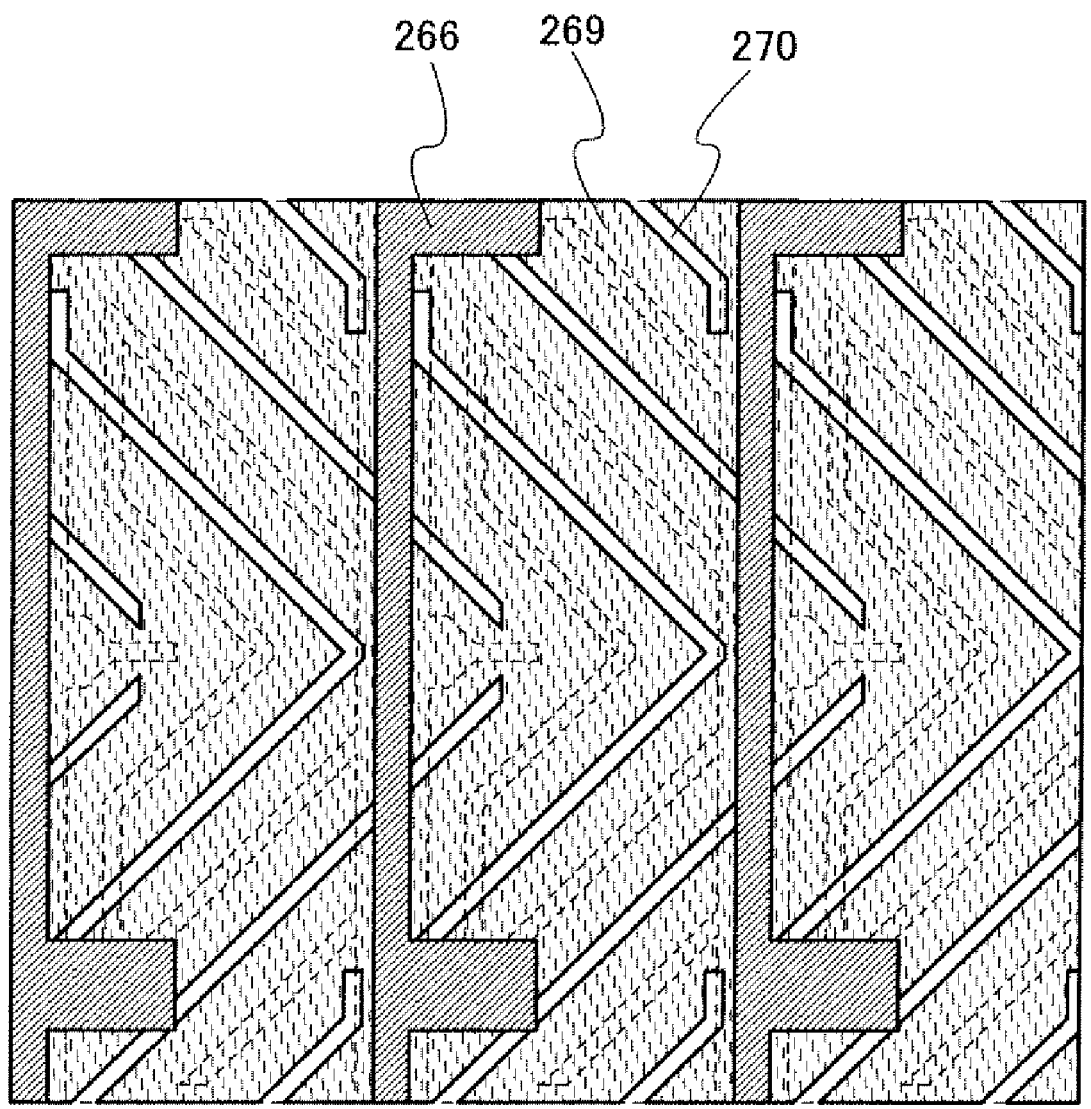
FIG. 25 illustrates an electronic device or the like to which a thin film transistor of one embodiment of the present invention can be applied.

A counter substrate 251 is provided with a light shielding film 266, a coloring layer 267, and a counter electrode 269. In addition, a planarizing layer 268 is formed between the coloring layer 267 and the counter electrode 269 to prevent alignment disorder of the liquid crystal. Moreover, an alignment film 271 is formed over the counter electrode 269. FIG. 25 illustrates a pixel structure of the counter substrate 251 side. The counter electrode 269 is used in common between different pixels and has a slit 270. When the slit 270 and the slit 261 of the pixel electrodes 260 and 262 are alternately provided, an oblique electric field is generated, so that alignment of the liquid crystal can be controlled. Accordingly, an alignment direction of the liquid crystals can be made different depending on the place; therefore, the viewing angle can be widened.

Here, a substrate, a coloring layer, a light shielding film, and a planarizing layer form a color filter. Either or both the light shielding film and the planarizing layer are not necessarily formed over the substrate.

The coloring layer has a function of preferentially transmitting light of a predetermined wavelength range, among light of the wavelength range of visible light. In general, a coloring layer which preferentially transmits light of a wavelength range of red light, a coloring layer which preferentially transmits light of a wavelength range of blue light, and a coloring layer which preferentially transmits light of a wavelength range of green light are combined to be used for a color filter. However, the combination of the coloring layers is not limited to the above combination.

By interposing a liquid crystal layer 273 between the pixel electrode 260 and the counter electrode 269, a first liquid crystal element is formed. In addition, by interposing the liquid crystal layer 273 between the pixel electrode 262 and the counter electrode 269, a second liquid crystal element is formed. This is a multi-domain structure in which the first liquid crystal element and the second liquid crystal element are included in one pixel.

Note that although the VA liquid crystal display device is described here as a liquid crystal display device, the present invention is not limited thereto. In other words, the element substrate which is formed using the thin film transistor described in Embodiment 5 can be used for an FFS liquid crystal display device, an IPS liquid crystal display device, a TN liquid crystal display device, or another liquid crystal display device.

In addition, although the thin film transistor manufactured in Embodiment 5 is used in this embodiment, the thin film transistor manufactured in any of Embodiments 1 to 4 may be used.

As described above, a liquid crystal display device can be manufactured. Since the thin film transistor having high on current and low off current is used as a pixel transistor in the liquid crystal display device of this embodiment, a liquid crystal display device having preferable image quality (for example, high contrast) and low power consumption can be manufactured.

Embodiment 7

In this embodiment, a light-emitting display device including the thin film transistor described in Embodiment 5 will be described as one mode of a display device. Here, a structural example of a pixel included in the light-emitting display device will be described. FIG. 26A illustrates a plan view of the pixel, and FIG. 26B illustrates a cross-sectional structure taken along line A-B in FIG. 26A.

In this embodiment, a light-emitting display device using a light-emitting element utilizing electroluminescence is described. Light-emitting elements utilizing electroluminescence are roughly classified according to whether a light-emitting material is an organic compound or an inorganic compound. In general, the former is referred to as organic EL elements and the latter as inorganic EL elements. In addition, although Embodiment 5 is employed here for a manufacturing method of a thin film transistor, the manufacturing method described in Embodiment 1 may be employed, without limitation thereto.

In an organic EL element, by application of a voltage to a light-emitting element, electrons and holes are separately injected from a pair of electrodes into a layer including a light-emitting organic compound, and a current flows. Then, by recombination of these carriers (electrons and holes), the light-emitting organic compound forms an excited state, and light is emitted when the excited state returns to a ground state. Such a light emitting element is called a current excitation light emitting element because of such mechanism.

Inorganic EL elements are classified into a dispersion-type inorganic EL element and a thin-film-type inorganic EL element according to their element structures. A dispersion type inorganic EL element has a light-emitting layer where particles of a light-emitting material are dispersed in a binder, and its light emission mechanism is donor-acceptor recombination type light emission that utilizes a donor level and an acceptor level. The thin-film type inorganic EL element has a structure in which a light-emitting layer is interposed between dielectric layers and the light-emitting layer interposed between the dielectric layers is further interposed between electrodes, and adopts, as a light emission mechanism, local emission in which inner shell electron transition of a metal ion is utilized. Note that description is made here using an organic EL element as a light-emitting element.

In FIGS. 26A and 26B, a first thin film transistor 281a corresponds to a switching thin film transistor which controls input of a signal to a pixel electrode, and a second thin film transistor 281b corresponds to a driving thin film transistor which controls supply of current or voltage to a light-emitting element 282.

In the first thin film transistor 281a, a gate electrode is connected to a scanning line 283a, one of source and drain regions is connected to a signal line 284a, and the other of the source and drain regions is connected to a gate electrode 283b of the second thin film transistor 281b through a wiring 284b. In addition, in the second thin film transistor 281b, one of source and drain regions is connected to a power supply line 285a, and the other of the source and drain regions is connected to a pixel electrode (a cathode 288) of a light-emitting element through a wiring 285b. The gate electrode, a gate insulating film, and the power supply line 285a of the second thin film transistor 281b form a capacitor, and the other of source and drain electrodes of the first thin film transistor 281a is connected to the capacitor.

Note that when the first thin film transistor 281a is in an off state, the capacitor corresponds to a capacitor for holding potential difference between the gate electrode and a source electrode of the second thin film transistor 281b or potential difference between the gate electrode and a drain electrode thereof (hereinafter referred to as gate voltage), and the capacitor is not necessarily provided.

In this embodiment, although the first thin film transistor 281a and the second thin film transistor 281b are n-channel thin film transistors, either or both of them may be p-channel thin film transistors.

An insulating layer 285 is formed over the first thin film transistor 281a and the second thin film transistor 281b, a planarizing layer 286 is formed over the insulating layer 285, an opening is formed in the planarizing layer 286 and the insulating layer 285, and the cathode 288 connecting to the wiring 285b is formed through the opening. The planarizing layer 286 is preferably formed using an organic resin such as an acrylic resin, polyimide, or polyamide, or a siloxane polymer. In the opening, the cathode 288 has unevenness; therefore, a partition wall 291 which covers the uneven region of the cathode 288 and has an opening is provided. An EL layer 289 is formed so as to be in contact with the cathode 288 through the opening of the partition wall 291, an anode 290 is formed so as to cover the EL layer 289, and a protective insulating film 292 is formed so as to cover the anode 290 and the partition wall 291.

Here, the light-emitting element 282 with a top emission structure is shown as a light-emitting element. Since the light-emitting element 282 with a top emission structure can also extract light emission in a region where the first thin film transistor 281a and the second thin film transistor 281b are overlapped with each other, a broad light emission area can be obtained. However, when a base layer of the EL layer 289 has unevenness, the thickness distribution in the uneven portion is not uniform, a short circuit occurs between the anode 290 and the cathode 288, and thus display defects might occur. Therefore, the planarizing layer 286 is preferably provided. Provision of the planarizing layer 286 can improve yield thereof.

The region where the EL layer 289 is interposed between the cathode 288 and the anode 290 corresponds to the light-emitting element 282. In the case of the pixel illustrated in FIGS. 26A and 26B, light emitted from the light-emitting element 282 is emitted to the anode 290 side as illustrated by a hollow arrow in FIG. 26B.

The cathode 288 can be formed using any known material as long as the known material is a conductive layer which has a low work function and reflects light. For example, Ca, Al, MgAg, AlLi, or the like is desirably used. The EL layer 289 may be formed using either a single-layer structure or a stacked structure of a plurality of layers. In the case of using a structure where a plurality of layers are stacked, an electron injecting layer, an electron transporting layer, a light-emitting layer, a hole transporting layer, and a hole injecting layer are sequentially stacked over the cathode 288. Note that layers other than the light-emitting layer, for example, the electron injecting layer, the electron transporting layer, the hole transporting layer, and the hole injecting layer are not necessarily provided all, and a layer which is necessary may be provided as appropriate. The anode 290 is formed using a light-transmitting conductive material which transmits light. F or example, a light-transmitting conductive layer such as a layer of indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added may be used.

Although the light-emitting element with a top emission structure in which light emission is extracted from a side opposite to a substrate is described here, the present invention is not limited thereto. In other words, a light-emitting element with a bottom emission structure in which light emission is extracted from a substrate side or a light-emitting element with a dual emission structure in which light emission is extracted from both a substrate side and a side opposite to a substrate may be employed.

Although an organic EL element is described here as a light-emitting element, an inorganic EL element may be used as a light-emitting element.

Note that although an example in which a thin film transistor for controlling the driving of a light-emitting element (a driving thin film transistor) is connected to a light-emitting element is described in this embodiment, a thin film transistor for controlling current may be connected between the driving thin film transistor and the light-emitting element.

As described above, a light-emitting display device can be manufactured. Since the thin film transistor having high on current and low off current is used as a pixel transistor in the light-emitting display device of this embodiment, a light-emitting display device having preferable image quality (for example, high contrast) and low power consumption can be manufactured.

Embodiment 8

Next, a structural example of a display panel included in a display device to which the aforementioned embodiments can be applied will be described.

Figure 27A:
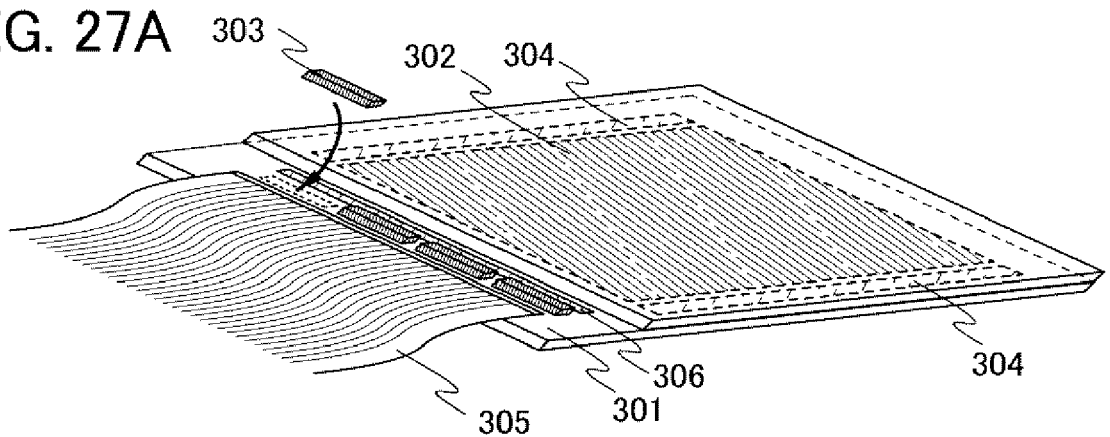
FIGS. 27A to 27C illustrate electronic devices to which a thin film transistor of one embodiment of the present invention can be applied.

FIG. 27A illustrates a mode of a display panel in which a signal line driver circuit 303 is formed separately to be connected to a pixel portion 302 formed over a substrate 301. An element substrate provided with the pixel portion 302, a protective circuit 306, and a scanning line driver circuit 304 is formed using the thin film transistor described in any of Embodiment 1 to Embodiment 5. The signal line driver circuit 303 may be formed with a transistor in which a single crystal semiconductor is used for a channel formation region, a transistor in which a polycrystalline semiconductor is used for a channel formation region, or a transistor in which silicon on insulator (SOI) is used for a channel formation region. The transistor in which SOI is used in the channel formation region includes a transistor in which a single crystal semiconductor layer provided over a glass substrate is used for a channel formation region. To each of the pixel portion 302, the signal line driver circuit 303, and the scanning line driver circuit 304, potential of power supply, various signals, and the like are inputted through an FPC 305. Between the signal line driver circuit 303 and the FPC 305 and/or between the signal line driver circuit 303 and the pixel portion 302, the protective circuit 306 formed using the thin film transistor described in any of Embodiments 1 to 5 may be provided. The protective circuit 306 may be provided with one or more elements selected from a thin film transistor with another structure, a diode, a resistive element, a capacitor, or the like.

Note that the signal line driver circuit and the scanning line driver circuit may both be formed over a substrate which is the same as the substrate over which a pixel transistor of the pixel portion is formed.

Figure 27B:
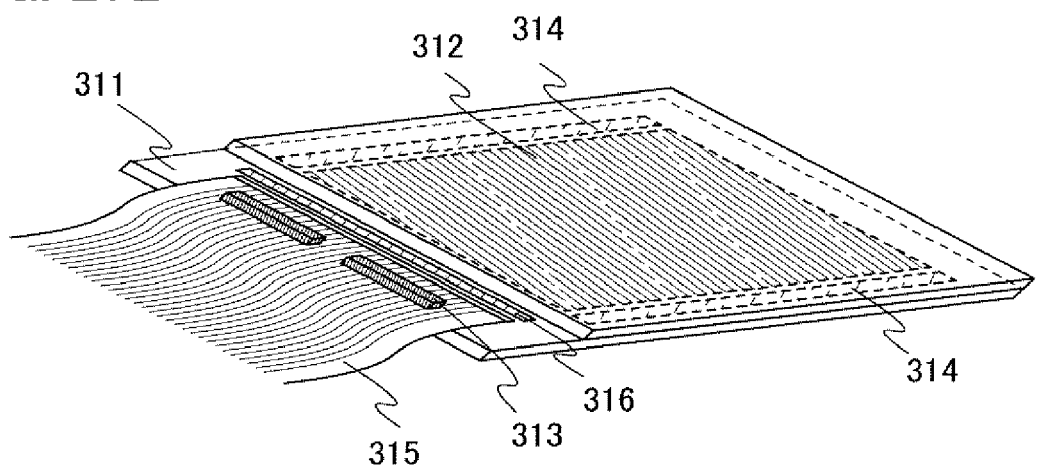

Further, when the driver circuit is separately formed, a substrate provided with the driver circuit is not always necessary to be attached to a substrate provided with the pixel portion, and may be attached to, for example, the FPC. FIG. 27B illustrates a mode of a display panel in which an element substrate provided with a pixel portion 312, a protective circuit 316, and a scanning line driver circuit 314 which are formed over a substrate 311 is connected to an FPC 315, with only a signal line driver circuit 313 formed separately. The pixel portion 312, the protective circuit 316, and the scanning line driver circuit 314 are formed using the thin film transistor described in any of the aforementioned embodiments. The signal line driver circuit 313 is connected to the pixel portion 312 through the FPC 315 and the protective circuit 316. To each of the pixel portion 312, the signal line driver circuit 313, and the scanning line driver circuit 314, potential of power supply, various signals, and the like are inputted through the FPC 315. The protective circuit may be provided between the FPC 315 and the pixel portion 312.

Figure 27C:
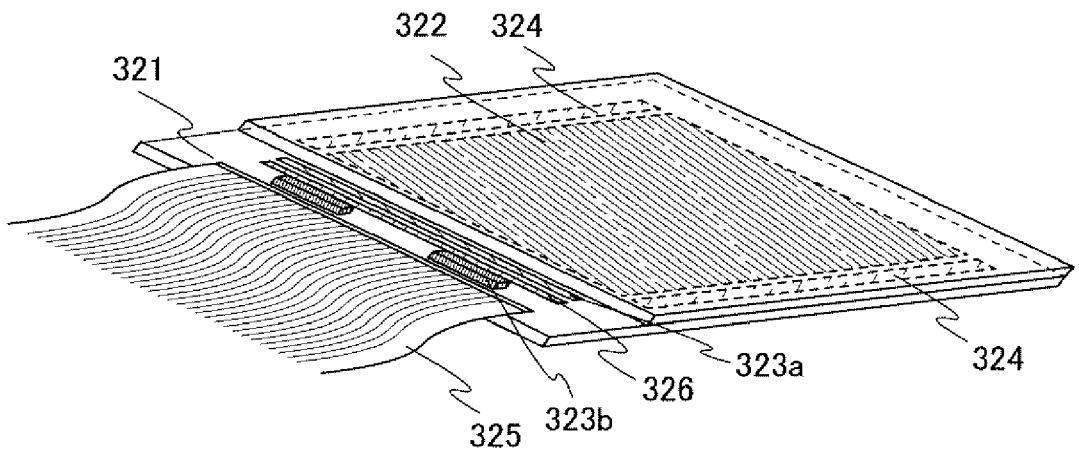

Furthermore, only part of the signal line driver circuit or part of the scanning line driver circuit may be formed over a substrate the same as the substrate over which the pixel portion is formed, using any of the thin film transistors described in the above embodiments, and the rest may be formed separately and electrically connected to the pixel portion. FIG. 27C illustrates the mode of a display panel in which an analog switch 323a included in a signal line driver circuit is formed over a substrate which is the same as a substrate 321, over which a pixel portion 322 and a scanning line driver circuit 324 are formed, and a shift register 323b included in the signal line driver circuit is separately formed over a different substrate and then attached to the substrate 321. The pixel portion 322, a protective circuit 326, and the scanning line driver circuit 324 are each formed using any of the thin film transistors described in the aforementioned embodiments. The shift register 323b included in the signal line driver circuit is connected to the pixel portion 322 through the analog switch 323a and the protective circuit 326. To each of the pixel portion 322, the signal line driver circuit, and the scanning line driver circuit 324, potential of power supply, various signals, and the like are inputted through an FPC 325. The protective circuit 326 may be provided between the FPC 325 and the shift register 323b.

As illustrated in FIGS. 27A to 27C, in the display device of this embodiment, an entire driver circuit or a part thereof can be formed over the same substrate as that of a pixel portion, using any of the thin film transistors described in any of the aforementioned embodiments.

Note that a connection method of a substrate which is separately formed is not particularly limited, and a known COG method, wire bonding method, TAB method, or the like can be used. In addition, a position for connection is not limited to the position illustrated in FIGS. 27A to 27C as long as electrical connection is possible. A controller, a CPU, a memory, or the like may be formed separately and connected.

The signal line driver circuit used in this embodiment has the shift register and the analog switch. In addition to the shift register and the analog switch, another circuit such as a buffer, a level shifter, or a source follower may be included. Also, the shift resistor and the analog switch are not always required to be provided, and for example a different circuit such as a decoder circuit by which selection of signal line is possible may be used instead of the shift resistor, and a latch or the like may be used instead of the analog switch.

Embodiment 9

An element substrate which is formed of the thin film transistor described in any of the aforementioned embodiments and a display device or the like with the use of this element substrate can be applied to an active-matrix display panel. That is, the aforementioned embodiments can be applied to all electronic devices in each of which the element substrate is incorporated into a display portion.

Examples of such electronic devices include cameras such as a video camera and a digital camera, a head-mounted display (a goggle-type display), a car navigation system, a projector, a car stereo, a personal computer, and a portable information terminal (e.g., a mobile computer, a cellular phone, and an e-book reader). Examples of these appliances are illustrated in FIGS. 28A to 28D.

Figure 28A:
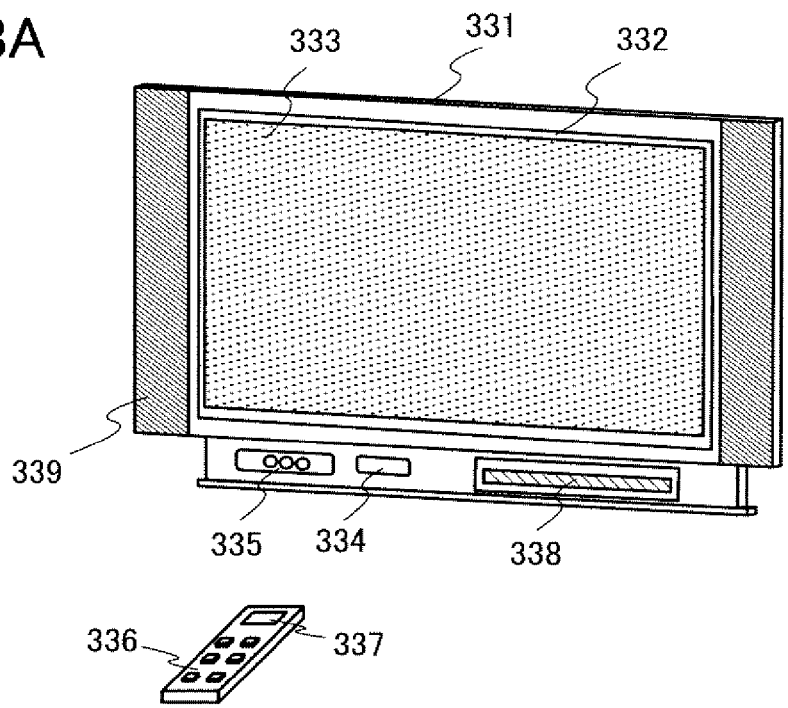
FIGS. 28A to 28D illustrate electronic devices to which a thin film transistor of one embodiment of the present invention can be applied.

FIG. 28A illustrates a television device. The television device can be completed by incorporating the display panel to which the aforementioned embodiment is applied into a housing. A main screen 333 is formed with the display panel, and a speaker portion 339, operation switches, or the like are provided as other additional accessories.

As illustrated in FIG. 28A, a display panel 332 utilizing a display element is incorporated into a housing 331. In addition to reception of general television broadcast by a receiver 335, communication of information in one direction (from a transmitter to a receiver) or in two directions (between a transmitter and a receiver or between receivers) can be performed by connection to a wired or wireless communication network through a modem 334. Operation of the television device can be performed by the switch incorporated into the housing or a remote control device 336. This remote control device 336 may also be provided with a display portion 337 for displaying output information, and the display portion 337 may also be provided with the thin film transistor of any of Embodiment 1 to Embodiment. Further, the television device may include a sub screen 338 formed with a second display panel to display channels, volume, or the like, in addition to the main screen 333. In this structure, the thin film transistor of any of Embodiment 1 to Embodiment 5 can be applied to either or both the main screen 333 and the sub screen 338.

Figure 29:
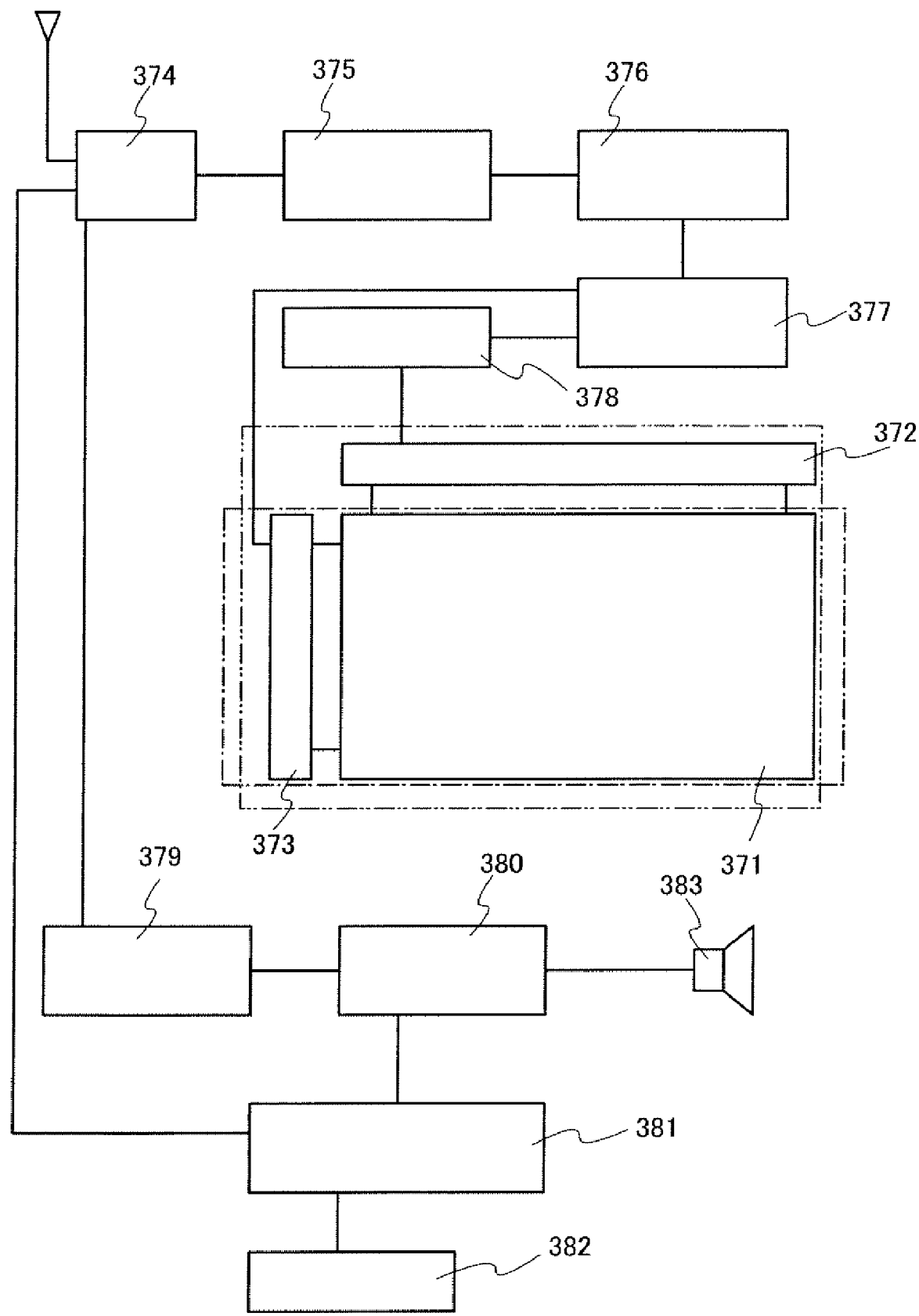
FIG. 29 illustrates an electronic device to which a thin film transistor of one embodiment of the present invention can be applied.

FIG. 29 is a block diagram illustrating a main structure of a television device. A display panel is provided with a pixel portion 371. A signal line driver circuit 372 and a scanning line driver circuit 373 may be mounted on the display panel by a COG method.

As another external circuit, a video signal amplifier circuit 375 that amplifies a video signal among signals received by a tuner 374; a video signal processing circuit 376 that converts the signals outputted from the video signal amplifier circuit 375 into chrominance signals corresponding to respective colors of red, green, and blue; a control circuit 377 that converts the video signal into an input specification of the driver IC; and the like are provided on an input side of the video signal. The control circuit 377 outputs a signal to both a scanning line side and a signal line side. In the case of digital driving, a structure may be employed in which a signal line dividing circuit 378 is provided on the signal line side and an input digital signal is divided into m pieces to be inputted.

Among the signals received by the tuner 374, an audio signal is transmitted to an audio signal amplifier circuit 379, and an output thereof is inputted into a speaker 383 through an audio signal processing circuit 380. A control circuit 381 receives control information of a receiving station (received frequency) or a sound volume from an input portion 382, and transmits signals to the tuner 374 and the audio signal processing circuit 380.

Needless to say, this embodiment is not limited to a television device, and may be applied to monitors of personal computers, or display media having a large area, such as information display boards in railway stations, airports, and the like, and street-side advertisement display boards.

As described above, a television device having high image quality and low power consumption can be manufactured by applying the thin film transistor described in any of Embodiment 1 to Embodiment 5 to either or both the main screen 333 and the sub screen 338.

Figure 28B:
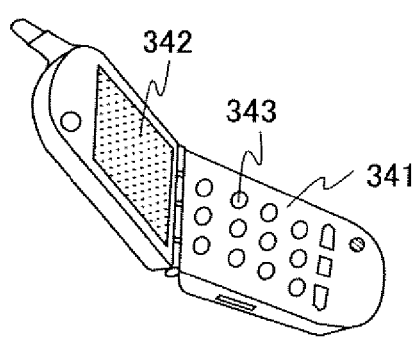

FIG. 28B illustrates one example of a cellular phone 341. The cellular phone 341 includes a display portion 342, an operation portion 343, and the like. The image quality thereof can be improved and the power consumption thereof can be reduced by applying, to the display portion 342, the thin film transistor described in any of Embodiment 1 to Embodiment 5.

Figure 28C:
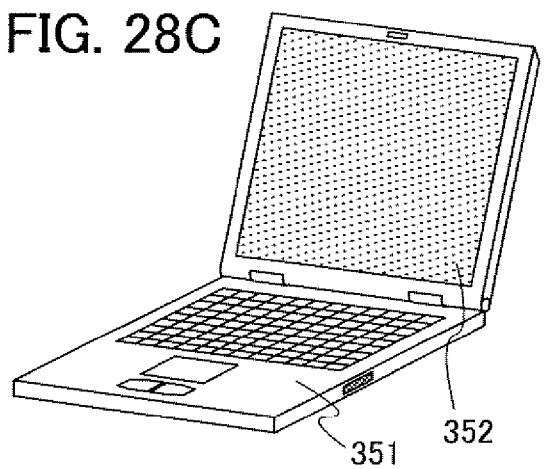

A portable computer illustrated in FIG. 28C includes a main body 351, a display portion 352, and the like. The image quality thereof can be improved and the power consumption thereof can be reduced by applying, to the display portion 352, the thin film transistor described in Embodiment 1 or the like.

Figure 28D:
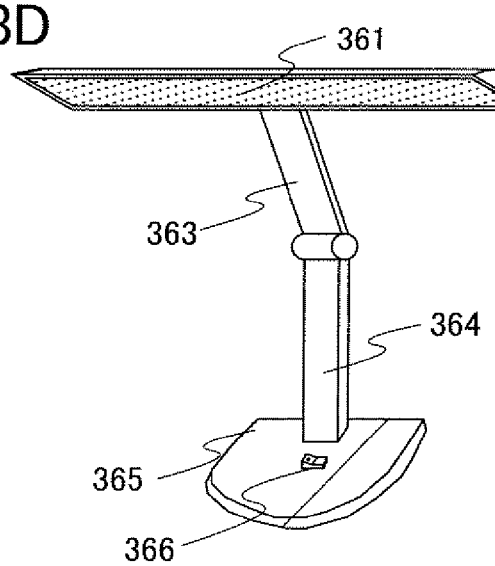

FIG. 28D illustrates a desk lamp, which includes a lighting portion 361, a shade 362, an adjustable arm 363, a support 364, a base 365, a power source 366. The desk lamp is formed using, for the lighting portion 361, the light-emitting device which is described in the above embodiment. The image quality thereof can be improved and the power consumption thereof can be reduced by applying, to the lighting portion 361, the thin film transistor described in any of Embodiment 1 to Embodiment 5.

Figure 30A:
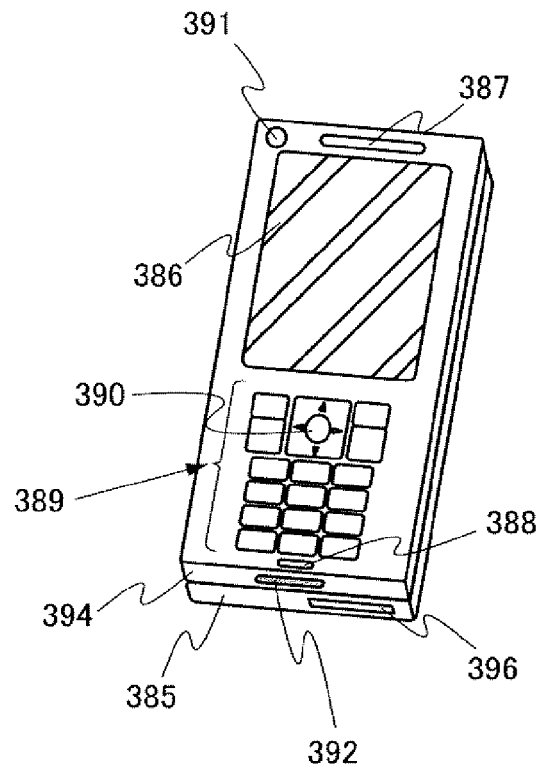
FIGS. 30A to 30C illustrate an electronic device to which a thin film transistor of one embodiment of the present invention can be applied.
Figure 30B:
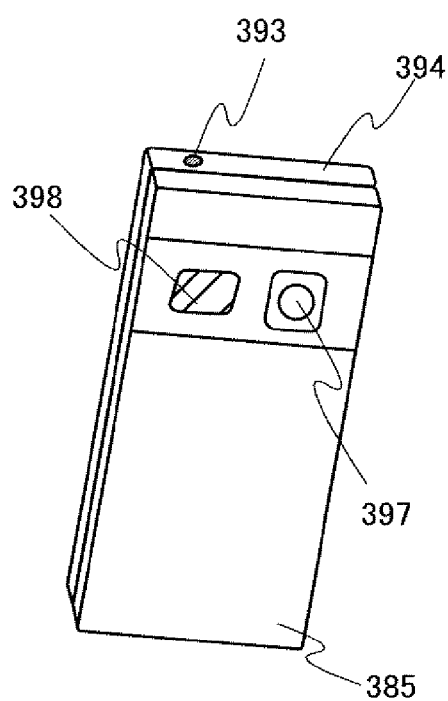
Figure 30C:
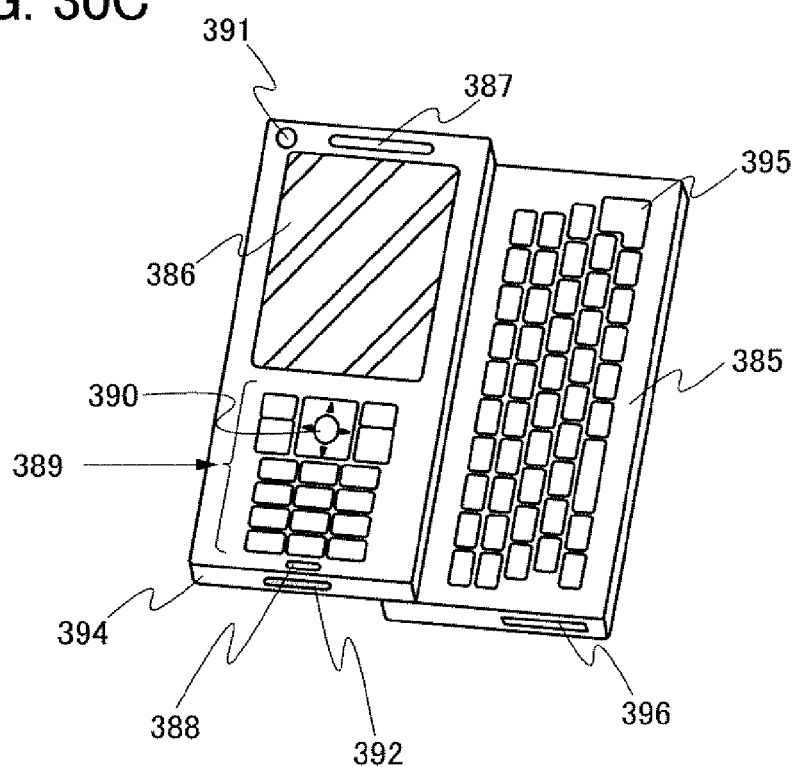

FIGS. 30A to 30C illustrate a structural example of a cellular phone, and the element substrate having the thin film transistor described in any of Embodiment 1 to Embodiment 5 and the display device having the element substrate are applied to, for example, a display portion thereof. FIG. 30A is a front view, FIG. 30B is a rear view, and FIG. 30C is a development view. The cellular phone illustrated in FIG. 30A to 30B includes two housings, a housing 394 and a housing 385. The cellular phone illustrated in FIGS. 30A to 30C, which is also referred to as a smartphone, has both of functions of a cellular phone and a portable information terminal, incorporates a computer, and can perform a variety of data processing in addition to voice calls.

The cellular phone includes two housings, the housing 394 and the housing 385. The housing 394 includes a display portion 386, a speaker 387, a microphone 388, operation keys 389, a pointing device 390, a front camera lens 391, a jack 392 for an external connection terminal, an earphone terminal 393, and the like, while the housing 385 includes a keyboard 395, an external memory slot 396, a rear camera 397, a light 398, and the like. In addition, an antenna is incorporated into the housing 394.

In addition to the structure described above, a non-contact IC chip, a small size memory device, or the like can be incorporated therein.

The housings 394 and 385 are overlapped with each other in FIG. 30A and slid, and the cellular phone is developed as illustrated in FIG. 30C. In the display portion 386, the display device described in any of Embodiment 1 to Embodiment 5 can be incorporated, and display direction can be changed as appropriate depending on a use mode. Note that since the front camera lens 391 is provided in the same plane as the display portion 386, the cellular phone can be used as a videophone. A still image and a moving image can be taken by the rear camera 397 and the light 398 by using the display portion 386 as a viewfinder.

The speaker 387 and the microphone 388 can be used for videophone, recording and playing sound, and the like without being limited to voice calls. With the use of the operation keys 389, operation of incoming and outgoing calls, simple information input such as electronic mail, scrolling of a screen, cursor motion, and the like are possible.

If much information needs to be treated, such as documentation, use as a portable information terminal, and the like, it is convenient to use the keyboard 395. The housings 394 and 385 that overlap with each other (FIG. 30A) can be slid and the cellular phone is developed as illustrated in FIG. 30C, so that the cellular phone can be used as an information terminal. In addition, with the use of the keyboard 395 and the pointing device 390, a cursor can be moved smoothly. An AC adaptor and various types of cables such as a USB cable can be connected to the jack 392 for an external connection terminal, through which charging and data communication with a personal computer or the like are possible. Moreover, by inserting a recording medium into the external memory slot 396, a large amount of data can be stored and moved.

In the rear surface of the housing 385 (FIG. 30B), the rear camera 397 and the light 398 are provided, and a still image and a moving image can be taken by using the display portion 386 as a viewfinder.

Further, the cellular phone may have an infrared communication function, a USB port, a function of receiving one segment television broadcast, a non-contact IC chip, an earphone jack, or the like, in addition to the aforementioned structures.

The image quality thereof can be improved and the power consumption thereof can be reduced by applying, to a pixel, the thin film transistor described in any of Embodiment 1 to Embodiment 5.

EXAMPLE 1

This example below describes a state of LUMO in the case where a crystal grain boundary of Si is cross-linked with an NH group in the simulation described in Embodiment 1.

FIG. 7 illustrates a state of LUMO (lowest unoccupied molecular orbital) in a model (model 1) in which a crystal grain boundary of Si is cross-linked with an O atom and FIG. 8 illustrate a state of LUMO of a model (model 2) in which the crystal grain boundary of Si is cross-linked with the NH group. Here, LUMO is a molecular orbital of the lowest energy, which electrons in an excited state enter and which corresponds to an orbital of a bottom edge of conduction band (CB) in a band theory. Therefore, LUMO can be interpreted as a wave function of an electron contributed to carrier conduction and an orbital which determines carrier mobility.

Next, an atom and an orbital of the atom from which LUMO in each of the model 1 and the model 2 was derived were examined. A wave function of LUMO can be expressed by a linear combination (that is, a sum of scalar multiples) of an atomic orbital of an atom included in a film.

Note that respective existence probabilities can be obtained by the square of their respective absolute values of factors of the linear combination and the each sign proves whether the atomic orbital is a bonding orbital (the same sign) or an antibonding orbital (a different sign).

Figure 31A:
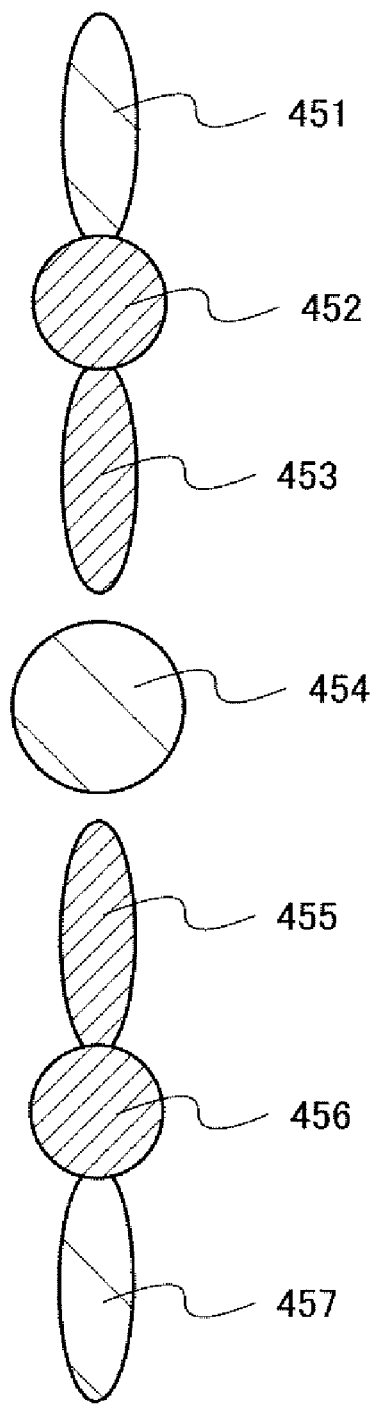
FIGS. 31A and 31B illustrate a semiconductor layer included in a thin film transistor according to one embodiment of the present invention.
Figure 31B:
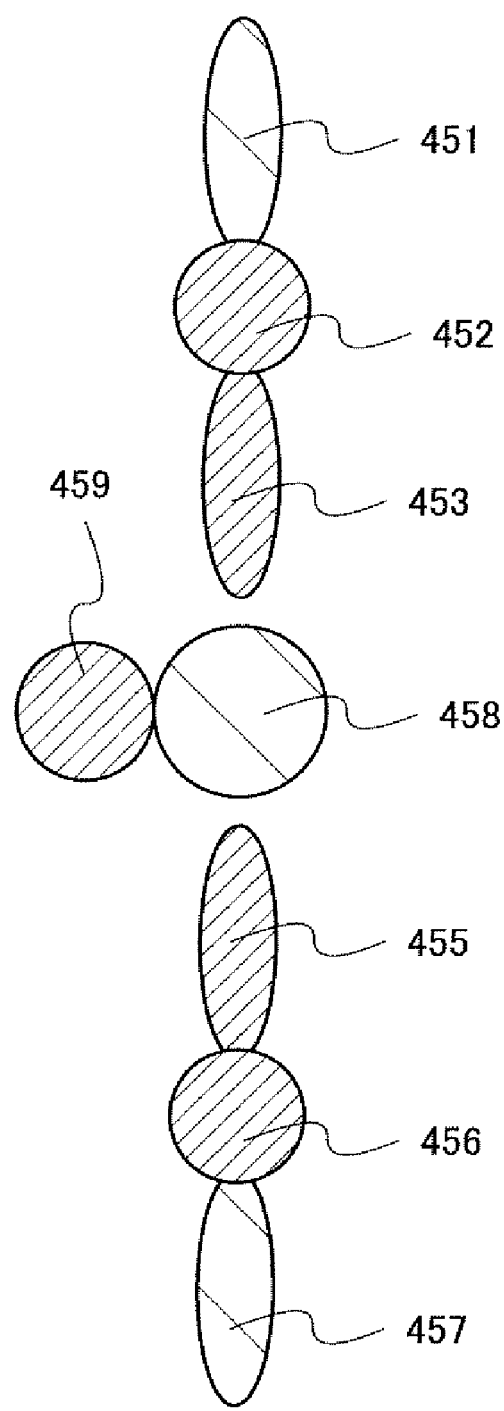

Next, FIG. 31A is a schematic view of a main atomic orbital forming LUMO at the periphery of the crystal grain boundary in the model 1, and FIG. 31B is a schematic view of a main atomic orbital forming LUMO at the periphery of the crystal grain boundary in the model 2. Here, regions with different hatchings have opposite signs of the wave function. Here, s orbitals 452 and 456 of a Si atom, p orbitals 451, 453, 455, and 457 of a Si atom, a 2s orbital 454 of an O atom, and a 2s orbital 458 of an N atom, and a 1s orbital 459 of an H atom are illustrated.

As illustrated in FIG. 31A, in the case where the crystal grain boundary of Si is cross-linked with the O atom, when the 2s orbital 454 of the O atom is focused, the phase of the 2s orbital 454 of the O atom is different from that of $sp^3$ orbitals (3s orbital 452+3p orbital 453 and 3s orbital 456+3p orbital 455) of Si which are in sides of the crystal grain boundaries. That is, the 2s orbital 454 of the O atom contributes to a combination between atoms; however, the 2s orbital 454 of the O atom cannot connect electron clouds because of a narrow spread of the wave function. Therefore, it is considered that the 2s orbital 454 of the O atom does not contribute to improvement of conductance.

On the other hand, as illustrated in FIG. 31B, in the case where the crystal grain boundary of Si is cross-linked with the NH group, when the 2s orbital 458 of the N atom is focused, the phase of the 2s orbital 458 of the N atom is different from that of $sp^3$ orbitals (the 3s orbital 452+the 3p orbital 453 and the 3s orbital 456+the 3p orbital 455) of Si which are in opposite sides of the crystal grain boundaries. That is, the 2s orbital 458 of the N atom cannot connect electron clouds. However, by mixing the 2s orbital 458 of the N atom with the 1s orbital 459 of the H atom, regions which have the same sign, that is, the $sp^3$ orbitals (the 3s orbital 452+the 3s orbital 453) of the Si atom, the 1s orbital 459 of the H atom, and the $sp^3$ orbitals (the 3s orbital 456+the 3s orbital 455) become bonding orbitals, whereby the electron clouds can be connected to each other. Accordingly, the conductance is improved.

Figure 32A:
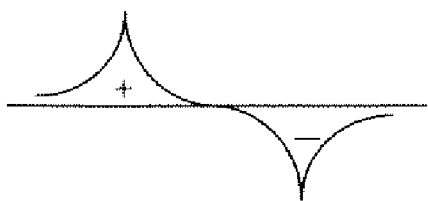
FIGS. 32A and 32B are graphs each illustrating a semiconductor layer included in a thin film transistor according to one embodiment of the present invention.
Figure 32B:
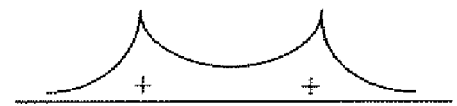

The aforementioned results can be interpreted as follows. That is, LUMO is an exited state (has high energy); therefore, in general, LUMO has antibonding orbital of the atomic orbital as illustrated in 32A. In the cross-link of the Si crystal grain boundary with the O atom in the model 1 illustrated in FIG. 31A and the cross-link of the Si crystal grain boundary with the NH group in the model 2 illustrated in FIG. 31, the 2s orbitals 454 and 458 of the O atom and the N atom have antibonding with (have phases opposite to) the $sp^3$ orbitals (the 3s orbital 452+the 3p orbital 453, the 3s orbital 456+the 3p orbital 455). The antibonding orbital indicates that a joint is formed between electron clouds. Accordingly, in the case where the cross-link of the Si crystal grain boundary with the O atom in the model 1 illustrated in FIG. 31A, the electron clouds are not connected to each other. Meanwhile, in the case of the cross-link of the Si crystal grain boundary with the NH group in the model 2 illustrated in FIG. 31B, although the 2s orbital 458 of the N atom and the $sp^3$ orbitals (the 3s orbital 452+the 3p orbital 453 and the 3s orbital 456+the 3p orbital 455) form an antibonding orbital, the 1s orbital 459 of the H atom and the $sp^3$ orbitals (the 3s orbital 452+the 3p orbital 453 and the 3s orbital 456+the 3p orbital 455) can form a bonding orbital as illustrated in FIG. 32B because of existence of the H atom. That is, the electron clouds can be connected to each other with the NH group because of existence of the H atom.

Note that although a $CH_2$ group includes H, a molecular orbital with which an atomic orbital of a C atom or an H atom in the $CH_2$ group is combined forms a molecular orbital with higher energy and therefore the molecular orbital is not included in the atomic orbital included in LUMO (lowest unoccupied molecular orbital). Thus, it is considered that even with a cross-link of the Si crystal grain boundary with the $CH_2$ group, the electron clouds are not connected to each other.

Accordingly, in LUMO of the Si crystal grain boundary cross-linked with the NH group, the $sp^3$ orbitals of the Si atom in the opposite sides of the crystal grain boundary have phases which are opposite to the phase of the 2s orbital of the N atom and the same as the phase of the 1s orbital of the H atom. Thus, the 1s orbital of the H atom functions as a bridge between the electron clouds. As a result, the electron clouds are connected to each other and thus a carrier path is formed. Further, it is estimated that, in order to connect the electron clouds at the Si crystal grain boundary, the following condition s are needed: an atomic orbital in a cross-linking group, which has an atom forming LUMO (for example, an O atom in the O cross-link, or the N atom and the H atom in the NH group) and an atom which can have the same phase as the $sp^3$ orbital of Si (for example, the H atom in the NH group) are needed.

EXAMPLE 2

This example below describes results obtained by measurement by constant photocurrent method (CPM) as for physical properties of the first region 106a illustrate in FIG. 2 of Embodiment 1.

First, methods for manufacturing samples will be described.

[Sample A]

A silicon nitride layer with a thickness of 300 nm and an amorphous silicon layer with a thickness of 30 nm were formed over a substrate.

Here, a glass substrate was used as the substrate. Further, as a formation condition of the silicon nitride layer, a plasma CVD method was used, in which plasma was discharged under the following conditions: source gases were introduced and stabilized when the flow rate of $SiH_4$ was 40 sccm, the flow rate of $H_2$ was 500 sccm and the flow rate of $NH_3$ was 140 sccm; the pressure in the treatment chamber was to 100 pa; the temperature of the substrate was 280° C.; the RF power source frequency was 13.56 MHz; and the power of the RF power source was 370 W.

Further, as a formation condition of the amorphous silicon layer, a plasma CVD method was used, in which plasma was discharged under the following conditions: source gases were introduced and stabilized when the flow rate of SiH$_4$ was 280 sccm and the flow rate of H$_2$ was 300 sccm; the pressure in the treatment chamber was to 170 Pa; the temperature of the substrate was 280° C.; RF power source frequency was 13.56 MHz; and the power of the RE power source was 60 W.

[Sample B]

A silicon nitride layer with a thickness of 300 nm and the first region 106a illustrated in FIG. 2 of Embodiment 1 with a thickness of 30 nm were successively formed over a substrate.

Note that a deposition condition of the silicon nitride layer is the same as that of the sample A.

Further, as a formation condition of the first region 106a illustrated in FIG. 2 of Embodiment 1, a plasma CVD method was used, in which plasma was discharged under the following conditions: source gases were introduced and stabilized when the flow rate of SiH$_4$ was 10 sccm and the flow rate of H$_2$ was 1500 sccm; the pressure in the treatment chamber was 280 Pa; the temperature of the substrate was 280° C.; the RF power source frequency was 13.56 MHz; and the power of the RF power source was 50 W. Here, in order to successively form the silicon nitride layer and the first region 106a, nitrogen exists in an atmosphere at which the first region 106a is formed. Therefore, nitrogen is included in the first region 106a.

[Sample C]

A silicon nitride layer with a thickness of 300 nm and the first region 106a illustrated in FIG. 2 of Embodiment 1 with a thickness of 30 nm were formed successively over a substrate.

Note that deposition conditions of the silicon nitride layer are the same as those of the sample A.

Further, as a formation condition of the first region 106a illustrated in FIG. 2 of Embodiment 1, a plasma CVD method was used, in which plasma was discharged under the following conditions: source gases were introduced and stabilized when the flow rate of SiH$_4$ was 20 sccm and the flow rate of H$_2$ was 1500 sccm; the pressure in the treatment chamber was 280 Pa; the temperature of the substrate was 280° C.; RF power source frequency was 13.56 MHz; and the power of the RF power source was 50 W.

Next, the samples A to C were measured by CPM. Here, the measurement was performed using a subgap light absorption spectrum measurement apparatus SGA-1 manufactured by JASCO Corporation. Note that as a light source, a halogen lamp with 36 V and 400 W was used and an irradiation area was set to 6 mm×6 mm.

According to the measurement results by CPM, $E_{TAUC}$, Urbach edge $E_U$, σdark, σphoto, and σphoto/σdark of each of the samples A to C are shown in Table 1. Note that $E_{TAUC}$ indicates a band gap (which is calculated by $\sqrt{(\alpha h v)}$–hv characteristic), Urbach edge $E_U$ which is a level which reflects a state of a band tail of a band gap has been calculated by a slope of absorption coefficient and photon energy curve (semi log). σphoto indicates photoconductivity and σdark indicates dark conductivity.

TABLE 1

| | $E_{TAUC}$ [eV] | Urbach edge $E_U$ [meV] | σ dark [S/cm] | σ photo [S/cm] | σ photo/ σ dark |
|---|---|---|---|---|---|
| Sample A | 1.59 | 61 | 3.06E−09 | 2.74E−04 | 8.95E+04 |
| Sample B | 1.66 | 54 | 1.07E−09 | 3.82E−05 | 3.57E+04 |
| Sample C | 1.64 | 52 | 6.99E−10 | 5.27E−05 | 7.54E+04 |

Further, according to Table 1, the value of Urbach edge $E_U$ of each of the samples B and C is smaller than that of the sample A, which shows that the level of tail on the valence band side (the level in a band tail state) in a band gap of the first region 106a illustrated in FIG. 2 of Embodiment 1 is low compared to the amorphous silicon layer. That is, the tail of the level (band tail) in the band gap has steep slope.

EXAMPLE 3

This example below describes results obtained by measurement by CPM as for physical properties of the first region 106a illustrate in FIG. 2 of Embodiment 1.

First, methods for manufacturing samples will be described.

(Sample D)

A silicon nitride layer with a thickness of 100 nm and an amorphous silicon layer with a thickness of 30 nm were successively formed over a substrate.

Here, a glass substrate was used as the substrate. Further, as for the silicon nitride layer, the same condition as the sample A of Example 2 was used. Further, a deposition condition of the amorphous silicon layer is the same as that of the sample A of Example 2.

A silicon nitride layer with a thickness of 100 nm and the first region illustrated in FIG. 2 of Embodiment 1 with a thickness of 30 nm were successively formed over a substrate.

Here, a glass substrate was used as the substrate. Further, as for the silicon nitride layer, the same condition as the sample A of Example 2 was used.

Further, as a formation condition of the first region 10a illustrated in FIG. 2 of Embodiment 1, a plasma CVD method was used, in which plasma was discharged under the following conditions: source gases were introduced and stabilized when the flow rate of SiH$_4$ was 20 sccm and the flow rate of NH$_3$ of 100 ppm (diluted with H$^2$) was 250 sccm; the pressure in the treatment chamber was 280 Pa; the temperature of the substrate was 280° C.; RF power source frequency was 13.56 MHz; and the power of the RF power source was 50 W. Here, in order to form the silicon nitride layer and the first region 106a successively, nitrogen exists in an atmosphere in which the first region 106a is formed. Therefore, nitrogen is included in the first region 106a.

Figure 33:
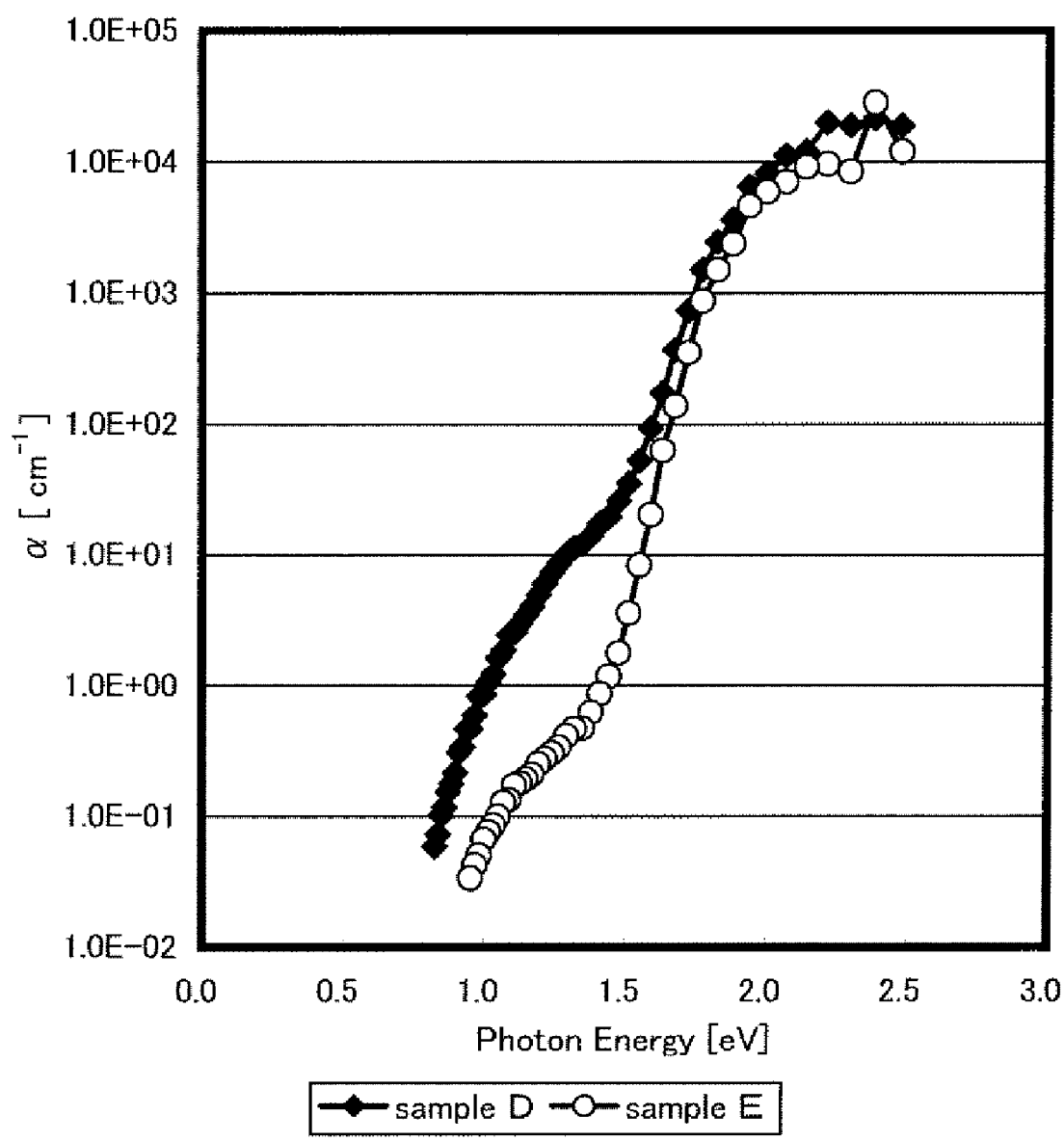
FIG. 33 is a graph showing a result obtained by measuring a semiconductor layer described in an example by CMP.

Next, FIG. 33 shows results obtained by measuring the samples D and E by CPM in a manner similar to Example 2. An absorption spectrum of the sample D is denoted by a diamond and an absorption spectrum of the sample E is denoted by a circle.

Further, according to the measurement results by CPM, $E_{TAUC}$ and Urbach edge $E_U$ of each of the samples D and E are shown in the following table.

TABLE 2

| | $E_{TAUC}$ [eV] | Urbach edge $E_U$ [meV] |
|---|---|---|
| Sample D | 1.62 | 65 |
| Sample E | 1.63 | 47 |

Further, according to Table 2, the value of Urbach edge $E_U$ of the sample E is smaller than that of the sample D, which shows that the level of tail on the valence band side (the level in a band tail state) in a band gap of the first region 106a illustrated in FIG. 2 of Embodiment 1 is low compared to the amorphous silicon layer. That is, the tail of the level (band tail) in the band gap has steep slope.

EXAMPLE 4

This example describes the first region 106a described in Embodiment 1. The first region 106a has an amorphous structure; however the first region 106a is different in film quality from a so-called amorphous semiconductor and this difference in film quality will be described below.

Figure 34:
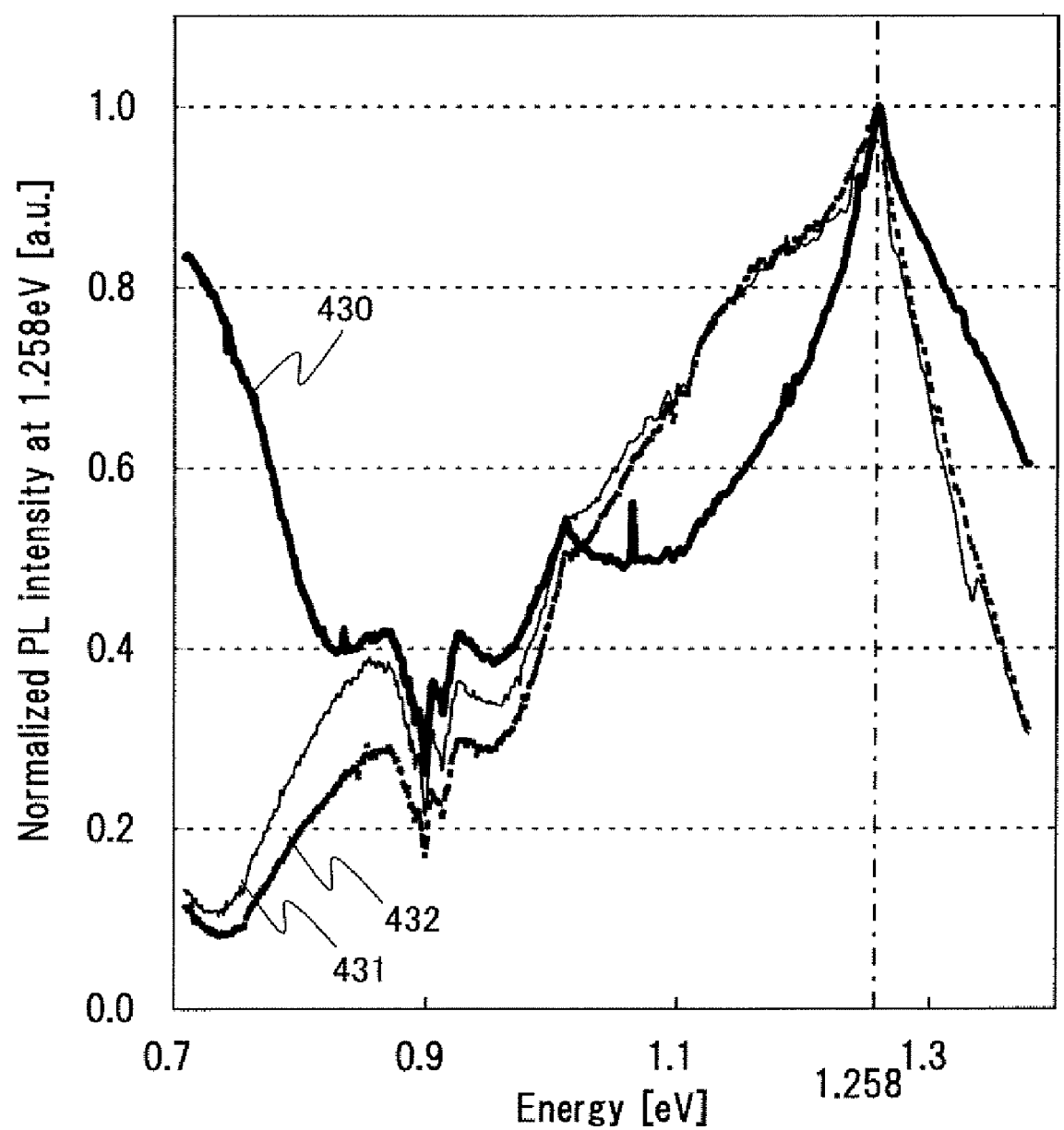
FIG. 34 is a graph showing a result obtained by measuring the semiconductor layer described in Example with a photoluminescence spectroscopy.

FIG. 34 shows a result obtained by performing an evaluation on the first region 106a of Embodiment 1, an amorphous semiconductor layer, and an amorphous silicon layer whose source gas included ammonia with low-temperature photoluminescence spectroscopy.

First, methods for manufacturing samples will be described.
(Sample F)
A silicon nitride with a thickness of 300 nm and the first region 106a illustrated in FIG. 2 of Embodiment 1 were formed successively over a substrate.

As the substrates, a glass substrate was used.

Note that deposition conditions of the silicon nitride layer are the same as those of the sample A described Embodiment 2.

Further, a deposition condition of the first region 106a illustrated in FIG. 2 of Embodiment 1 is the same as that of the sample B described in Example 2. Here, in order to form the silicon nitride layer and the first region 106a successively, nitrogen exists in an atmosphere in which the first region 106a is formed. Therefore, nitrogen is included in the first region 106a.
(Sample G)
A silicon nitride layer with a thickness of 300 nm and an amorphous silicon layer with a thickness of 50 nm were formed successively over a substrate.

Note that each of deposition methods of the silicon nitride layer and the amorphous silicon layer is the same as that of the sample A described in Example 2.
(Sample H)
A silicon nitride layer with a thickness of 300 nm and an amorphous silicon layer whose source gas included ammonia were formed successively over a substrate.

As the substrates, glass substrates were used.

Note that deposition conditions of the silicon nitride layer are the same as those of the sample A described in Embodiment A.

Further, as a formation condition of the amorphous silicon layer whose material gas included ammonia, a plasma CVD method was used, in which plasma was discharged under the following conditions: source gases were introduced and stabilized when the flow rate of $SiH_4$ was 280 sccm and the flow rate of $H_2$ including $NH_3$ of 100 ppm was 300 sccm; the pressure in the treatment chamber was 280 Pa; the temperature of the substrate was 280° C.; the RF power source frequency was 13.56 MHz; and the power of the RF power source was 50 W.

In FIG. 34, a spectrum 430 was obtained by measuring the sample F with low-temperature photoluminescence spectroscopy, a spectrum 431 was obtained by measuring the sample G with low-temperature photoluminescence spectroscopy, and a spectrum 432 was obtained by measuring the sample H with a photoluminescence spectroscopy. Note that since correction is not performed on the result of measurement with low-temperature photoluminescence spectroscopy shown in FIG. 34, a peak region of the spectrum is different from that of Example 5 and Example 6.

In this Example, a photoluminor D special model manufactured by Atago Bussan Corporation was used for the measurement with low-temperature photoluminescence spectroscopy. As excitation light, argon laser light with a wavelength of 514.5 nm emitted with 3.5 W was used. As a detector, a germanium PIN photodiode with which an infrared region could be measured was used and the samples in the measurement were cooled with liquid helium. In addition, the detector was cooled to approximately 4.2 K in the measurement.

When the spectrum 430 and the spectrum 431 are compared to each other, spectrum intensity of the spectrum 430 is lower than that of the spectrum 431 in the vicinity of 1.0 eV to 1.2 eV, which shows that a band tail is steep (in particular, see the spectrum intensity in the vicinity of 1.0 eV to 1.2 eV in FIG. 34). Therefore, an energy range of a band tail of the first region 106a is wider than that of the amorphous silicon layer. This is because the first region 106a includes minute crystal grains. Thus, it is considered that the number of defects included in the first region 106a is small than defects included in the amorphous silicon layer.

In addition, the shapes of the spectrum 430 and the spectrum 431 differ greatly from each other in a range less than or equal to 0.8 eV in which measurement sensitivity is low, which also obviously shows that a layer included in the first region 106a is different in film quality from the amorphous semiconductor layer.

Further, the shapes of the band tails of the spectrum 431 and the spectrum 432 are similar to each other and there is little difference in the energy range in the band tail between the spectrum 431 and the spectrum 432. In addition, in the range less than or equal to 0.8 eV, the shapes of the spectrum 431 and the spectrum 432 are approximately similar to each other. Accordingly, it is considered that the first region 106a is different from the amorphous silicon layer whose source gas simply included ammonia and that a layer which the same film quality as the layer included in the first region 106a cannot be formed just by including nitrogen in the source gas. As described above, the first region 106a includes the minute crystal grains and it is difficult to form such a layer just by including nitrogen in the source gas of the amorphous silicon layer. Therefore, the layer included in the first region 106a is different in film quality from the amorphous silicon layer including nitrogen.

Further, when the spectrums 430 to 432 are integrated with respect to 1.1 eV to 1.258 eV, the spectrum 430, the spectrum 431, and the spectrum 432 become 0.109, 0.132, and 0.133, respectively.

Then, values (spectral ratio) in the spectrum 430, the spectrum 431, and the spectrum 432 which are obtained by dividing spectrum intensity at 0.75 eV by spectrum intensity in 1.258 eV is 0.719, 0.129, 0.090, respectively.

In the case of referring to the aforementioned integrated result and spectrum ratio, it can also be said that the first region 106a is difference in film quality from the amorphous silicon layer.

The peak which exists in the vicinity of 0.9 eV to 1.0 eV is due to moisture.

Note that in a second region 106b, part other than a region occupied by a plurality of crystal grains 121 which exists in a dispersed manner is a semiconductor including an amorphous structure. It is estimated that the part also has the same film quality as the first region 106a.

The aforementioned description is not limited to the case where a semiconductor layer is formed over a silicon nitride layer, and includes the case where the first region 106a is formed in another method.

Figure 35:
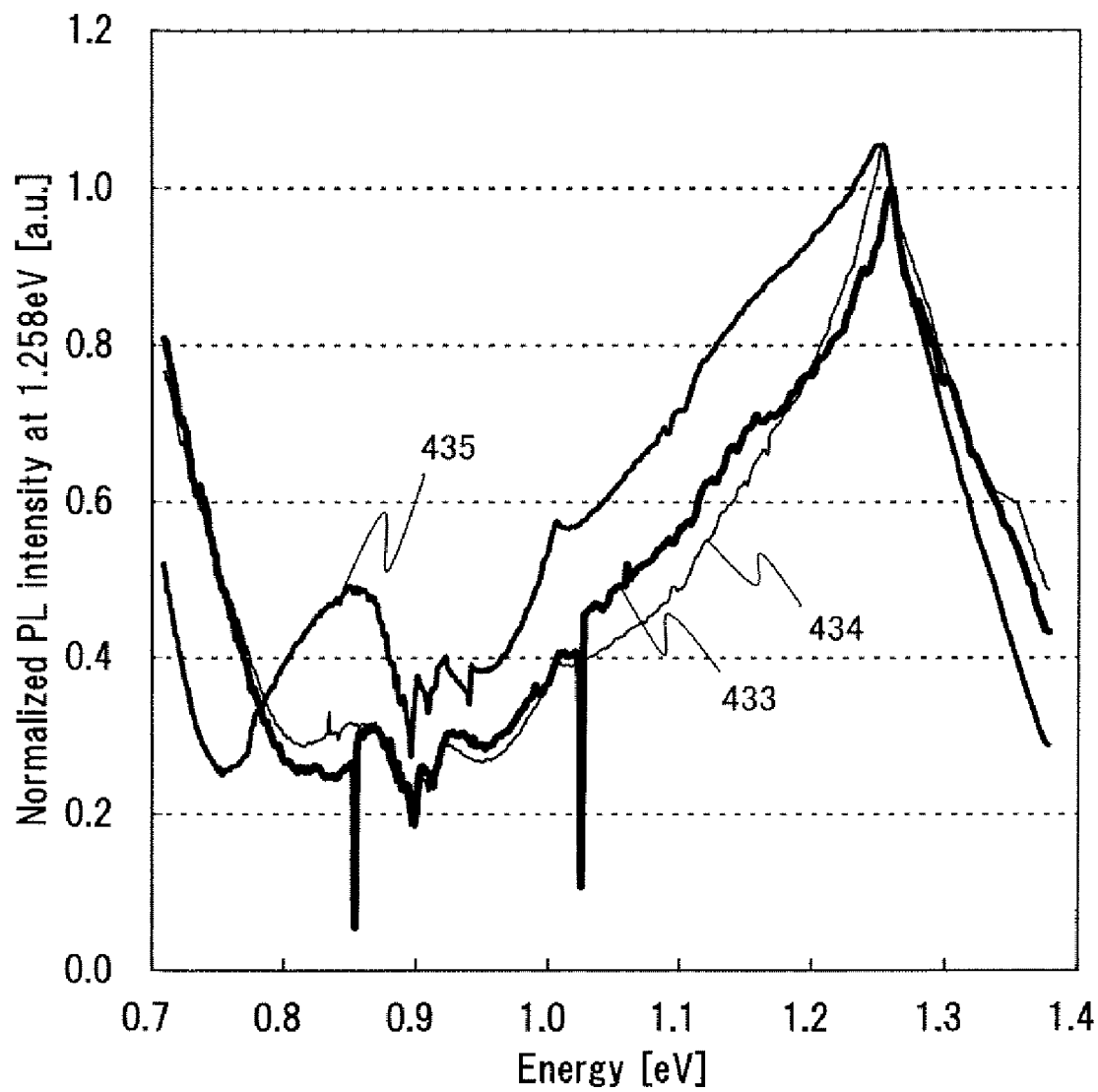
FIG. 35 is a graph showing a result obtained by measuring the semiconductor layer described in Example with a photoluminescence spectroscopy.

FIG. 35 shows results obtained by performing an evaluation on the first region 106a of Embodiment 1 and an amorphous silicon layer with low-temperature photoluminescence spectroscopy.

First, methods for manufacturing samples will be described.

(Sample I)

A silicon nitride layer with a thickness of 100 nm and the first region 106a illustrated in FIG. 2 of Embodiment 1 with a thickness of 30 nm were successively formed over a substrate.

As the substrates, a glass substrate was used.

Note that deposition conditions of the silicon nitride layer are the same as those of the sample A described in Example 2.

Further, as a formation condition of the first region 106a illustrated in FIG. 2 of Embodiment 1, a plasma CVD method was used, in which plasma was discharged under the following conditions: source gases were introduced and stabilized when the flow rate of $SiH_4$ was 20 sccm, the flow rate of $H_2$ was 1400 sccm, the flow rate of $H_2$ including 100 ppm of $NH_3$ was 100 sccm; the pressure in the treatment chamber was 280 Pa; the temperature of the substrate was 280° C.; the RF power source frequency was 13.56 MHz; and the power of the RF power source was 50 W. Here, in order to form the silicon nitride layer and the first region 106a successively, nitrogen exists in an atmosphere in which the first region 106a is formed and ammonia is used as a source gas, whereby nitrogen is included in the first region 106a.

(Sample J)

A silicon nitride layer with a thickness of 100 nm and the first region 106a illustrated in FIG. 2 of Embodiment 1 with a thickness of 30 nm were successively formed over a substrate. Note that the sample J and the sample I are different from each other only in the flow rate of $H_2$ including 100 ppm of $NH_3$.

As the substrates, glass substrates were used.

Note that deposition conditions of the silicon nitride layer are the same as those of the sample A described in Example 2.

Further, as a formation condition of the first region 106a illustrated in FIG. 2 of Embodiment 1, a plasma CVD method was used, in which plasma was discharged under the following conditions: source gases were introduced and stabilized when the flow rate of $SiH_4$ was 20 sccm, the flow rate of $H_2$ was 1250 sccm, and the flow rate of $H_2$ including $NH_3$ of 100 ppm was 250 sccm; the pressure in the treatment chamber was 280 Pa; the temperature of the substrate was 280° C.; the RF power source frequency was 13.56 MHz; and the power of the RF power source was 50 W. Here, in order to form the silicon nitride layer and the first region 106a successively, nitrogen exists in an atmosphere in which the first region 106a is formed and ammonia is used as a source gas, whereby nitrogen is included in the first region 106a.

(Sample K)

A silicon nitride layer with a thickness of 100 nm and an amorphous silicon layer with a thickness of 30 nm were successively formed over a substrate.

Note that each of deposition conditions of the silicon nitride layer and the amorphous silicon layer is the same as that of the sample A described in Example 2.

In FIG. 35, a spectrum 433 and a spectrum 434 was obtained by measuring the sample I and the sample J each of which includes the first region 106a illustrated in FIG. 2 of Embodiment 1, with low-temperature photoluminescence spectroscopy. A spectrum 435 was obtained by measuring the sample K including the amorphous silicon layer with low-temperature photoluminescence spectroscopy. Note that a peak having a needle-like shape (around 0.86 eV and 1.02 eV) of the spectrum 433 is influenced by cosmic rays. Note that since correction is not performed on the result of the measurement with low-temperature photoluminescence spectroscopy shown in FIG. 34, a peak region of the spectrum is different from that of Example 5 and Example 6.

When the spectrum 433 and the spectrum 434 are compared to the spectrum 435, each of spectrum intensity of the spectrum 433 and spectrum intensity of the spectrum 434 is lower than that of the spectrum 435 in the vicinity of 1.0 eV to 1.2 eV, which shows that a band tail is steep (in particular, see the spectrum intensity in the vicinity of 1.0 eV to 1.2 eV in FIG. 35). Therefore, as in the case of description for FIG. 34, an energy range in the band tail of the first region 106a is wider than that of the amorphous silicon layer. This is because the first region 106a includes the minute crystal grains. Thus, it is considered that the number of defects included in the first region 106a is less than that included in the amorphous silicon layer although the source gas includes ammonia to form the first region 106a.

Next, measurement of photoconductivity (σphoto) and dark conductivity (σdark) was performed on these layers. Results of the measurement are shown in the following Table 3.

TABLE 3

| | σ dark [S/cm] | σ photo [S/cm] | σ photo/σ dark |
|---|---|---|---|
| Sample I (Spectrum 433) | 1.01E−09 | 6.57E−05 | 6.58E+04 |
| Sample J (Spectrum 434) | 1.01E−09 | 4.39E−05 | 4.37E+04 |
| Sample K (Spectrum 435) | 2.87E−09 | 9.90E−05 | 3.40E+04 |

In the case of referring Table 2, it is obvious that the first region 106a is different in film quality from the amorphous silicon layer.

As described in this example, the first region 106a included in the semiconductor layer of Embodiment 1 is different in film quality from the amorphous silicon layer.

EXAMPLE 5

This example describes the first region 106a described in Embodiment 1. The first region 106a has an amorphous structure; however the first region 106a is different in film quality from a so-called amorphous semiconductor and this difference in film quality will be described below.

Figure 36:
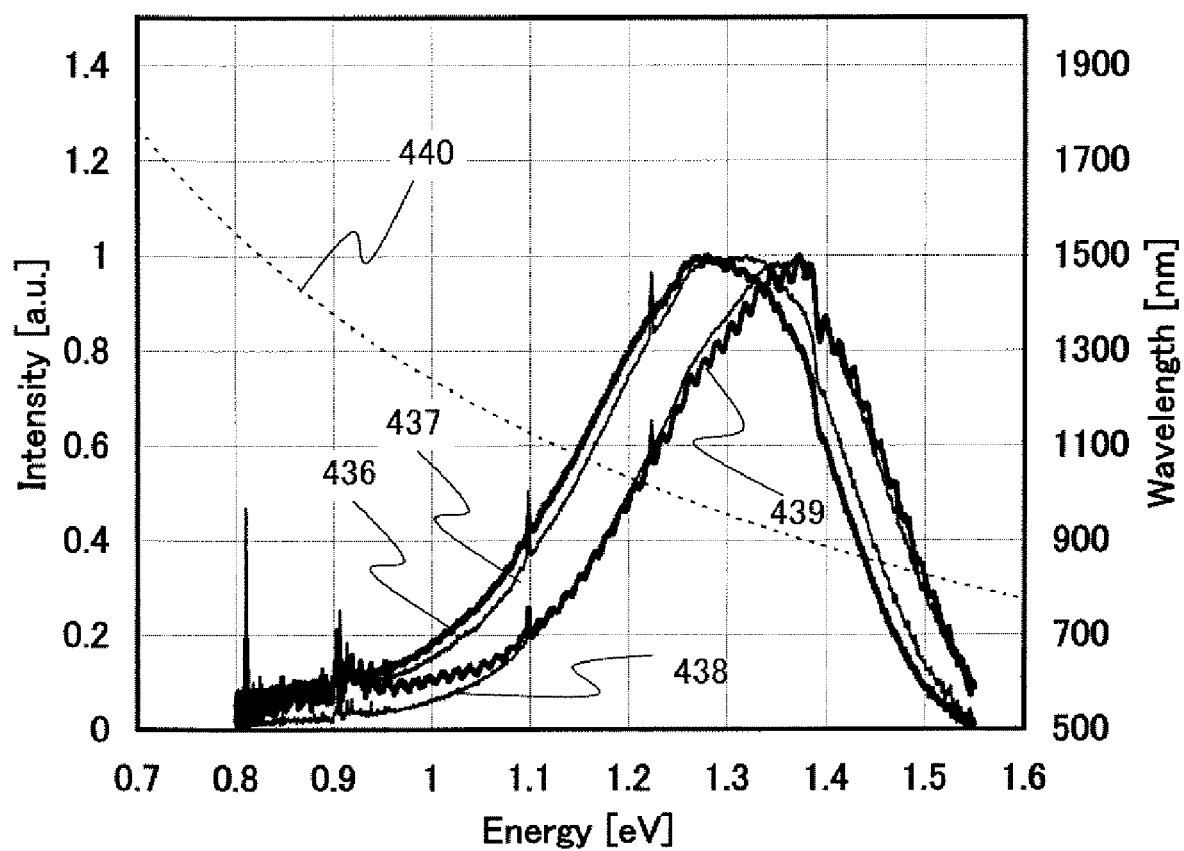
FIG. 36 is a graph showing a result obtained by measuring the semiconductor layer described in Example with a photoluminescence spectroscopy.

FIG. 36 shows a result obtained by performing an evaluation on the first region 106a of Embodiment 1, an amorphous semiconductor layer and an amorphous silicon layer whose source gas included ammonia, with low-temperature photoluminescence spectroscopy.

First, methods for manufacturing samples will be described.

(Sample L)

A silicon nitride layer with a thickness of 100 nm and an amorphous silicon layer with a thickness of 30 nm were successively formed over a substrate.

Note that each of deposition conditions of the silicon nitride layer and the amorphous silicon layer is the same as that of the sample A described in Example 2.

(Sample M)

A silicon nitride layer with a thickness of 100 nm and an amorphous silicon layer whose source gas includes ammonia with a thickness of 30 nm were successively formed over a substrate.

As the substrates, glass substrates were used.

Note that deposition conditions of the silicon nitride layer are the same as those of the sample A in Example 2.

Further, a deposition condition of the amorphous silicon layer whose source gas includes ammonia is the same as that of the sample H in Example 4.

(Sample N)

A silicon nitride layer with a thickness of 100 nm and the first region 106a illustrated in FIG. 2 of Embodiment 1 with a thickness of 30 nm were successively formed over a substrate.

As the substrates, glass substrates were used.

Note that deposition conditions of the silicon nitride layer are the same as those of the sample A in Example 2.

Further, a deposition condition of the first region 106a is the same as that of the sample C described in Example 2. Here, in order to form the silicon nitride layer and the first region 106a successively, nitrogen exists in an atmosphere in which the first region 106a is formed. Therefore, nitrogen is included in the first region 106a.

(Sample O)

A silicon nitride layer with a thickness of 100 nm and the first region 106a illustrated in FIG. 2 of Embodiment 1 with a thickness of 30 nm were successively formed over a substrate.

As the substrate, glass substrate was used.

Note that a deposition condition of the silicon nitride layer is the same as that of the sample A in Example 2.

Further, as a formation condition of the first region 106a illustrated in FIG. 2 of Embodiment 1, a plasma CVD method was used, in which plasma was discharged under the following conditions: source gases were introduced and stabilized when the flow rate of $SiH_4$ was 20 sccm, the flow rate of $H_2$ was 1475 sccm, and the flow rate of $H_2$ including 1000 ppm of $NH_3$ was 25 sccm; the pressure in the treatment chamber was 280 Pa; the temperature of the substrate was 280° C.; the RF power source frequency was 13.56 MHz; and the power of the RF power source was 50 W. Here, in order to form the silicon nitride layer and the first region 106a successively, nitrogen exists in an atmosphere in which the first region 106a is formed and ammonia is used as a source gas, whereby nitrogen is included in the first region 106a.

In FIG. 36, a spectrum 436 was obtained by measuring the sample L with low-temperature photoluminescence spectroscopy, a spectrum 437 was obtained by measuring the sample M with low-temperature photoluminescence spectroscopy, a spectrum 438 was obtained by measuring the sample N with a photoluminescence spectroscopy, and a spectrum 439 was obtained by measuring the sample O with a photoluminescence spectroscopy. A Y axis in the left side indicates intensity. Further, a dashed line 440 indicates a wavelength and corresponds to a Y axis in the right side.

Note that LabRAM HR-PL manufactured by Horiba Jobin Yvon was used for the measurement with a photoluminescence spectroscopy. As excitation light, argon laser light with a wavelength of 514.5 nm was used. As a detector, an InGaAs photodiode with which an infrared region could be measured was used and the samples in measurement were cooled with liquid helium. In this time, a temperature was set to 4.2 K using MicrostatHe manufactured by Oxford Instrument plc. as a cooler. Note that the samples were set on a cooling plate provided with a thermocouple with use of grease and a temperature of the thermocouple is set to the aforementioned temperature.

Note that the spectrums 436 to 439 are normalized based on the maximum intensity in each of the spectrums 436 to 439. Further, the peak having a needle-like shape is due to influence of a fluorescent light.

Table 4 shows the peak regions and half-widths of their respective samples. Note that each of the peak regions in Table 4 corresponds to a region where a value of intensity is greater than or equal to 90%.

TABLE 4

|  | Peak Region | half-width (FWHM) |
| --- | --- | --- |
| Sample L (Spectrum 436) | 1.23~1.35 eV | 0.290 eV |
| Sample M (Spectrum 437) | 1.25~1.37 eV | 0.289 eV |
| Sample N (Spectrum 438) | 1.33~1.39 eV | 0.268 eV |
| Sample O (Spectrum 439) | 1.31~1.39 eV | 0.261 eV |

Compared to the spectrums 436 and 437, the spectrums 438 and 439 are shifted toward the high energy side. Further, as for the half-widths, the spectrums 438 and 439 each have the narrow half-width compared with the spectrums 436 and 437. Accordingly, it shows that the first region 106a illustrated in FIG. 2 of Embodiment 1 is well-ordered compared with the amorphous silicon layer and the amorphous silicon layer whose source gas includes ammonia. Further, it is obvious that the first region 106a illustrated in FIG. 2 of Embodiment 1 is different in physical properties from the amorphous silicon layer and the amorphous silicon layer whose source gas included ammonia.

EXAMPLE 6

This example describes the first region 106a described in Embodiment 1. The first region 106a has a crystal region included in an amorphous structure; however, the first region 106a is different in film quality from a so-called microcrystalline semiconductor and this difference in film quality will be described below.

Figure 37:
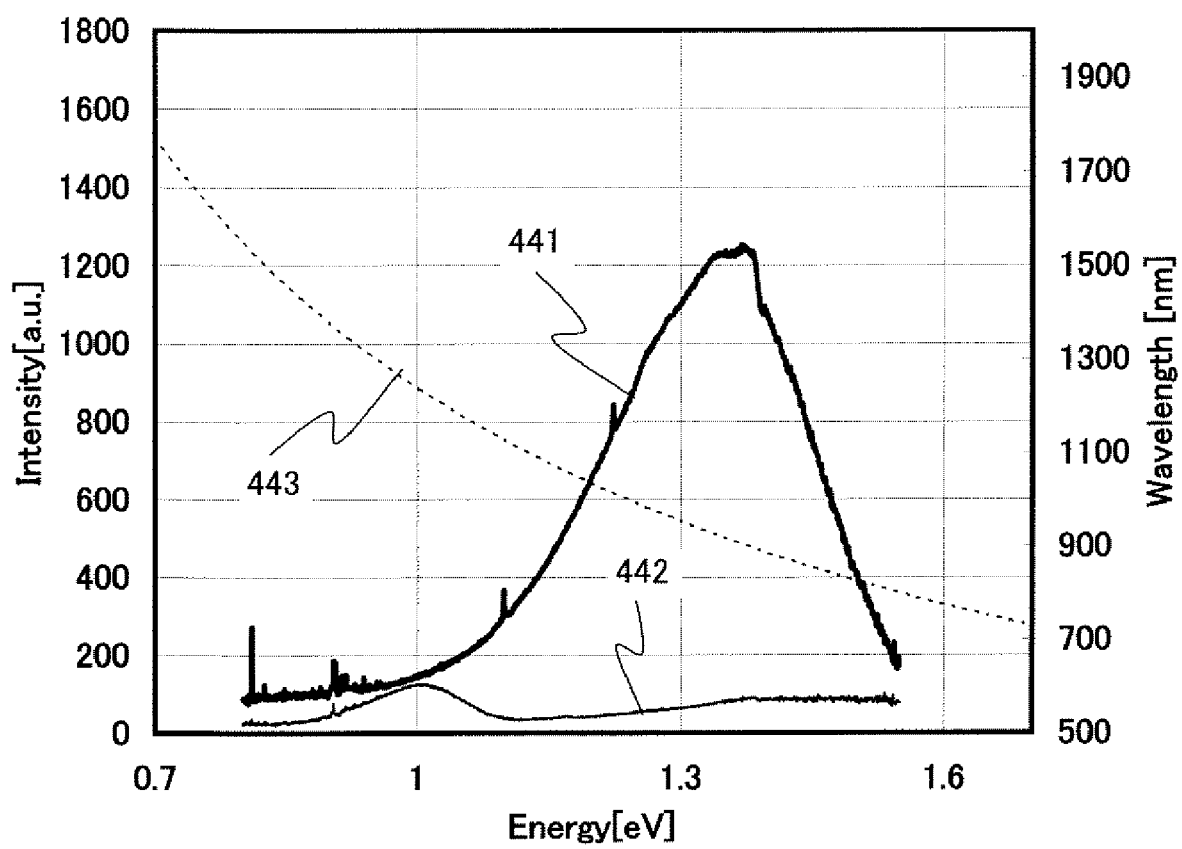
FIG. 37 is a graph showing a result obtained by measuring the semiconductor layer described in Example with a photoluminescence spectroscopy.

FIG. 37 shows a result obtained by performing an evaluation on the first region 106a of Embodiment 1 and a microcrystalline semiconductor layer, with low-temperature photoluminescence spectroscopy.

First, methods for manufacturing samples will be described.

(Sample P)

A silicon nitride layer with a thickness of 100 nm and the first region 106a illustrated in FIG. 2 of Embodiment 1 with a thickness of 30 nm were successively formed over a substrate.

As the substrate, a glass substrate was used.

Note that deposition conditions of the silicon nitride layer are the same as those of the sample A in Example 2.

Further, a deposition condition of the first region 106a illustrated in FIG. 2 of Embodiment 1 is the same as that of the sample O described in Example 5. Here, in order to form the silicon nitride layer and the first region 106a successively, nitrogen exists in an atmosphere in which the first region 106a is formed and ammonia is used as a source gas, whereby nitrogen is included in the first region 106a.

(Sample Q)

A silicon oxynitride layer with a thickness of 100 nm and a microcrystalline silicon layer with a thickness of 50 nm were successively formed over a substrate.

Here, a glass substrate was used as the substrate. Further, as a formation condition of the oxynitride silicon layer, a plasma CVD method was used, in which plasma was discharged under the following conditions: source gases were introduced and stabilized when the flow rate of $SiH_4$ was 30 sccm and the flow rate of $N_2O$ was 1200 sccm; the pressure of the treatment chamber was 40 Pa; the temperature of the substrate was 280° C.; the RF power source frequency was 13.56 MHz; and the power of the RF power source was 50 W.

Further, as a formation condition of the microcrystalline silicon layer, a plasma CVD method was used, in which plasma was discharged under the following conditions: source gases were introduced and stabilized when the flow rate of $SiH_4$ was 10 sccm and the flow rate of $H_2$ was 1500 sccm; the pressure in the treatment chamber was 280 Pa; the temperature of the substrate was 280° C.; the RF power source frequency was 13.56 MHz; and the power of the RF power source was 50 W.

Note that a base layer of the microcrystalline silicon layer is the oxynitride silicon layer and a nitrogen concentration in the oxynitride silicon layer is low. Therefore, the concentration of nitrogen which is to be included in the microcrystalline silicon layer is low. Accordingly, the sample P has high crystallinity compared to the first region 106a illustrated in FIG. 2 of Embodiment 1.

In FIG. 37, a spectrum 441 was obtained by measuring the sample P with low-temperature photoluminescence spectroscopy, and a spectrum 442 was obtained by measuring the sample Q with low-temperature photoluminescence spectroscopy. A Y axis in the left side indicates intensity. Further, a dashed line 443 indicates a wavelength and corresponds to a Y axis in the right side. Further, as a photoluminescence spectroscopy, the same apparatus as Example 5 was used. Note that a peak having a needle-like shape is due to fluorescent light.

Table 5 shows the peak regions and half-widths of their respective samples. Note that each of the peak regions in Table 5 corresponds to a region where a value of intensity is greater than or equal to 90%.

TABLE 5

| | Peak Region | Half-width(FWHM) | Intensity[a.u.] |
|---|---|---|---|
| Sample P (Spectrum 441) | 1.31~1.39 eV | 0.261 eV | 88 |
| Sample Q (Spectrum 442) | 0.98~1.02 eV | 0.123 eV | 1253 |

The peak region of the spectrum 441 is 1.31 eV to 1.39 eV and the peak region of the spectrum 442 is 0.98 eV to 1.02 eV. The first region 106a illustrated in FIG. 2 of Embodiment 1 is shifted toward the high energy side. Further, intensity of the spectrum 441 is 15 times higher than that of the spectrum 442. It is considered that the microcrystalline silicon layer has more crystal grain boundaries than the first region 106a illustrated in FIG. 2 of Embodiment 1 and a dangling bond is formed in the crystal region, whereby the intensity of the spectrum of the microcrystalline silicon layer is reduced. Further, it is considered that the peak of single crystal silicon is positioned in 1.1 eV and the spectrum 442 is derived from a silicon crystal.

This example describes the first region 106a described in Embodiment 1. The first region 106a has an amorphous structure; however the first region 106a is different in film quality from a so-called amorphous semiconductor and this difference in film quality will be described below.

Figure 38A:
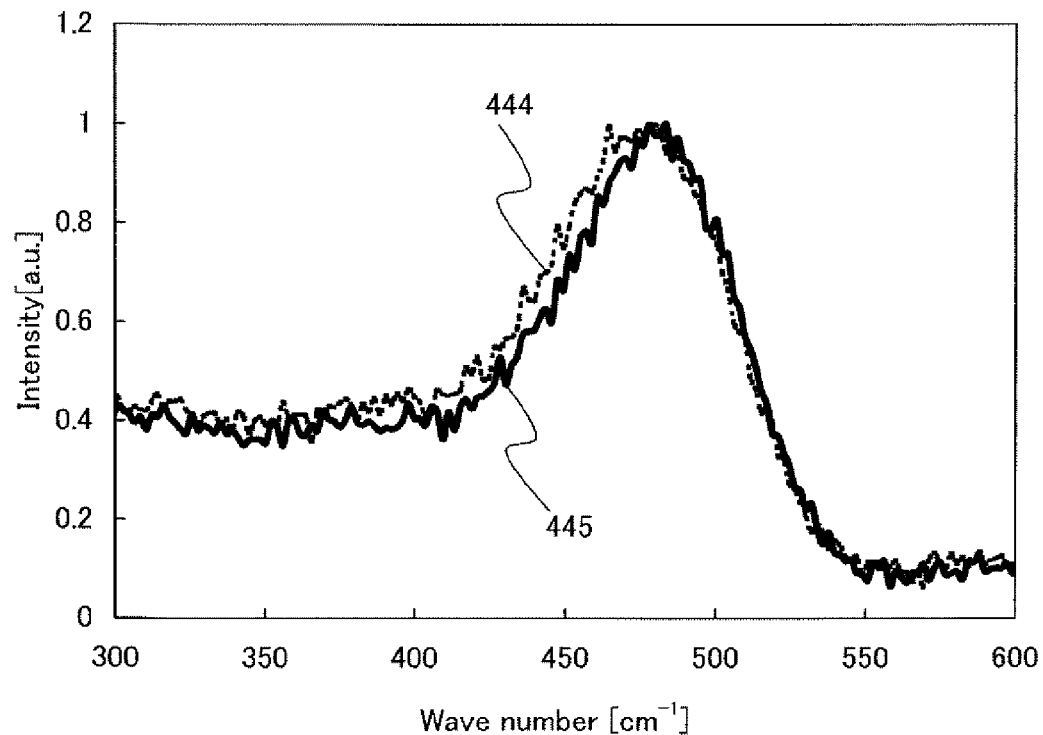
FIGS. 38A and 38B are graphs showing results obtained by measuring the semiconductor layer described in Example by a Raman spectroscopic analysis.
Figure 38B:
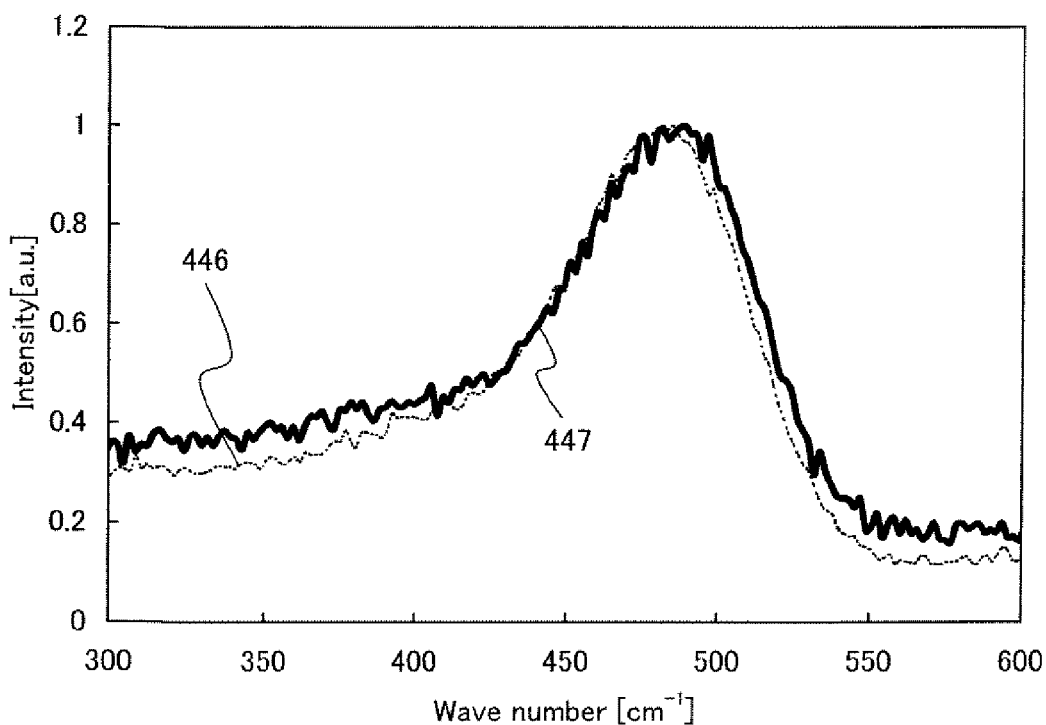

FIGS. 38A and 38B show a result obtained by performing evaluation on the first region 106a of Embodiment 1 and the amorphous semiconductor layer by Raman spectroscopic analysis.

First, methods for manufacturing samples will be described.

(Sample R)

A silicon nitride layer with a thickness of 100 nm and an amorphous silicon layer with a thickness of 30 nm were successively formed over a substrate.

Note that each of deposition conditions of the silicon nitride layer and the amorphous silicon layer is the same as that of the sample A in Example 2.

(Sample S)

A silicon nitride layer with a thickness of 100 nm and the first region 106a illustrated in FIG. 2 of Embodiment 1 with a thickness of 30 nm were successively formed over a substrate.

As the substrates, glass substrates were used.

Note that deposition conditions of the silicon nitride layer are the same as those of the sample A in Example 2.

Further, a deposition condition of the first region 106a illustrated in FIG. 2 of Embodiment 1 is the same as that of the sample O described in Example 5. Here, in order to form the silicon nitride layer and the first region 106a successively, nitrogen exists in an atmosphere in which the first region 106a is formed and ammonia is used as a source gas. Accordingly, nitrogen is included in the first region 106a.

FIGS. 38A and 38B show a result obtained by measuring the sample R and the sample S by a Raman spectroscopic analysis. Note that spectrums 444 and 446 were obtained by measuring the sample R by a Raman spectroscopic analysis, and spectrums 445 and 447 were obtained by measuring the sample S with low-temperature photoluminescence spectroscopy. A Y axis indicates intensity. Further, the spectrums 444 and the spectrum 445 were measured at 293 K and the spectrums 445 and 447 were measured at 4 K.

Note that a LabRAM HR-PL manufactured by Horiba Jobin Yvon is used for the measurement by Raman spectroscopic analysis. As excitation light, argon laser light with a wavelength of 514.5 nm was used. As a detector, a CCD detector was used.

Note that the spectrums 444 to 447 are normalized based on the maximum intensity in the spectrums 444 to 447.

Table 6 shows the peak regions and half-widths of their respective samples.

TABLE 6

| | Sample R | | Sample S | |
|---|---|---|---|---|
| | Liquid helium temperature (set to 4 K) | Room tempereture (set to 293 K) | Liquid helium temperature (set to 4 K) | Room tempereture (set to 293 K) |
| Peak Region($cm^{-1}$) | 488 | 482 | 485 | 478 |
| FWHM($cm^{-1}$) | 64.4 | 61.5 | 64.4 | 63.2 |

The peak of the spectrum of the sample S appears on a higher wavelength side than that of the peak of the spectrum of the sample R both at a low temperature (set to 4K) and a room temperature (set to 293K). Therefore, the first region 106a illustrated in FIG. 2 of Embodiment 1 appears on the high wavelength side compared with the amorphous silicon layer.

On the other hand, the half-width of the sample S inclines to be narrower than the sample R at a room temperature (set to 293 K) although a difference is not observed at a low temperature (set to 4K). It shows that the half-width of the first region 106a illustrated in FIG. 6 of Embodiment 1 is narrower than that of the amorphous silicon layer.

This application is based on Japanese Patent Application serial no. 2008-116054 filed with Japan Patent Office on Apr. 25, 2008, and Japanese Patent Application serial no. 2008-294074 filed with Japan Patent Office on Nov. 18, 2008, the entire contents of which are hereby incorporated by reference.

What is claimed is:

1. A thin film transistor comprising:
   a gate electrode over a substrate having an insulating surface;
   a gate insulating layer over the substrate, the gate insulating layer covering the gate electrode;
   a first semiconductor layer over and in contact with the gate insulating layer, the first semiconductor layer including a plurality of crystal regions included in an amorphous structure;
   at least two second semiconductor layers for forming a source region and a drain region, the at least two second semiconductor layers including an impurity element imparting one conductivity type; and
   a buffer layer formed using an amorphous semiconductor between the first semiconductor layer and the at least two second semiconductor layers,
   wherein the plurality of the crystal regions includes an inverted conical or inverted pyramidal crystal grain which grows substantially radially in a direction in which the first semiconductor layer is deposited, from a position away from an interface between the gate insulating layer and the first semiconductor layer, and
   wherein the first semiconductor layer includes a crystal grain with a size of greater than or equal to 1 nm and less than or equal to 5 nm.

2. The thin film transistor according to claim 1, wherein the first semiconductor layer has an NH group.

3. The thin film transistor according to claim 1, wherein a nitrogen concentration of the first semiconductor layer, which is measured by secondary ion mass spectrometry, is $1\times10^{20}$ cm$^{-3}$ to $1\times10^{21}$ cm$^{-3}$.

4. The thin film transistor according to claim 1, wherein a nitrogen concentration of a portion of the first semiconductor layer, which is measured by secondary ion mass spectrometry, is $3\times10^{20}$ cm$^{-3}$ to $1\times10^{21}$ cm$^{-3}$,
   wherein the portion is in a vicinity of the interface between the gate insulating layer and the first semiconductor layer, and
   wherein the nitrogen concentration is reduced in a thickness direction of the first semiconductor layer from the vicinity of the interface.

5. The thin film transistor according to claim 1, wherein a peak region of a spectrum of the first semiconductor layer, which is measured by low-temperature photoluminescence spectroscopy, is greater than or equal to 1.31 eV and less than or equal to 1.39 eV.

6. The thin film transistor according to claim 1, wherein an oxygen concentration of the first semiconductor layer, which is measured by secondary ion mass spectrometry, is less than or equal to $5\times10^{18}$ cm$^{-3}$.

7. The thin film transistor according to claim 1, wherein each of the plurality of crystal regions is a single crystal.

8. The thin film transistor according to claim 1, wherein the plurality of the crystal regions includes a twin crystal.

9. A thin film transistor comprising:
   a gate electrode over a substrate having an insulating surface;
   a gate insulating layer over the substrate, the gate insulating layer covering the gate electrode;
   a first semiconductor layer over and in contact with the gate insulating layer, the first semiconductor layer including a plurality of crystal regions included in an amorphous structure;
   a second semiconductor layer having an amorphous structure over the first semiconductor layer; and
   at least two third semiconductor layers for forming a source region and a drain region, the at least two third semiconductor layers including an impurity element imparting one conductivity type,
   wherein the plurality of the crystal regions includes an inverted conical or inverted pyramidal crystal grain which grows substantially radially in a direction to the second semiconductor layer from a position away from an interface between the gate insulating layer and the first semiconductor layer, and
   wherein the first semiconductor layer includes a crystal grain with a size of greater than or equal to 1 nm and less than or equal to 5 nm.

10. The thin film transistor according to claim 9, wherein the first semiconductor layer has an NH group.

11. The thin film transistor according to claim 9, wherein an oxygen concentration of the first semiconductor layer measured by secondary ion mass spectrometry is less than or equal to $5\times10^{18}$ cm$^{-3}$, and
    wherein a nitrogen concentration of the first semiconductor layer measured by secondary ion mass spectrometry is $1\times10^{19}$ cm$^{-3}$ to $1\times10^{21}$ cm$^{-3}$.

12. The thin film transistor according to claim 9, wherein a nitrogen concentration of a portion of the first semiconductor layer, which is measured by secondary ion mass spectrometry, is $3\times10^{20}$ cm$^{-3}$ to $1\times10^{21}$ cm$^{-3}$,
    wherein the portion is in a vicinity of the interface between the gate insulating layer and the first semiconductor layer, and
    wherein the nitrogen concentration is reduced in a thickness direction of the first semiconductor layer from the vicinity of the interface.

13. The thin film transistor according to claim 9, wherein a peak region of a spectrum of the first semiconductor layer, which is measured by low-temperature photoluminescence spectroscopy, is greater than or equal to 1.31 eV and less than or equal to 1.39 eV.

14. The thin film transistor according to claim 9, wherein an oxygen concentration of the first semiconductor layer, which is measured by secondary ion mass spectrometry, is less than or equal to $5\times10^{18}$ cm$^{-3}$.

15. The thin film transistor according to claim 9, wherein each of the plurality of the crystal regions is a single crystal.

16. The thin film transistor according to claim 9, wherein the plurality of the crystal regions includes a twin crystal.

17. A thin film transistor comprising:
    a gate electrode over a substrate having an insulating surface;
    a gate insulating layer over the gate electrode;
    a first semiconductor layer over and in contact with the gate insulating layer, the first semiconductor layer including a plurality of crystal regions included in an amorphous structure;
    a second semiconductor layer having an amorphous structure over the first semiconductor layer; and a source region and a drain region over the second semiconductor layer, wherein the source region and the drain region include an impurity element imparting one conductivity type, wherein the plurality of the crystal regions includes an inverted conical or inverted pyramidal crystal grain, in which a vertex of the inverted conical or the inverted pyramidal crystal grain is closer to an interface between the gate insulating layer and the first semiconductor layer than the second semiconductor layer, and wherein the first semiconductor layer includes a crystal grain with a size of greater than or equal to 1 nm and less than or equal to 5 nm.

18. The thin film transistor according to claim 17, wherein the first semiconductor layer has an NH group.

19. The thin film transistor according to claim 17, wherein an oxygen concentration of the first semiconductor layer measured by secondary ion mass spectrometry is less than or equal to $5 \times 10^{18}$ cm$^{-3}$, and wherein a nitrogen concentration of the first semiconductor layer measured by secondary ion mass spectrometry is $1 \times 10^{19}$ cm$^{-3}$ to $1 \times 10^{21}$ cm$^{-3}$.

20. The thin film transistor according to claim 17, wherein a nitrogen concentration of a portion of the first semiconductor layer, which is measured by secondary ion mass spectrometry, is $3 \times 10^{20}$ cm$^{-3}$ to $1 \times 10^{21}$ cm$^{-3}$, wherein the portion is in a vicinity of the interface between the gate insulating layer and the first semiconductor layer, and wherein the nitrogen concentration is reduced in a thickness direction of the first semiconductor layer from the vicinity of the interface.

21. The thin film transistor according to claim 17, wherein a peak region of a spectrum of the first semiconductor layer, which is measured by low-temperature photoluminescence spectroscopy, is greater than or equal to 1.31 eV and less than or equal to 1.39 eV.

22. The thin film transistor according to claim 17, wherein an oxygen concentration of the first semiconductor layer, which is measured by secondary ion mass spectrometry, is less than or equal to $5 \times 10^{18}$ cm$^{-3}$.

23. The thin film transistor according to claim 17, wherein each of the plurality of the crystal regions is a single crystal.

24. The thin film transistor according to claim 17, wherein the plurality of the crystal regions includes a twin crystal.

* * * * *